US012805222B2

(12) United States Patent
Kang et al.

(10) Patent No.: US 12,805,222 B2
(45) Date of Patent: Nov. 17, 2026

(54) SEMICONDUCTOR DEVICE AND METHOD FOR FABRICATING THE SAME

(71) Applicant: SK hynix Inc., Gyeonggi-do (KR)

(72) Inventors: Se-Hun Kang, Gyeonggi-do (KR); Yu-Jin Kim, Gyeonggi-do (KR); Deok-Sin Kil, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 937 days.

(21) Appl. No.: 17/980,695

(22) Filed: Nov. 4, 2022

(65) Prior Publication Data

US 2023/0057319 A1 Feb. 23, 2023

Related U.S. Application Data

(63) Continuation of application No. 16/682,573, filed on Nov. 13, 2019, now Pat. No. 11,515,157.

(30) Foreign Application Priority Data

Apr. 17, 2019 (KR) ........................ 10-2019-0045102

(51) Int. Cl.

*H10P 14/60* (2026.01)
*H10D 1/68* (2025.01)
*H10P 14/692* (2026.01)

(52) U.S. Cl.

CPC ........... *H10P 14/6544* (2026.01); *H10D 1/68* (2025.01); *H10P 14/6339* (2026.01); *H10P 14/6506* (2026.01); *H10P 14/69392* (2026.01)

(58) Field of Classification Search

CPC ......... H01L 21/02356; H01L 21/02181; H01L 21/0228; H01L 21/02304; H10D 1/68
See application file for complete search history.

(56) References Cited

U.S. PATENT DOCUMENTS

| | | | | |
|---|---|---|---|---|
| 11,515,157 | B2 | 11/2022 | Kang et al. | |
| 2004/0188850 | A1* | 9/2004 | Lee | H01L 21/76874 257/E21.585 |
| 2004/0209423 | A1 | 10/2004 | Tian et al. | |
| 2007/0223176 | A1* | 9/2007 | Kil | H10D 1/68 361/313 |
| 2008/0203529 | A1* | 8/2008 | Kang | H10D 1/68 257/532 |
| 2010/0255217 | A1 | 10/2010 | Park | |

(Continued)

FOREIGN PATENT DOCUMENTS

| | | | |
|---|---|---|---|
| CN | 108807345 | A | 11/2018 |
| CN | 109216328 | A | 1/2019 |

(Continued)

OTHER PUBLICATIONS

Notice of Allowance (=Notification to Grant Patent Right for Invention) for Korean Patent Application No. 10-2019-0045102 issued by the Korean Patent Office on Jun. 24, 2025.

(Continued)

*Primary Examiner* — Mohammad M Choudhry
(74) *Attorney, Agent, or Firm* — IP&T GROUP LLP

(57) ABSTRACT

A method for fabricating a capacitor includes forming a first electrode, forming a dielectric layer stack on the first electrode, the dielectric layer stack including an initial hafnium oxide layer and a seed layer having a doping layer embedded therein, forming a thermal source layer on the dielectric layer stack to crystallize the initial hafnium oxide into tetragonal hafnium oxide, and forming a second electrode on the thermal source layer.

19 Claims, 31 Drawing Sheets

(56) References Cited

U.S. PATENT DOCUMENTS

| | | | | |
|---|---|---|---|---|
| 2012/0156889 | A1* | 6/2012 | Chen | H01L 21/0228 257/E21.271 |
| 2013/0130465 | A1* | 5/2013 | Choi | H10D 1/68 438/381 |
| 2014/0175362 | A1 | 6/2014 | Tendulkar et al. | |
| 2015/0076437 | A1* | 3/2015 | Tao | H10B 53/30 257/4 |
| 2016/0087028 | A1 | 3/2016 | Hirota et al. | |
| 2016/0133691 | A1 | 5/2016 | Phatak et al. | |
| 2019/0013391 | A1 | 1/2019 | Moon et al. | |
| 2020/0212193 | A1* | 7/2020 | Gosavi | H10D 64/512 |
| 2022/0005925 | A1 | 1/2022 | Shimizu et al. | |
| 2022/0093603 | A1 | 3/2022 | Cho et al. | |
| 2022/0344451 | A1 | 10/2022 | Beeler et al. | |
| 2023/0005925 | A1 | 1/2023 | Jung et al. | |

FOREIGN PATENT DOCUMENTS

| | | | |
|---|---|---|---|
| JP | 4132824 | B2 | 8/2008 |
| KR | 10-0849854 | B1 | 8/2008 |
| KR | 10-2008-0098824 | A | 11/2008 |
| KR | 20150037009 | A | 4/2015 |
| KR | 20160142452 | A | 12/2016 |
| KR | 10-2017-0004274 | A | 1/2017 |
| KR | 10-2019-0062031 | A | 6/2019 |

OTHER PUBLICATIONS

Office Action for the Chinese Patent Application No. 201911258758.4 issued by the Chinese Patent Office on Dec. 19, 2023.

Office Action for the Korean Patent Application No. 10-2019-0045102 issued by the Korean Intellectual Property Office on Jan. 17, 2024.

Office Action for the Taiwanese Patent Application No. 108141917 issued by the Taiwanese Patent Office on Aug. 16, 2023.

Office Action for U.S. Appl. No. 18/810,468 issued by the USPTO on Aug. 12, 2026.

Office Action for U.S. Appl. No. 18/814,618 issued by the U.S. Patent and Trademark Office on Oct. 2, 2026.

* cited by examiner

SEMICONDUCTOR DEVICE AND METHOD FOR FABRICATING THE SAME

CROSS-REFERENCE TO RELATED APPLICATIONS

The present application is a continuation of U.S. patent application Ser. No. 16/682,573 filed on Nov. 13, 2019, which claims priority to Korean Patent Application No. 10-2019-0045102, filed on Apr. 17, 2019, which is incorporated herein by reference in its entirety.

BACKGROUND

1. Field

Various embodiments of the present invention relate generally to a semiconductor device and, more particularly, to a semiconductor device including a dielectric layer stack and a method for fabricating the same.

2. Description of the Related Art

In recent years demand for improved, higher integration degree semiconductor memory devices has accelerated, requiring continuous reductions in the memory cell area, and the operating voltage. To meet these demands extensive research has been focused in developing a high-k material having high capacitance and a low leakage current.

Zirconium oxide ($ZrO_2$) is an example of a high-k material used extensively as a dielectric layer of a capacitor. However, the zirconium oxide has a limitation in increasing capacitance. Therefore, new improved solutions are needed.

SUMMARY

Various embodiments of the present invention are directed to a dielectric layer stack having a high dielectric constant and a low leakage current, and a method for forming the dielectric layer stack.

Various embodiments of the present invention are directed to a semiconductor device including a dielectric layer stack having a high dielectric constant and a low leakage current, and a method for fabricating the semiconductor device.

In accordance with an embodiment, a semiconductor device may include at least a hafnium oxide-based dielectric layer, wherein the hafnium oxide-based dielectric layer includes: a tetragonal hafnium oxide layer; a tetragonal seed layer; and a doping layer. The semiconductor device may further include a leakage blocking layer formed on the hafnium oxide-based dielectric layer. The leakage blocking layer may include a material having a lower dielectric constant and a higher band gap than the tetragonal hafnium oxide layer and the tetragonal seed layer. The leakage blocking layer may have a smaller thickness than the tetragonal hafnium oxide layer and the tetragonal seed layer. The semiconductor device may further include: a thermal source layer formed over the leakage blocking layer; and an interface control layer formed between the thermal source layer and the leakage blocking layer. The interface control layer may include a material having a higher electronegativity than the hafnium oxide-based dielectric layer. The tetragonal hafnium oxide layer and the tetragonal seed layer may be directly contacted with each other. The doping layer may be disposed within or embedded in the tetragonal seed layer. The doping layer may be disposed within or embedded in the tetragonal hafnium oxide. The hafnium oxide-based dielectric layer may include a plurality of the tetragonal hafnium oxide layers, a plurality of the tetragonal seed layers and at least one directly-contacted interface with which the tetragonal hafnium oxide layer and the tetragonal seed layer are in direct contact, and the doping layer may be disposed within or embedded in one or more of the tetragonal seed layers or one or more of the tetragonal hafnium oxide layers.

In accordance with an embodiment, a method for fabricating a capacitor may include forming a first electrode; forming a dielectric layer stack on the first electrode, the dielectric layer stack including an initial hafnium oxide layer and a seed layer having a doping layer embedded therein; forming a thermal source layer on the dielectric layer stack to crystallize the initial hafnium oxide into tetragonal hafnium oxide; and forming a second electrode on the thermal source layer.

In accordance with an embodiment, a method for forming hafnium oxide may include forming a stack of a doping layer, a seed layer and initial hafnium oxide over a substrate; and forming a thermal source layer on the stack to crystallize the initial hafnium oxide into tetragonal hafnium oxide.

These and other features and advantages of the present invention may become apparent to those skilled in the art to which the present invention belongs from the following detailed description in conjunction with the accompanying drawings.

DETAILED DESCRIPTION

Figure 1:
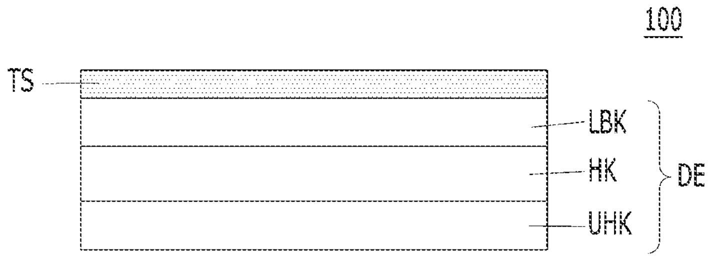
FIG. 1 is a cross-sectional view illustrating a semiconductor device in accordance with an embodiment of the present invention.

Various embodiments described herein may be described with reference to cross-sectional views, plane views and block diagrams, which are ideal schematic views of the present invention. Thus, the structures of the drawings may be modified by fabricating techniques and/or tolerances. The embodiments of the present invention are not limited to the specific structures shown in drawings, but include any changes in the structures that may be produced according to the fabricating process. Accordingly, the regions illustrated in the drawings have schematic attributes, and the shapes of the regions illustrated in the drawings are intended to illustrate specific structures of regions of the elements, and are not intended to limit the scope of the invention.

In general, hafnium oxide having a tetragonal crystal structure (hereinafter abbreviated as "tetragonal hafnium oxide") has a high dielectric constant of approximately 60 or higher and a high bandgap of about 6 eV. The tetragonal hafnium oxide has a higher dielectric constant than tetragonal zirconium oxide.

According to conventional processes, in order to form the tetragonal hafnium oxide, initial hafnium oxide may be deposited, and then a high temperature crystallization annealing process at a high temperature of approximately 900° C. or higher may be performed. However, neighboring structures may be deteriorated by the high temperature crystallization annealing process.

Hereinafter, various embodiments of the present invention are directed to methods for forming the tetragonal hafnium oxide without performing the high temperature crystallization annealing process.

It has been realized that it is generally difficult to form pure tetragonal hafnium oxide using a single layer of hafnium oxide. For this reason, the methods described herein in accordance with the embodiments of the present invention include forming the pure tetragonal hafnium oxide at a low temperature using a seed layer as a crystallization promoting layer.

It has been found that the tetragonal hafnium oxide may be readily formed according to a method which employs a seed layer, a doped layer, and a thermal source layer. The tetragonal hafnium oxide may be formed at a low temperature. For example, the low temperature may be 500° C. or lower.

FIG. 1 is a cross-sectional view illustrating a semiconductor device 100 in accordance with an embodiment of the present invention.

Referring to FIG. 1, the semiconductor device 100 may include a dielectric layer stack DE and a thermal source layer TS. The thermal source layer TS may be formed on the dielectric layer stack DE.

The dielectric layer stack DE may include a material that is crystallized into a tetragonal crystal structure when it is subjected to a low temperature thermal treatment. The low temperature thermal treatment may be provided at a low temperature of 500° C. or lower. The low temperature thermal treatment does not refer to a high temperature crystallization annealing process.

The dielectric layer stack DE may include a multiple-layered material, a laminated material, an intermixing material or combinations thereof. The dielectric layer stack DE may include at least one high-k material. In an embodiment, the high-k material may refer to a material having a higher dielectric constant than silicon oxide (greater than about 3.6). In an embodiment, the high-k material may refer to a material having a higher dielectric constant than silicon nitride (greater than about 7.0). The dielectric layer stack DE may include a high-k material and an ultra high-k material. The ultra high-k material may have a higher dielectric constant than the high-k material.

In the present embodiment, the dielectric layer stack DE may include at least one stack in which a seed layer HK and an ultra high-k layer UHK are stacked. The seed layer HK may include a high-k material, and the ultra high-k layer UHK may include a material having a higher dielectric constant than the seed layer HK. In an embodiment, the seed layer HK may have a dielectric constant of approximately 40 or higher, and the ultra high-k layer UHK may have a dielectric constant of approximately 60 or higher, with the ultra high-k layer UHK having a dielectric constant that is higher than the dielectric constant of the seed layer HK. Each of the seed layer HK and the ultra high-k layer UHK may have the tetragonal crystal structure. The seed layer HK may serve as a seed material for tetragonal crystallization of the ultra high-k layer UHK. In a specific embodiment, the seed layer HK may be formed of a tetragonal zirconium oxide ($ZrO_2$), and the ultra high-k layer UHK may be formed of a tetragonal hafnium oxide ($HfO_2$). The seed layer HK and the ultra high-k layer UHK may be formed by atomic layer deposition (ALD).

The dielectric layer stack DE may further include at least one leakage blocking layer LBK. The leakage blocking layer LBK may serve to suppress a leakage current of the dielectric layer stack DE. The leakage blocking layer LBK may include a high bandgap material. The leakage blocking layer LBK may include a material having a higher bandgap than that of the seed layer HK and the ultra high-k layer UHK. The leakage blocking layer LBK, the seed layer HK and the ultra high-k layer UHK may be different materials. The leakage blocking layer LBK may include a high-k material, and have a lower dielectric constant than the seed layer HK. The leakage blocking layer LBK may have a higher dielectric constant than silicon oxide and silicon nitride. For example, the leakage blocking layer LBK may include an aluminum-containing material or a beryllium-containing material. In an embodiment, the leakage blocking layer LBK may include aluminum oxide ($Al_2O_3$) or beryllium oxide (BeO). The beryllium oxide may be amorphous. The beryllium oxide may have a wurtzite crystal structure or a rock-salt structure. For example, the leakage blocking layer LBK may be formed by ALD. The leakage blocking layer LBK may be formed to have a substantially smaller thickness than the seed layer HK and the ultra high-k layer UHK in order to minimize a decrease in the capacitance of the dielectric layer stack DE. In some embodiments, the leakage blocking layer LBK may include aluminum-doped zirconium oxide, aluminum-doped hafnium oxide, beryllium-doped zirconium oxide or beryllium-doped hafnium oxide.

The thermal source layer TS may provide the low temperature thermal for the crystallization of the seed layer HK and the ultra high-k layer UHK. In other words, the thermal source layer TS may serve as a thermal source for crystalizing the ultra high-k layer UHK into the tetragonal crystal structure. The thermal source layer TS may provide a low temperature thermal of 300° C. to 500° C.

The thermal source layer TS may have high tensile stress. For example, the thermal source layer TS may have a tensile stress of 0.5 GPa to 2.0 GPa. The high tensile stress may promote the crystallization of the ultra high-k layer UHK.

The thermal source layer TS may be a conductive material. The thermal source layer TS may be a metal-based material. The thermal source layer TS may include a metal, metal nitride or metal silicon nitride. For example, the thermal source layer TS may include titanium nitride (TiN), titanium silicon nitride (TiSiN), tungsten (W), tungsten nitride (WN), molybdenum nitride (MoN) or niobium nitride (NbN).

The thermal source layer TS and the seed layer HK facilitate the tetragonal crystallization of the ultra high-k layer UHK without the need for a high temperature crystallization annealing process employed by heretofore processes. For example, the presence of the seed layer HK allows, the crystallization into the tetragonal crystal structure even at low temperature thermal deposition of the thermal source layer TS. The thermal source layer TS may be formed by the ALD, and deposited at a temperature of from 300° C. to 500° C. During the deposition of the thermal source layer TS, the seed layer HK may be crystallized into the tetragonal crystal structure. As a result, the ultra high-k layer UHK may be easily crystallized into the tetragonal crystal structure by the low temperature thermal deposition of the thermal source layer TS and the crystallization of the seed layer HK.

Figure 2A:
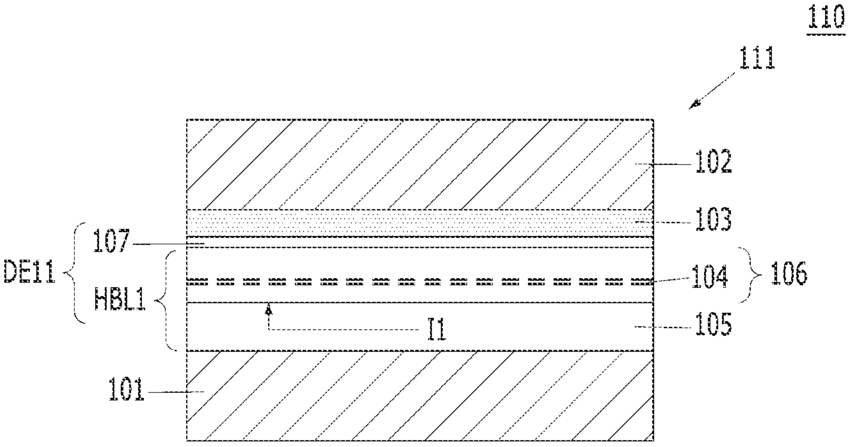
FIG. 2A is a cross-sectional view illustrating a semiconductor device in accordance with an embodiment of the present invention.

FIG. 2A is a cross-sectional view illustrating a semiconductor device 110 in accordance with an embodiment of the present invention.

Referring to FIG. 2A, the semiconductor device 110 may include a capacitor 111. The capacitor 111 may include a first electrode 101, a second electrode 102, and a dielectric layer stack DE11 disposed between the first and second electrodes 101, 102. The capacitor 111 may further include a thermal source layer 103 disposed between the dielectric layer stack DE11 and the second electrode 102. The thermal source layer 103 may correspond to the thermal source layer TS of FIG. 1.

The first electrode 101 may include a metal-containing material. The first electrode 101 may include a metal, metal nitride, metal carbide, conductive metal nitride, conductive metal oxide or combinations thereof. The first electrode 101 may include titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$) or combinations thereof. In some embodiments, the first electrode 101 may include a silicon-containing material. The first electrode 101 may include silicon, silicon germanium or a combination thereof. In some embodiments, the first electrode 101 may include a stack of a metal-containing material and a silicon-containing material. The first electrode 101 may be referred to as a "bottom electrode" or a "storage node". The second electrode 102 may include a silicon-containing material, a germanium-containing material, a metal-containing material or combinations thereof. The second electrode 102 may include a metal, metal nitride, metal carbide, conductive metal nitride, conductive metal oxide or combinations thereof. The second electrode 102 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), silicon (Si), germanium (Ge), silicon germanium (SiGe) or combinations thereof. The second electrode 102 may include a Si/SiGe stack in which silicon germanium is stacked on silicon. The second electrode 102 may include a Ge/SiGe stack in which silicon germanium (SiGe) is stacked on germanium (Ge). The second electrode 102 may be formed by stacking silicon germanium (SiGe) on metal nitride. For example, the second electrode 102 may be formed by stacking silicon germanium (SiGe) on titanium nitride (TiN). In some embodiments, the second electrode 102 may have a structure in which titanium nitride (TiN), silicon germanium (SiGe) and tungsten (W) are sequentially stacked.

The dielectric layer stack DE11 may include a material which is crystallized in a tetragonal crystal structure by a low temperature thermal exposure. The low temperature thermal exposure may be provided at a temperature of 300° C. to 500° C. The low temperature thermal exposure may be provided while the thermal source layer 103 is formed. The low temperature thermal differs from a high temperature crystallization annealing process employed heretofore by conventional processes.

The dielectric layer stack DE11 may include a seed layer 106, an ultra high-k layer 105 and a leakage blocking layer 107. The seed layer 106 may correspond to the seed layer HK of FIG. 1, and the ultra high-k layer 105 may correspond to the ultra high-k layer UHK of FIG. 1. The leakage blocking layer 107 may correspond to the leakage blocking layer LBK of FIG. 1. Each of the seed layer 106 and the ultra high-k layer 105 may have the tetragonal crystal structure. The seed layer 106 may serve as a seed that promotes the crystallization of the ultra high-k layer 105. In an embodiment, the seed layer 106 may be made of or include tetragonal zirconium oxide and the ultra high-k layer 105 may include ultra high-k hafnium oxide having the tetragonal crystal structure. Hereinafter, the ultra high-k layer 105 is abbreviated as a "hafnium oxide layer 105", and a stack of the seed layer 106 and the hafnium oxide layer 105 is abbreviated as a "hafnium oxide-based dielectric layer HBL1". Accordingly, the dielectric layer stack DE11 may include the hafnium oxide-based dielectric layer HBL1 and the leakage blocking layer 107. The leakage blocking layer 107 may be located between the hafnium oxide-based dielectric layer HBL1 and the thermal source layer 103.

The hafnium oxide-based dielectric layer HBL1 may have the tetragonal crystal structure. Each of the hafnium oxide layer 105 and the seed layer 106 may have the tetragonal crystal structure. The leakage blocking layer 107 may reduce a leakage current of the dielectric layer stack DE11.

The formation of the thermal source layer 103 may provide the low temperature thermal energy needed for the crystallization of the dielectric layer stack DE11. In other words, the thermal source layer 103 may serve as a thermal source for crystallizing the hafnium oxide-based dielectric layer HBL1 into the tetragonal crystal structure. The thermal source layer 103 may provide the thermal energy at a low temperature of 300° C. to 500° C. The thermal source layer 103 may have high tensile stress. For example, the thermal source layer 103 may have a tensile stress of 0.5 GPa to 2.0 GPa. The high tensile stress may also promote the tetragonal crystallization of the hafnium oxide layer 105.

The thermal source layer 103 may be a conductive material. The thermal source layer 103 may be directly contacted with the second electrode 102. The thermal source layer 103 may be directly contacted with the leakage blocking layer 107. The thermal source layer 103 may be a metal-based material. For example, the thermal source layer 103 may include a metal, metal nitride or metal silicon nitride. According to an embodiment, the thermal source layer 103 may include titanium nitride (TiN), titanium silicon nitride (TiSiN), tungsten (W), tungsten nitride (WN), molybdenum nitride (MoN) or niobium nitride (NbN).

Due to the thermal source layer 103 and the seed layer 106, a high temperature crystallization annealing process employed previously for the tetragonal crystallization of the hafnium oxide layer 105 is not needed. For example, since the seed layer 106 is present, the hafnium oxide layer 105 may be crystallized into the tetragonal crystal structure even at low temperature thermal exposure when the thermal source layer 103 is deposited. The thermal source layer 103 may be formed by atomic layer deposition (ALD), and deposited at a temperature of 300° C. to 500° C. During the deposition of the thermal source layer 103, the seed layer 106 may also be crystallized into the tetragonal crystal structure. As a result, the hafnium oxide-based dielectric layer HBL1 may be crystallized into the tetragonal crystal structure by the low temperature thermal of the thermal source layer 103.

In an embodiment, the thermal source layer 103 may correspond to a portion of the second electrode 102. For example, when titanium nitride (TiN) and silicon germanium (SiGe) are stacked as the second electrode 102, the titanium nitride (TiN) may serve as the thermal source layer 103.

The hafnium oxide layer 105 may be directly contacted with the first electrode 101, and the seed layer 106 may be directly contacted with the leakage blocking layer 107. The seed layer 106 may be formed on the hafnium oxide layer 105, and the seed layer 106 and the hafnium oxide layer 105 may be directly contacted with each other. The seed layer 106 may be formed between the hafnium oxide layer 105 and the leakage blocking layer 107. The hafnium oxide layer 105, the seed layer 106 and the leakage blocking layer 107 may be deposited by the ALD.

The seed layer 106 may serve as a crystallization seed that promotes the tetragonal crystallization of the hafnium oxide layer 105 while the thermal source layer 103 is formed. In other words, the seed layer 106 may help the hafnium oxide layer 105 to crystallize into the tetragonal crystal structure. Since the seed layer 106 has a high dielectric constant of 40 or higher, the capacitance of the capacitor 111 may be increased, and since the hafnium oxide layer 105 has a high dielectric constant of 60 of higher, the capacitance of the capacitor 111 may be further increased. The seed layer 106 may serve to suppress the leakage current of the dielectric layer stack DE11.

The seed layer 106 may include a high-k material having the tetragonal crystal structure. The seed layer 106 may include a zirconium oxide-based material. The seed layer 106 may be made of or include tetragonal zirconium oxide. In some embodiments, the seed layer 106 may include materials with the tetragonal crystal structure other than the tetragonal zirconium oxide. For example, the seed layer 106 may include at least one of a niobium oxide, germanium oxide, tin oxide, molybdenum oxide, tantalum oxide or titanium oxide.

The hafnium oxide layer 105 may have a higher dielectric constant than the seed layer 106. The hafnium oxide layer 105 may have a higher dielectric constant by approximately 25% to approximately 55% than the seed layer 106. For example, the seed layer 106 may have a dielectric constant of approximately 40, and the hafnium oxide layer 105 may have a dielectric constant of approximately 60 or higher. The tetragonal zirconium oxide as the seed layer 106 may have a dielectric constant of approximately 40. The capacitor 111 including the hafnium oxide layer 105 may have high capacitance. The capacitor 111 including the hafnium oxide layer 105 may have higher capacitance than a capacitor including only the seed layer 106. Consequently, the hafnium oxide layer 105 with the tetragonal crystal structure, which has a higher dielectric constant by 25% to 55% than the seed layer 106, may be applied to increase the capacitance of the capacitor 111 by 25% to 55%.

The hafnium oxide layer 105 may have a higher bandgap than the seed layer 106. Accordingly, the dielectric layer stack DE11 including the hafnium oxide layer 105 may be advantageous in suppressing a leakage current. The hafnium oxide layer 105 may improve an effective work function (eWF) between the second electrode 102 and the dielectric layer stack DE11. For example, when titanium nitride (TiN) is applied as the second electrode 102, an effective work function of approximately 4.7 eV may be obtained by the hafnium oxide layer 105. Meanwhile, tetragonal zirconium oxide ($ZrO_2$) may obtain an effective work function of approximately 4.5 eV. Therefore, since a higher effective work function can be obtained than the tetragonal zirconium oxide by the hafnium oxide layer 105, the leakage current of the dielectric layer stack DE11 may be suppressed.

The hafnium oxide layer 105 may have a smaller thickness than the seed layer 106. The hafnium oxide layer 105 may have a higher dielectric constant than seed layer 106. The hafnium oxide layer 105 may have a high dielectric constant of approximately 60 or higher.

The hafnium oxide layer 105 and the seed layer 106 may be directly contacted with each other, and therefore, the seed layer may be advantageous in crystallizing the hafnium oxide layer 105 into the tetragonal crystal structure.

The dielectric layer stack DE11 may include a multi-layered structure in which the hafnium oxide layer 105 and the seed layer 106 are directly contacted with each other. The dielectric layer stack DE11 may include one or more directly-contacted interfaces.

The dielectric layer stack DE11 may have the multi-layered structure including a directly-contacted interface I1 in which the hafnium oxide layer 105 and the seed layer 106 are directly contacted. When the seed layer 106 includes tetragonal zirconium oxide, a stack in which the hafnium oxide layer 105 and the seed layer 106 are sequentially stacked may be referred to as an "H-Z stack". The directly-contacted interface I1 may be located in the H-Z stack. The directly-contacted interface I1 between the hafnium oxide layer 105 and the seed layer 106 may be a directly-contacted interface between the tetragonal crystal structures. Since there is no material between the hafnium oxide layer 105 and the seed layer 106, the crystal grains of the hafnium oxide layer 105 and the crystal grains of the seed layer 106 may not be separated.

The hafnium oxide layer 105 may have a pure tetragonal crystal structure. In other words, the crystal structure of the hafnium oxide layer 105 may not be a mixture of an amorphous structure, a mono-clinic crystal structure and a tetragonal crystal structure, but may have the tetragonal crystal structure only. The hafnium oxide layer 105 having the pure tetragonal crystal structure may have a higher dielectric constant than a hafnium oxide layer in which the crystal structures are mixed. The hafnium oxide layer 105 having the pure tetragonal crystal structure may have a higher dielectric constant than a hafnium oxide layer having the mono-clinic crystal structure. The hafnium oxide layer having the mono-clinic crystal structure may have a dielectric constant of approximately 40, and the hafnium oxide layer 105 having the tetragonal crystal structure may have a dielectric constant of approximately 60.

The hafnium oxide layer 105 may further include a dopant capable of promoting crystallization. The crystallization promoting dopant may include strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg), nitrogen (N) or combinations thereof. The hafnium oxide layer 105 may have a tetragonal crystal structure doped with the dopant. For example, the hafnium oxide layer 105 may be a lanthanum-doped tetragonal hafnium oxide layer (La-doped tetragonal $HfO_2$). The crystallization promoting dopant may not only promote the crystallization of the hafnium oxide layer 105, but also increases the dielectric constant of the hafnium oxide layer 105.

As described above, the hafnium oxide layer 105 may provide an ultra-high dielectric constant, a low leakage current, and a high effective work function.

The dielectric layer stack DE11 may further include a doping layer 104. The doping layer 104 may increasingly promote the crystallization of the hafnium oxide layer 105, and increasingly suppress the leakage current of the dielectric layer stack DE11.

The doping layer 104 may be ultra thin and may be disposed within or embedded in the seed layer 106. The doping layer 104 may not separate the crystal grains of the seed layer 106. In other words, even if the doping layer 104 disposed or embedded in the seed layer 106, the tetragonal crystal structure of the seed layer 106 may not be separated. The doping layer 104 may be doped and formed in the seed layer 106. The doping layer 104 may be spaced apart from the directly-contacted interface I1 to be embedded in the seed layer 106.

When the seed layer 106 includes the tetragonal zirconium oxide, the doping layer 104 may include the tetragonal zirconium oxide doped with a dopant. In an embodiment, the dopant of the doping layer 104 may include aluminum (Al) or beryllium (Be). For example, the doping layer 104 may include aluminum-doped tetragonal zirconium oxide or beryllium-doped tetragonal zirconium oxide. The aluminum concentration of the aluminum-doped tetragonal zirconium oxide layer may be 1~10 at %.

The thicknesses of the hafnium oxide layer 105 and the seed layer 106 may be adjusted by the doping layer 104. Since the doping layer 104 is included, the hafnium oxide-based dielectric layer HBL1 having no less than a predetermined thickness may be formed. The thickness of the hafnium oxide layer 105 which is sufficiently crystallized by the doping layer 104 may be adjusted. For example, the thickness of the crystallized hafnium oxide layer 105 may be adjusted to a value of 20 Å to 80 Å. The seed layer 106 may have a larger thickness than the hafnium oxide layer 105. The zirconium oxide used as the seed layer 106 may easily obtain the tetragonal crystal structure due to a large thickness during deposition. The seed layer 106 may have the tetragonal crystal structure due to the thickness during deposition, and the tetragonal crystal structure may be increasingly promoted by the subsequent low temperature thermal exposure. The hafnium oxide layer 105 may be thinly deposited to have a non-tetragonal crystal structure, and crystallized into the tetragonal crystal structure by the seed layer 106 and the subsequent low temperature thermal exposure.

The doping layer 104 may have a higher bandgap than the seed layer 106 and the hafnium oxide layer 105. The hafnium oxide layer 105 may have a bandgap of approximately 6 eV, and the seed layer 106 may have a bandgap of approximately 5.8 eV. The doping layer 104 may have a bandgap of approximately 8.8 eV to approximately 10.6 eV.

As described above, the doping layer 104 may increasingly promote the crystallization of the hafnium oxide layer 105, and the high bandgap of the doping layer 104 may suppress the leakage current of the capacitor 111.

The leakage blocking layer 107 may include a high bandgap material. The leakage blocking layer 107 may include a material having a higher bandgap than the seed layer 106 and the hafnium oxide layer 105. The leakage blocking layer 107, the seed layer 106 and the hafnium oxide layer 105 may be different materials. The leakage blocking layer 107 may include a high dielectric constant material, but have a lower dielectric constant than the hafnium oxide layer 105 and the seed layer 106. The leakage blocking layer 107 may have a higher dielectric constant than silicon oxide and silicon nitride. In an embodiment, the leakage blocking layer 107 may include aluminum oxide or beryllium oxide. The beryllium oxide may be amorphous. The beryllium oxide may have a wurtzite crystal structure or a rock-salt structure. The leakage blocking layer 107 may be formed by the ALD. The leakage blocking layer 107 may have a substantially smaller thickness than the seed layer 106 and the hafnium oxide layer 105. The leakage blocking layer 107 and the doping layer 104 may have the same thickness. Since the leakage blocking layer 107 has a lower dielectric constant than the seed layer 106 and the hafnium oxide layer 105, the leakage blocking layer 107 and the doping layer 104 may be formed at an ultra thin thickness to increase the capacitance of the capacitor 111. The leakage blocking layer 107 may have a larger thickness than the doping layer 104.

In some embodiments, the leakage blocking layer 107 may be formed of the same material as the doping layer 104. For example, in an embodiment, the leakage blocking layer 107 may be made or include aluminum-doped zirconium oxide or beryllium-doped zirconium oxide. In this case, the leakage blocking layer 107 may have the tetragonal crystal structure.

Figure 2B:
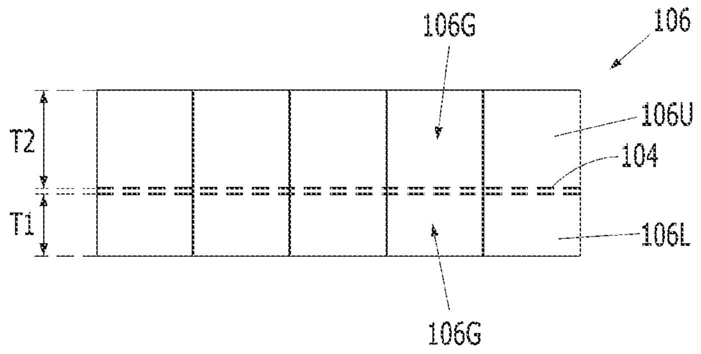
FIG. 2B is a detailed diagram illustrating a seed layer.

FIG. 2B is a detailed diagram illustrating the seed layer 106.

Referring to FIG. 2B, the doping layer 104 may be disposed within, or embedded in the seed layer 106. The seed layer 106 in which the doping layer 104 is disposed or embedded may be defined as an undoped lower seed layer 106L, the doping layer 104 and an undoped upper seed layer 106U. Each of the undoped lower seed layer 106L, the doping layer 104 and the undoped upper seed layer 106U may have the tetragonal crystal structure. The undoped lower seed layer 106L, the doping layer 104 and the undoped upper seed layer 106U may include crystal grains 106G which are not separated but continuous. The doping layer 104 may not separate the crystal grains 106G of the undoped lower seed layer 106L and the crystal grains 106G of the undoped upper seed layer 106U. The undoped upper seed layer 106U may have a larger thickness than the undoped lower seed layer 106L (T2>T1), and the doping layer 104 may have a substantially smaller thickness than the undoped upper seed layer 106U and the undoped lower seed layer 106L. The doping layer 104 may be located between the undoped lower seed layer 106L and the undoped upper seed layer 106U, and have an ultra thin thickness not to separate the crystal grains 106G of the undoped lower seed layer 106L and the crystal grains 106G of the undoped upper seed layer 106U.

Each of the undoped lower seed layer 106L and the undoped upper seed layer 106U may be undoped tetragonal zirconium oxide, and the doping layer 104 may be doped tetragonal zirconium oxide. The doping layer 104 may include aluminum or beryllium as a dopant.

As described above, the doping layer 104 includes the dopant but may not be an oxide layer of the dopant. For example, the doping layer 104 may be aluminum-doped tetragonal zirconium oxide rather than an aluminum oxide ($Al_2O_3$) layer. In addition, the doping layer 104 may be beryllium-doped tetragonal zirconium oxide rather than a beryllium oxide layer.

The undoped lower seed layer 106L, the doping layer 104 and the undoped upper seed layer 106U may be a first zirconium oxide layer, an aluminum-doped zirconium oxide layer and a second zirconium oxide layer, respectively. The seed layer 106 in which the doping layer 104 is disposed or embedded may include a "Z-AZ-Z stack" in which the first zirconium oxide layer, the aluminum-doped zirconium oxide layer and the second zirconium oxide layer are sequentially stacked.

In some embodiments, the doping layer 104 may include an aluminum oxide layer having an ultra thin and discontinuous thickness. The ultra thin and discontinuous thickness may indicate a thickness that does not separate the crystal grains 106G of the undoped lower seed layer 106L and the crystal grains 106G of the undoped upper seed layer 106U.

Figure 2C:
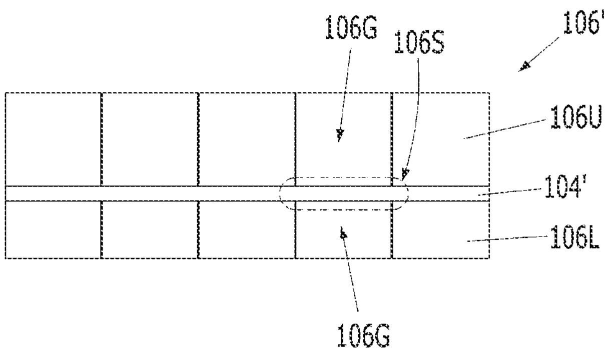
FIG. 2C is a detailed diagram illustrating a seed layer in accordance with a modified example.

FIG. 2C is a detailed diagram illustrating a seed layer 106' in accordance with a modified example.

Referring to FIG. 2C, the seed layer 106' may include an aluminum oxide ($Al_2O_3$) layer 104' formed between an undoped lower seed layer 106L and an undoped upper seed layer 106U. The aluminum oxide layer 104' may have a continuous thickness, and thus crystal grains 106G of the undoped lower seed layer 106L and crystal grains 106G of the undoped upper seed layer 106U may be separated by the aluminum oxide layer 104' (refer to reference numeral '106S'). The crystal grains 106G of the seed layer 106' are vertically separated by the aluminum oxide layer 104'. The aluminum oxide layer 104' may have a larger thickness than the doping layer 104, and be a continuous layer. The seed layer 106' may be referred to as a "Z-A-Z stack".

When the crystal grains 106G of the seed layer 106' are separated by the aluminum oxide layer 104', the dielectric constant of the seed layer 106' decreases. When the dielectric constant of the seed layer 106' decreases, an equivalent oxide layer thickness $T_{ox}$ cannot be reduced.

As described above, the seed layer 106 having the doping layer 104 embedded therein and the thermal source layer 103 may promote the crystallization of the hafnium oxide layer 105 into the tetragonal crystal structure. In addition, the seed layer 106 may crystallize the hafnium oxide layer 105 into the tetragonal crystal structure even at low temperature thermal. Furthermore, the seed layer 106 having the doping layer 104 embedded therein and the hafnium oxide layer 105 may reduce the equivalent oxide layer thickness $T_{ox}$ while increasing the dielectric constant of the dielectric layer stack DE11. The doping layer 104 and the leakage blocking layer 107 may suppress the leakage current of the dielectric layer stack DE11. The doping layer 104 may have a discontinuous thickness, so that the crystal grains 106G of the undoped lower seed layer 106L and crystal grains 106G of the undoped upper seed layer 106U may not be separated by the doping layer 104.

Figure 3:
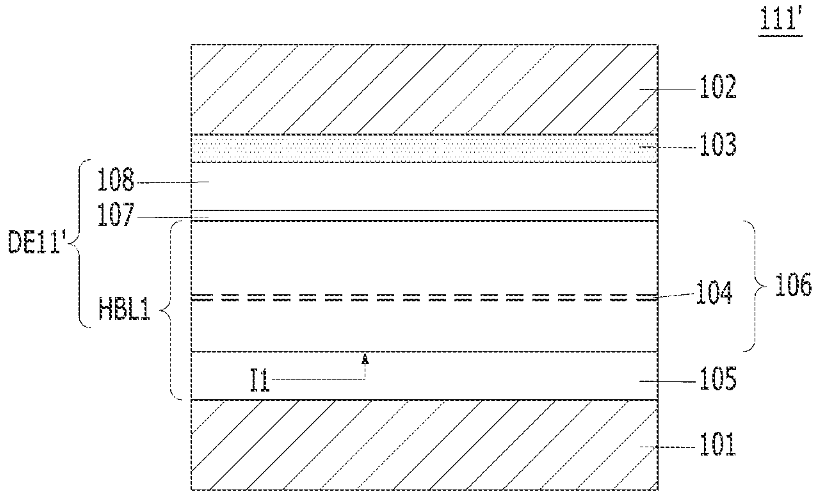
FIG. 3 is a cross-sectional view illustrating a capacitor in accordance with a modified example of FIG. 2A.

FIG. 3 is a cross-sectional view illustrating a capacitor 111' in accordance with a modification of FIG. 2A.

Referring to FIG. 3, the capacitor 111' may be similar to the capacitor 111 of FIG. 2A. The capacitor 111' may include a first electrode 101, a dielectric layer stack DE11' and a second electrode 102. The capacitor 111' may further include a thermal source layer 103 between the dielectric layer stack DE11' and the second electrode 102. The dielectric layer stack DE11' may include a hafnium oxide-based dielectric layer HBL1 and a leakage blocking layer 107, and further include an interface control layer 108 disposed between the leakage blocking layer 107 and the thermal source layer 103. The interface control layer 108 may be made of a different material from the hafnium oxide-based dielectric layer HBL1 and the leakage blocking layer 107.

The interface control layer 108 may serve to protect the hafnium oxide-based dielectric layer HBL1 when the second electrode 102 and the thermal source layer 103 are formed. In addition, the interface control layer 108 may reduce a leakage current of the dielectric layer stack DE11'.

The interface control layer 108 may be made of a material that is reduced more readily than the hafnium oxide-based dielectric layer HBL1 when the thermal source layer 103 and the second electrode 102 are deposited. The interface control layer 108 may serve as a leakage current barrier having a high effective work function (eWF) and a large conduction band offset (CBO). In addition, the interface control layer 108 may not increase the equivalent oxide layer thickness $T_{ox}$ of the dielectric layer stack DE11'.

The interface control layer 108 may be made of a material having high electronegativity. The interfacial control layer 108 may have higher Pauling electronegativity than the hafnium oxide-based dielectric layer HBL1. The interface control layer 108 may include a material having higher Pauling electronegativity (hereinafter abbreviated as "electronegativity") than a hafnium oxide layer 105 and a seed layer 106. When a material has high electronegativity, the material is difficult to oxidize and easy to reduce. Thus, the interface control layer 108 may be deprived of oxygen instead of the hafnium oxide-based dielectric layer HBL1. As a result, the interface control layer 108 may prevent an oxygen loss of the hafnium oxide-based dielectric layer HBL1.

The interface control layer 108 may include an atom having high electronegativity, for example, a metal atom, a silicon atom or a germanium atom. The interface control layer 108 may include titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni) or combinations thereof.

The interface control layer 108 may include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide or combinations thereof.

FIGS. 4A to 13B are cross-sectional views illustrating capacitors in accordance with various modifications.

Figure 4A:
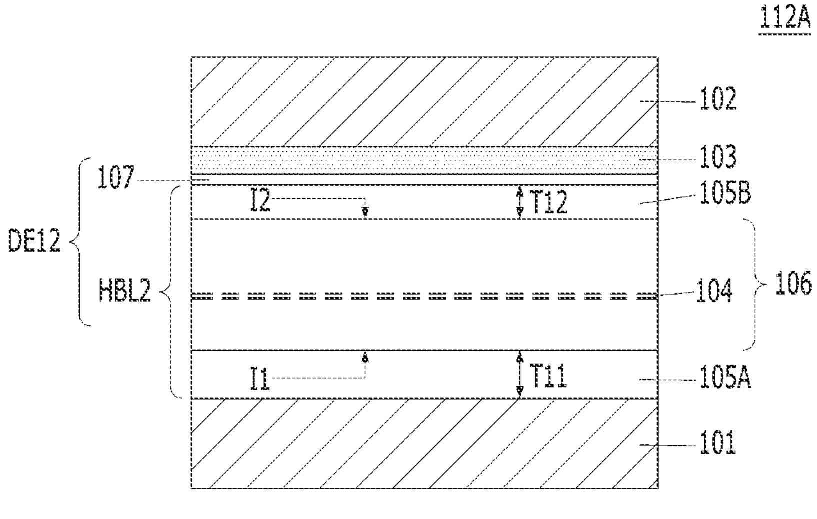
FIGS. 4A to 13B are cross-sectional views illustrating capacitors in accordance with various modified examples.

Referring to FIG. 4A, a capacitor 112A may be similar to the capacitor 111 of FIG. 2A. The capacitor 112A may include a first electrode 101, a dielectric layer stack DE12, and a second electrode 102. The capacitor 112A may further include a thermal source layer 103 between the dielectric layer stack DE12 and the second electrode 102.

The dielectric layer stack DE12 may include a hafnium oxide-based dielectric layer HBL2 and a leakage blocking layer 107. The hafnium oxide-based dielectric layer HBL2 may include a plurality of hafnium oxide layers 105A and 105B and a seed layer 106. The plurality of hafnium oxide layers 105A and 105B may include the first hafnium oxide layer 105A and the second hafnium oxide layer 105B. The dielectric layer stack DE12 may have a structure in which the first hafnium oxide layer 105A, the seed layer 106, the second hafnium oxide layer 105B and the leakage blocking layer 107 are sequentially stacked.

The first hafnium oxide layer 105A may be directly contacted with the first electrode 101, and the second hafnium oxide layer 105B may be directly contacted with the leakage blocking layer 107. The seed layer 106 may be formed between the first hafnium oxide layer 105A and the second hafnium oxide layer 105B. The first hafnium oxide layer 105A may be directly contacted with the seed layer 106, and the seed layer 106 may be directly contacted with the second hafnium oxide layer 105B. The second hafnium oxide layer 105B may be formed between the seed layer 106 and the leakage blocking layer 107.

The first hafnium oxide layer 105A may have a first thickness T11, and the second hafnium oxide layer 105B may have a second thickness T12. The first hafnium oxide layer 105A may have a larger thickness than the second hafnium oxide layer 105B (T11>T12). Accordingly, the occupation of the first hafnium oxide layer 105A in the dielectric layer stack DE12 may be larger than that of the second hafnium oxide layer 105B.

Each of the first hafnium oxide layer 105A and the second hafnium oxide layer 105B may have a pure tetragonal crystal structure, and thus the first hafnium oxide layer 105A and the second hafnium oxide layer 105B may have the same dielectric constant. The first hafnium oxide layer 105A and the second hafnium oxide layer 105B may have higher dielectric constants than the seed layer 106.

In some embodiments, the first hafnium oxide layer 105A may have a pure tetragonal crystal structure, and the second hafnium oxide layer 105B may have a tetragonal crystal structure and a mono-clinic crystal structure. The first hafnium oxide layer 105A may have a higher dielectric constant than the second hafnium oxide layer 105B. Although the second hafnium oxide layer 105B has a lower dielectric constant than the first hafnium oxide layer 105A, the second hafnium oxide layer 105B may have a higher dielectric constant than the seed layer 106. Even if the second hafnium oxide layer 105B has a structure in which the tetragonal crystal structure and the mono-clinic crystal structure are mixed, the tetragonal crystal structure may dominate the second hafnium oxide layer 105B rather than the mono-clinic crystal structure. Moreover, since the first hafnium oxide layer 105A is thicker than the second hafnium oxide layer 105B, the tetragonal crystal structure may be dominant in the dielectric layer stack DE12.

The dielectric layer stack DE12 may further include a doping layer 104. The doping layer 104 of the dielectric layer stack DE12 may be the same as the doping layer 104 of the dielectric layer stack DE11. The doping layer 104 may be ultra thin and may be disposed within or embedded in the seed layer 106. The doping layer 104 may increasingly promote the crystallization of the first and second hafnium oxide layers 105A and 105B, and increasingly suppress a leakage current of the dielectric layer stack DE12.

The thicknesses of the first and second hafnium oxide layers 105A and 105B and the thickness of the seed layer 106 may be adjusted by the doping layer 104. The thicknesses of the first and second hafnium oxide layers 105A and 105B which are sufficiently crystallized may be adjusted by the doping layer 104. For example, the thicknesses of the crystallized first and second hafnium oxide layers 105A and 105B may be adjusted to 20 Å to 80 Å. A leakage current of the capacitor 112A may be suppressed by the doping layer 104.

The doping layer 104 may have a larger bandgap than the seed layer 106, the first hafnium oxide layer 105A and the second hafnium oxide layer 105B. The first and second hafnium oxide layers 105A and 105B may have a bandgap of approximately 6 eV, and the seed layer 106 may have a bandgap of approximately 5.8 eV. The doping layer 104 may have a bandgap of approximately 8.8 eV to approximately 10.6 eV. The doping layer 104 may be discontinuous.

The dielectric layer stack DE12 may have a multi-layered structure including a plurality of directly-contacted interfaces I1 and I2. The plurality of directly-contacted interfaces I1 and I2 may include the directly-contacted interface I1 between the first hafnium oxide layer 105A and the seed layer 106 and the directly-contacted interface I2 between the seed layer 106 and the second hafnium oxide layer 105B. When the seed layer 106 includes tetragonal zirconium oxide, a stack of the first hafnium oxide layer 105A and the seed layer 106 may be referred to as a "H-Z stack", and a stack of the seed layer 106 and the second hafnium oxide layer 105B may be referred to as a "Z-H stack". The directly-contacted interface I1 may be located in the H-Z stack, and the directly-contacted interface I2 may be located in the Z-H stack. The dielectric layer stack DE12 may further include a directly-contacted interface (not illustrated) of the second hafnium oxide layer 105B and the leakage blocking layer 107. The crystallization of the first and second hafnium oxide layers 105A and 105B may be increasingly promoted by the directly-contacted interfaces I1 and I2 which are directly contacted with the seed layer 106.

In FIG. 4A, a stack of the first hafnium oxide layer 105A (H), the seed layer 106 made of zirconium oxide (Z), the doping layer 104 made of an aluminum-doped zirconium oxide layer (ZA) and the second hafnium oxide layer 105B (H) may be referred to as a "H-Z-AZ-Z-H stack".

Figure 4B:
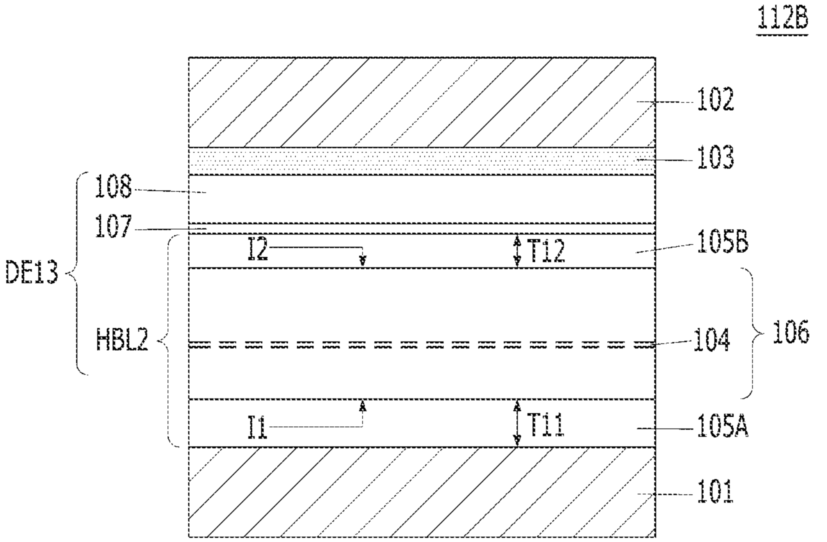

Referring to FIG. 4B, a capacitor 112B may be similar to the capacitor 112A of FIG. 4A. Hereinafter, detailed descriptions of the duplicate components may be omitted.

The capacitor 112B may include a first electrode 101, a dielectric layer stack DE13, a second electrode, and a thermal source layer 103 disposed between the dielectric layer stack and the second electrode 102. The dielectric layer stack DE13 may include a hafnium oxide-based dielectric layer HBL2 and a leakage blocking layer 107. The hafnium oxide-based dielectric layer HBL2 may include a first hafnium oxide layer 105A, a second hafnium oxide layer 105B and a seed layer 106. The dielectric layer stack DE13 may further include an interface control layer 108 disposed between the leakage blocking layer 107 and the thermal source layer 103. The interface control layer 108 may be the same as the interface control layer 108 of FIG. 3.

Figure 4C:
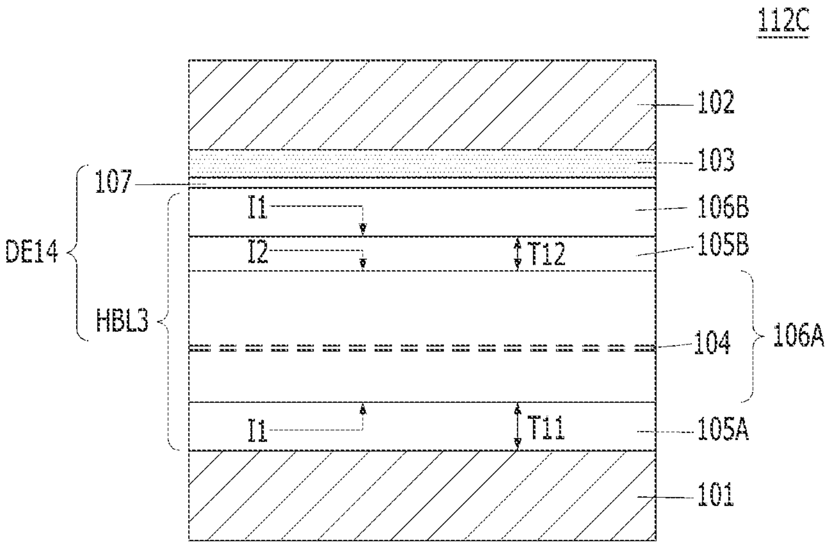

Referring to FIG. 4C, a capacitor 112C may be similar to the capacitor 112A of FIG. 4A. The capacitor 112C may include a first electrode 101, a dielectric layer stack DE14, a second electrode, and a thermal source layer 103 disposed between the dielectric layer stack and the second electrode 102. Hereinafter, detailed descriptions of the duplicate components may be omitted.

The dielectric layer stack DE14 may include a hafnium oxide-based dielectric layer HBL3 and a leakage blocking layer 107. The hafnium oxide-based dielectric layer HBL3 may include a first hafnium oxide layer 105A, a second hafnium oxide layer 105B and a first seed layer 106A. The hafnium oxide-based dielectric layer HBL3 may further include a second seed layer 106B between the second hafnium oxide layer 105B and the leakage blocking layer 107. The first and second seed layers 106A and 106B may be made of the same material. Each of the first and second seed layers 106A and 106B may have a tetragonal crystal structure. Each of the first and second seed layers 106A and 106B may be made of or include tetragonal zirconium oxide. The first seed layer 106A may be tetragonal zirconium oxide in which a doping layer 104 is disposed or embedded, and the second seed layer 106B may be made of or include undoped tetragonal zirconium oxide. The undoped tetragonal zirconium oxide does not include the doping layer 104. The first seed layer 106A may have a larger thickness than the second seed layer 106B, and therefore, the first seed layer 106A may occupy a larger part of the dielectric layer stack DE14 than the second seed layer 106B.

As described above, the doping layer 104 may be disposed within or embedded in the first seed layer 106A, but not be formed in the second seed layer 106B. The crystallization of the second hafnium oxide layer 105B may be increasingly promoted by the first and second seed layers 106A and 106B.

In some embodiments, the leakage blocking layer 107 may be disposed within or embedded in the second seed layer 106B.

When the seed layers 106 include the tetragonal zirconium oxide, a stack of the first hafnium oxide layer 105A and the first seed layer 106A and a stack of the second hafnium oxide layer 105B and the second seed layer 106B may be referred to as a "H-Z stack", and a stack of the first seed layer 106A and the second hafnium oxide layer 105B may be referred to as a "Z-H stack". A directly-contacted interface I1 may be located in the H-Z stack, and a directly-contacted interface I2 may be located in the Z-H stack. The crystallization of the first and second hafnium oxide layers 105A and 105B may be increasingly promoted by the directly-contacted interfaces I1 and I2.

Figure 4D:
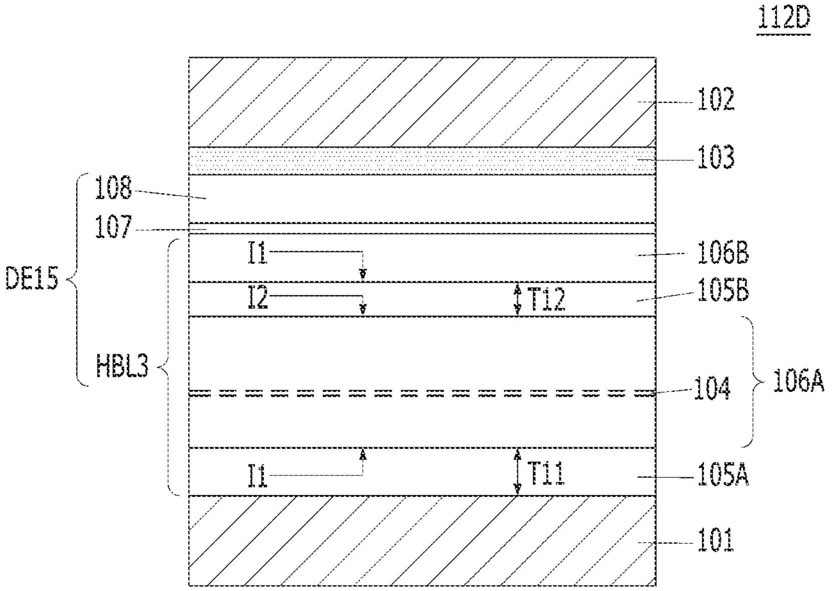

Referring to FIG. 4D, a capacitor 112D may be similar to the capacitor 112C of FIG. 4C. The capacitor 112D may include a first electrode 101, a dielectric layer stack DE15, a second electrode, and a thermal source layer 103 disposed between the dielectric layer stack and the second electrode 102. Hereinafter, detailed descriptions of the duplicate components may be omitted.

The dielectric layer stack DE15 may include a hafnium oxide-based dielectric layer HBL3 and a leakage blocking layer 107. The hafnium oxide-based dielectric layer HBL3 may include a first hafnium oxide layer 105A, a first seed layer 106A, a second hafnium oxide layer 105B and a second seed layer 106B. The dielectric layer stack DE15 may further include an interface control layer 108 disposed between the leakage blocking layer 107 and the thermal source layer 103.

In FIGS. 4C and 4D, the first seed layer 106A, the second seed layer 106B and the thermal source layer 103 may promote the tetragonal crystallization of the first and second hafnium oxide layers 105A and 105B. The formation of the thermal source layer 103 may provide low temperature thermal energy to crystallize the first and second hafnium oxide layers 105A and 105B into tetragonal crystal structures. The first and second hafnium oxide layers 105A and 105B may be more readily crystallized into the tetragonal crystal structures by the first seed layer 106A. The second hafnium oxide layer 105B may be crystallized into the tetragonal crystal structure by the second seed layer 106B. The second hafnium oxide layer 105B may be crystallized into the tetragonal crystal structure by the first and second seed layers 106A and 106B.

Both of the first hafnium oxide layer 105A and the second hafnium oxide layer 105B may have pure tetragonal crystal structures.

In some embodiments, the first hafnium oxide layer 105A may have the pure tetragonal crystal structure, and the second hafnium oxide layer 105B may have the tetragonal crystal structure and the mono-clinic crystal structure. The first hafnium oxide layer 105A may have a higher dielectric constant than the second hafnium oxide layer 105B. Although the second hafnium oxide layer 105B has a lower dielectric constant than the first hafnium oxide layer 105A, the second hafnium oxide layer 105B may have a higher dielectric constant than the first and second seed layers 106A and 106B. Even though the second hafnium oxide layer 105B has a structure in which the tetragonal crystal structure and the mono-clinic crystal structure are mixed, the tetragonal crystal structure may dominate the second hafnium oxide layer 105B rather than the mono-clinic crystal structure. Since the first hafnium oxide layer 105A has a larger thickness than the second hafnium oxide layer 105B, the tetragonal crystal structure may be dominant in the dielectric layer stacks DE14 and DE15.

In some embodiments, in FIGS. 4A to 4D, each of the first and second hafnium oxide layers 105A and 105B of FIGS. 4A to 4D may include a dopant. The dopant may be the same as or different from the dopant of the doping layer 104. The dopant may include at least one of strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg) or nitrogen (N). Each of the first and second hafnium oxide layers 105A and 105B may have a doped tetragonal crystal structure.

Figure 5A:
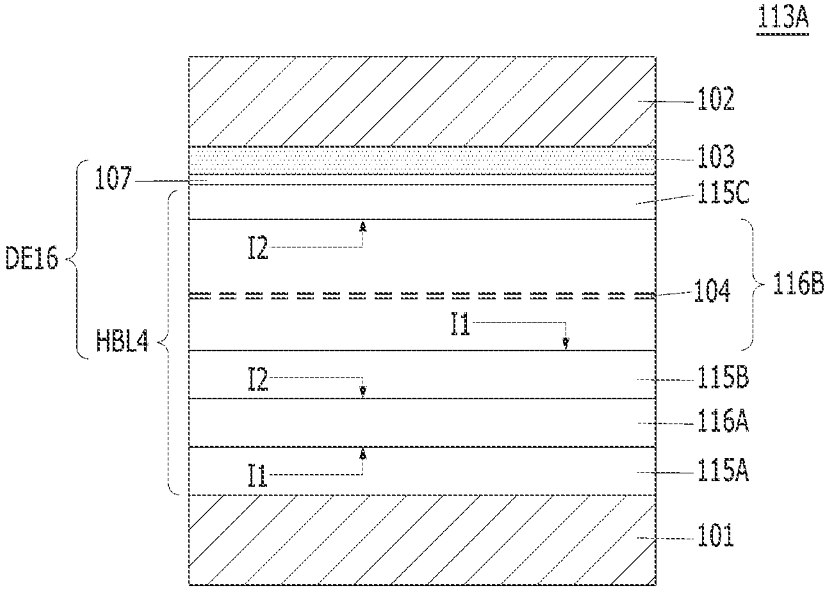

Referring to FIG. 5A, a capacitor 113A may include a first electrode 101, a dielectric layer stack DE16, a second electrode, and a thermal source layer 103 disposed between the dielectric layer stack and the second electrode 102.

The dielectric layer stack DE16 may include a hafnium oxide-based dielectric layer HBL4 and a leakage blocking layer 107.

The hafnium oxide-based dielectric layer HBL4 may include a stack of a first hafnium oxide layer 115A, a first seed layer 116A, a second hafnium oxide layer 115B, a second seed layer 116B and a third hafnium oxide layer 115C. The first hafnium oxide layer 115A and the first seed layer 116A may be directly contacted with each other. The first hafnium oxide layer 115A may be directly contacted with the first electrode 101, and the first seed layer 116A may be directly contacted with the first hafnium oxide layer 115A. The second hafnium oxide layer 115B may be directly contacted with the first seed layer 116A. The second seed layer 116B may be directly contacted with the second hafnium oxide layer 115B and the third hafnium oxide layer 115C. A directly-contacted interface I1 may be located in the stack between the first hafnium oxide layer 115A and the first seed layer 116A. A directly-contacted interface I2 may be located in the stack between the first seed layer 116A and the second hafnium oxide layer 115B. A directly-contacted interface I1 may be located in the stack between the second hafnium oxide layer 115B and the second seed layer 116B. A directly-contacted interface I2 may be located in the stack between the second seed layer 116B and the third hafnium oxide layer 115C.

The doping layer 104 may not be formed in the first seed layer 116A, but embedded in the second seed layer 116B.

The first seed layer 116A may have a smaller thickness than the second seed layer 116B.

The first hafnium oxide layer 115A may have a larger thickness than the second and third hafnium oxide layers 115B and 115C. In a variation of the described embodiment of FIG. 5A, the first, second and third hafnium oxide layers 115A, 115B and 115C may have the same thickness.

Figure 5B:
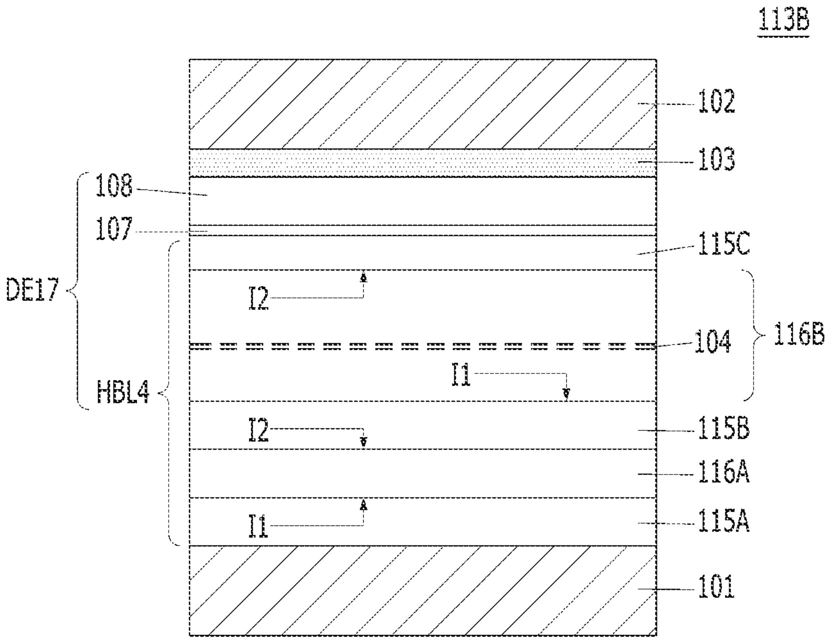

Referring to FIG. 5B, a capacitor 113B may be similar to the capacitor 113A of FIG. 5A. Hereinafter, detailed descriptions of the duplicate components may be omitted.

The capacitor 113B may include a first electrode 101, a dielectric layer stack DE17, a second electrode, and a thermal source layer 103 disposed between the dielectric layer stack DE17 and the second electrode 102. The dielectric layer stack DE17 may include a hafnium oxide-based dielectric layer HBL4 and a leakage blocking layer 107. The hafnium oxide-based dielectric layer HBL4 may include a stack of a first hafnium oxide layer 115A, a first seed layer 116A, a second hafnium oxide layer 115B, a second seed layer 116B and a third hafnium oxide layer 115C. The dielectric layer stack DE17 may further include an interface control layer 108 disposed between the leakage blocking layer 107 and the thermal source layer 103.

In FIGS. 5A and 5B, the first seed layer 116A, the second seed layer 116B and the thermal source layer 103 may promote the tetragonal crystallization of the first hafnium oxide layer 115A, the second hafnium oxide layer 115B and the third hafnium oxide layer 115C. Formation of the thermal source layer 103 may provide low temperature thermal energy to crystallize the first to third hafnium oxide layers 115A to 115C into the tetragonal crystal structures. The first and second hafnium oxide layers 115A and 115B may be more readily crystallized into the tetragonal crystal structures by the first seed layer 116A. The second and third hafnium oxide layers 115B and 115C may be more readily crystallized into the tetragonal crystal structures by the second seed layer 116B.

The crystallization of the first and second hafnium oxide layers 105A and 105B may be increasingly promoted by the directly-contacted interfaces I1 and I2.

All of the first to third hafnium oxide layers 115A to 115C may have pure tetragonal crystal structures. In some embodiments, the first and second hafnium oxide layers 115A and 115B may have the pure tetragonal crystal structures, and the third hafnium oxide layer 115C may have a structure in which a mono-clinic crystal structure and the tetragonal crystal structure are mixed with the tetragonal crystal structure being the dominant structure of the third hafnium oxide layer 115C. The tetragonal crystal structure being the dominant structure as this term is used herein means that in the third hafnium oxide layer 115C, when it is composed of both the mono-clinic structure and the tetragonal crystal structure, the tetragonal crystal structure may be at least 60 percent of the overall material of the third hafnium oxide layer 115C.

Figure 5C:
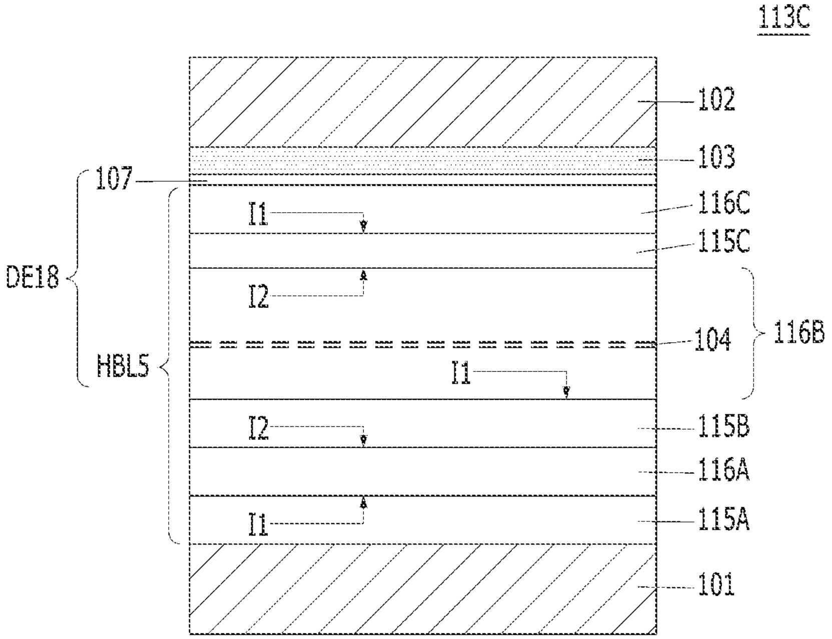

Referring to FIG. 5C, a capacitor 113C may be similar to the capacitor 113A of FIG. 5A except for a third seed layer 116C. Hereinafter, detailed descriptions of the duplicate components may be omitted.

The capacitor 113C may include a first electrode 101, a dielectric layer stack DE18, a second electrode, and a thermal source layer 103 disposed between the dielectric layer stack DE18 and the second electrode 102. The dielectric layer stack DE18 may include a hafnium oxide-based dielectric layer HBL5 and a leakage blocking layer 107 formed on the hafnium oxide-based dielectric layer HBL5.

The hafnium oxide-based dielectric layer HBL5 may include a stack of a first hafnium oxide layer 115A, a first seed layer 116A, a second hafnium oxide layer 115B, a second seed layer 116B, a third hafnium oxide layer 115C and third seed layer 116C.

The third seed layer 116C may be located between the third hafnium oxide layer 115C and the leakage blocking layer 107. The first to third seed layers 116A to 116C may be made of the same material. The first to third seed layers 116A to 116C may have tetragonal crystal structures. The first to third seed layers 116A to 116C may be made of or include tetragonal zirconium oxide. The second seed layer 116B may be tetragonal zirconium oxide in which a doping layer 104 is disposed or embedded, and the first and third seed layers 116A and 116C may be made of or include undoped tetragonal zirconium oxide. Herein, the undoped tetragonal zirconium oxide does not include the doping layer 104.

As described above, the doping layer 104 may be disposed within or embedded in the second seed layer 116B, but not be formed in the first and third seed layers 116A and 116C. The crystallization of the third hafnium oxide layer 115C may be increasingly promoted by the third and second seed layers 116C and 116B.

In some embodiments, the leakage blocking layer 107 may be disposed within or embedded in the third seed layer 116C.

A directly-contacted interface I1 may be located in the stack between the first hafnium oxide layer 115A and the first seed layer 116A. A directly-contacted interface I2 may be located in the stack between the first seed layer 116A and the second hafnium oxide layer 115B. A directly-contacted interface I1 may be located in the stack between the second hafnium oxide layer 115B and the second seed layer 116B. A directly-contacted interface I2 may be located in the stack between the second seed layer 116B and the third hafnium oxide layer 115C. A directly-contacted interface I1 may be located in the stack between the third hafnium oxide layer 115C and the third seed layer 116C. The crystallization of the first, second and third hafnium oxide layers 115A, 115B and 115C may be increasingly promoted by the directly-contacted interfaces I1 and I2.

Figure 5D:
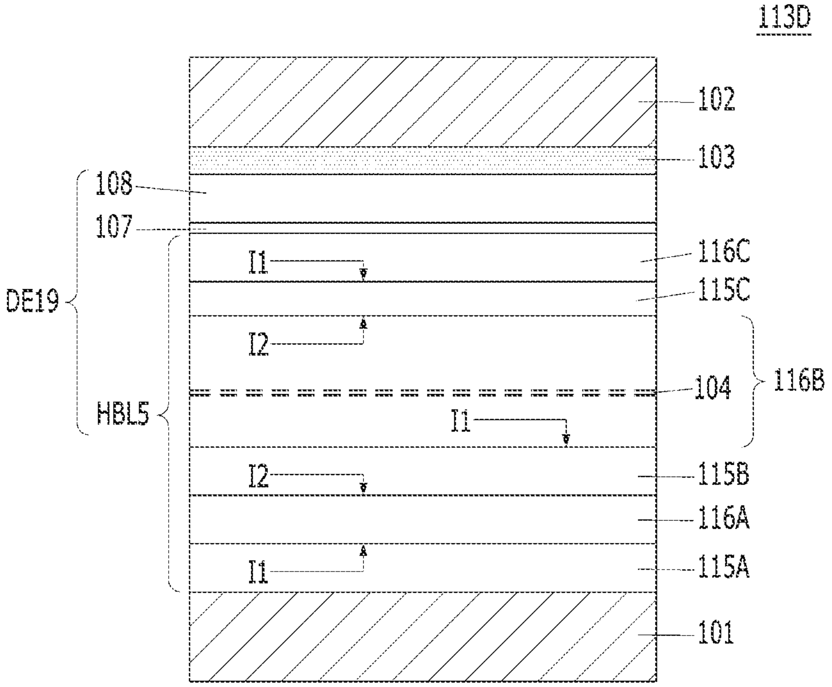

Referring to FIG. 5D, a capacitor 113D may be similar to the capacitor 113C of FIG. 5C except for the additional interface control layer 108. Hereinafter, detailed descriptions of the duplicate components may be omitted.

The capacitor 113D may include a first electrode 101, a dielectric layer stack DE19, a second electrode 102, and a thermal source layer 103 disposed between the dielectric layer stack DE19 and the second electrode 102. The dielectric layer stack DE19 may include a hafnium oxide-based dielectric layer HBL5 and a leakage blocking layer 107 formed on the hafnium oxide-based dielectric layer HBL5. The hafnium oxide-based dielectric layer HBL5 may include a stack of a first hafnium oxide layer 115A, a first seed layer 116A, a second hafnium oxide layer 115B, a second seed layer 116B, a third hafnium oxide layer 115C and a third seed layer 116C. The dielectric layer stack DE19 may further include interface control layer 108 disposed between the leakage blocking layer 107 and the thermal source layer 103.

In some embodiments, the structures of FIGS. 5A to 5D may further include a dopant in at least one of the first to third hafnium oxide layers 105A, 105B and 105C. In some embodiments, the structures of FIGS. 5A to 5D may further include a dopant in each one of the first to third hafnium oxide layers 105A, 105B and 105C. The dopant may include at least one of strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg) or nitrogen (N). Hence, in some embodiments, each of the first to third hafnium oxide layers 105A, 105B and 105C may have a dopant-doped tetragonal crystal structure.

Figure 6A:
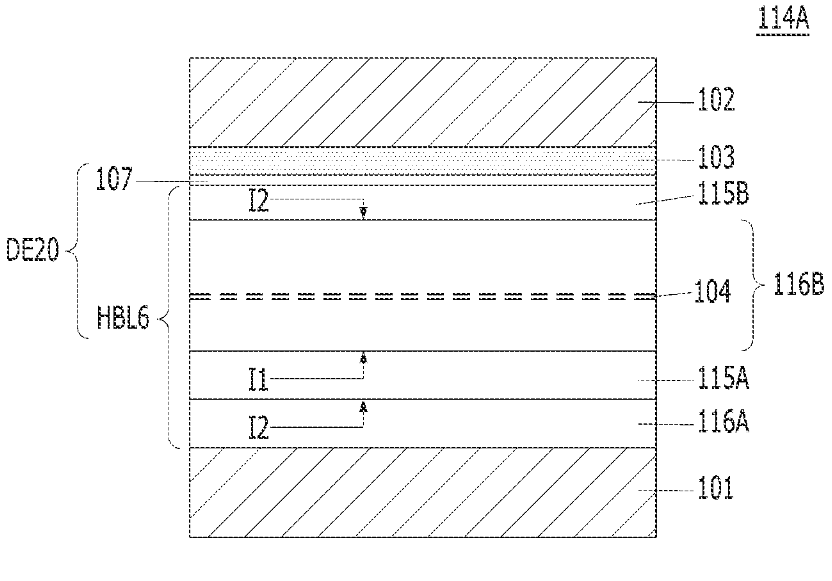

Referring to FIG. 6A, a capacitor 114A may include a first electrode 101, a dielectric layer stack DE20, a second electrode 102, and a thermal source layer 103 disposed between the dielectric layer stack DE20 and the second electrode 102.

The dielectric layer stack DE20 may include a hafnium oxide-based dielectric layer HBL6 and a leakage blocking layer 107 formed on the hafnium oxide-based dielectric layer HBL6. The hafnium oxide-based dielectric layer HBL6 may include a first seed layer 116A, a first hafnium oxide layer 115A, a second seed layer 116B and a second hafnium oxide layer 115B. The first seed layer 116A may be directly contacted with the first electrode 101.

The first seed layer 116A and the second seed layer 116B may be made of the same material. The first and second seed layers 116A and 116B may have tetragonal crystal structures. The first and second seed layers 116A and 116B may be made of or include tetragonal zirconium oxide. The first seed layer 116A may be made of or include undoped tetragonal zirconium oxide, and the second seed layer 116B may be made of or include tetragonal zirconium oxide in which a doping layer 104 is disposed or embedded. The undoped tetragonal zirconium oxide does not include the doping layer 104.

As described above, the doping layer 104 may be disposed within or embedded in the second seed layer 116B, but not be formed in the first seed layer 116A. The crystallization of the second hafnium oxide layer 115B may be promoted by the second seed layer 116B. The crystallization of the first hafnium oxide layer 115A may be increasingly promoted by the first and second seed layers 116A and 116B.

A directly-contacted interface I2 may be located in a stack of the first seed layer 116A and the first hafnium oxide layer 115A between the first seed layer 116A and the first hafnium oxide layer 115A. A directly-contacted interface I1 may be located in a stack of the first hafnium oxide layer 115A and the second seed layer 116B, between the first hafnium oxide layer 115A and the second seed layer 116B. A directly-contacted interface I2 may be located in a stack of the second seed layer 116B and the second hafnium oxide layer 115B, between the second seed layer 116B and the second hafnium oxide layer 115B.

Figure 6B:
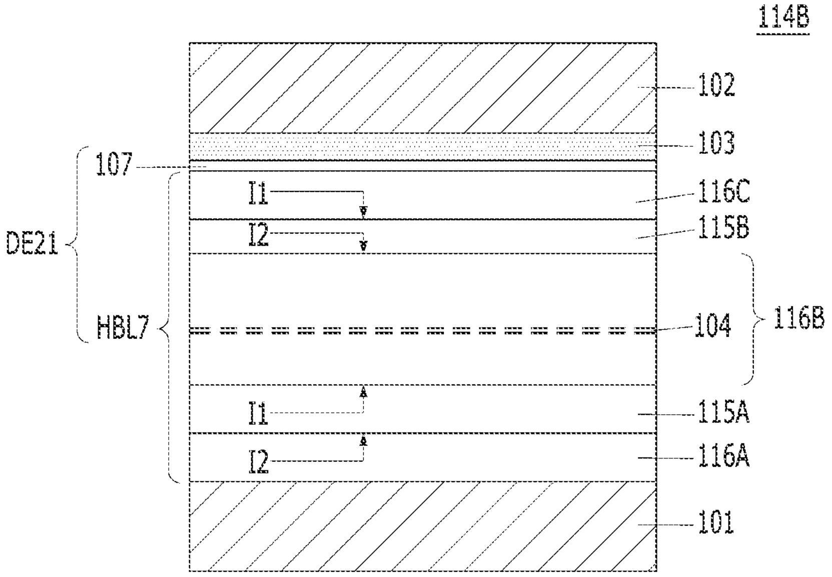

Referring to FIG. 6B, a capacitor 114B may have a similar structure to the structure of FIG. 5A except for a third seed layer 116C. Specifically, the capacitor 114B may include a first electrode 101, a dielectric layer stack DE21, a second electrode 102, and a thermal source layer 103 disposed between the dielectric layer stack DE21 and the second electrode 102.

The dielectric layer stack DE21 may include a hafnium oxide-based dielectric layer HBL7 and a leakage blocking layer 107 formed on the hafnium oxide-based dielectric layer HBL7. The hafnium oxide-based dielectric layer HBL7 may include a first seed layer 116A, a first hafnium oxide layer 115A, a second seed layer 116B, a second hafnium oxide layer 115B and a third seed layer 116C.

The first seed layer 116A, the second seed layer 116B and the third seed layer 116C may be formed of the same material. The first to third seed layers 161A, 116B and 116C may have tetragonal crystal structures.

The first to third seed layers 116A, 116B and 116C may be made of or include tetragonal zirconium oxide. The second seed layer 116B may be made of or include tetragonal zirconium oxide in which a doping layer 104 is disposed or embedded, and the first and third seed layers 116A and 116C may be made of or include undoped tetragonal zirconium oxide. The undoped tetragonal zirconium oxide does not include the doping layer 104.

As described above, the doping layer 104 may be disposed within or embedded in the second seed layer 116B, but not be formed in the first and third seed layers 116A and 116C. The crystallization of the first hafnium oxide layer 115A may be promoted by the first and second seed layers 116A and 116B. The crystallization of the second hafnium oxide layer 115B may be increasingly promoted by the second and third seed layers 116B and 116C.

In some embodiments, the leakage blocking layer 107 may be disposed within or embedded in the third seed layer 116C.

A directly-contacted interface I2 may be located in the stack between the first seed layer 116A and the first hafnium oxide layer 115A. A directly-contacted interface I1 may be located in the stack between the first hafnium oxide layer 115A and the second seed layer 116B. A directly-contacted interface I2 may be located in the stack between the second seed layer 116B and the second hafnium oxide layer 115B. A directly-contacted interface I1 may be located in the stack between the second hafnium oxide layer 115B and the third seed layer 116C.

In some embodiments, each of the dielectric layer stacks DE20 and DE21 of FIGS. 6A and 6B may further include an interface control layer (not illustrated) between the leakage blocking layer 107 and the thermal source layer 103. The interface control layer may correspond to the interface control layer 108 in the above-described embodiments.

Figure 7A:
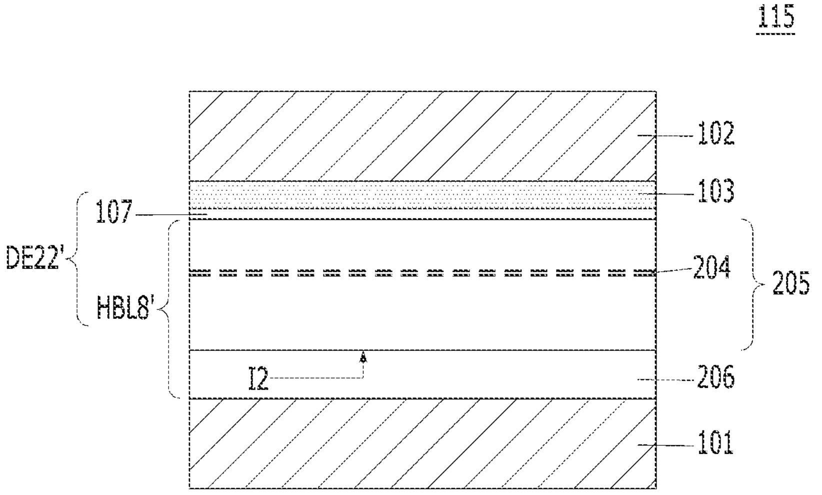

Referring to FIG. 7A, a capacitor 115 may include a first electrode 101, a dielectric layer stack DE22', a second electrode 102, and a thermal source layer 103 disposed between the dielectric layer stack DE22' and the second electrode 102. Descriptions of the first electrode 101, a leakage blocking layer 107, the thermal source layer 103 and the second electrode 102 are provided with reference to the above-described embodiments.

The dielectric layer stack DE22' may include a hafnium oxide-based dielectric layer HBL8' and the leakage blocking layer 107. The hafnium oxide-based dielectric layer HBL8 may include a seed layer 206, a hafnium oxide layer 205 and a doping layer 204.

The seed layer 206 may be directly contacted with the first electrode 101 and the hafnium oxide layer 205, and thus effectively crystallize the hafnium oxide layer 205 into a tetragonal crystal structure.

A directly-contacted interface I2 may be located in the stack between the seed layer 206 and the hafnium oxide layer 205.

The dielectric layer stack DE22' may include a multi-layered structure in which the hafnium oxide layer 205 and the seed layer 206 are directly contacted with each other. The dielectric layer stack DE22 may include one or more directly-contacted interfaces.

The dielectric layer stack DE22' may have the multi-layered structure including the directly-contacted interface I2 at which the hafnium oxide layer 205 and the seed layer 206 are directly contacted with each other. When the seed layer 206 includes tetragonal zirconium oxide, the stack of the seed layer 206 and the hafnium oxide layer 205 may be referred to as a "Z-H stack". The directly-contacted interface I2 may be located in the Z-H stack. The directly-contacted interface I2 between the seed layer 206 and the hafnium oxide layer 205 may be a directly-contacted interface between the tetragonal crystal structures.

The hafnium oxide layer 205 may have a pure tetragonal crystal structure.

The dielectric layer stack DE22' may further include a doping layer 204. The doping layer 204 may increasingly promote the crystallization of the hafnium oxide layer 205, and increasingly suppress a leakage current of the dielectric layer stack DE22'. The doping layer 204 may be ultra thin and may be disposed within, or embedded in the hafnium oxide layer 205. The doping layer 204 may not separate crystal grains of the hafnium oxide layer 205. In other words, the doping layer 204 may not separate the tetragonal crystal structure of the hafnium oxide layer 205. The doping layer 204 may be formed by doping the hafnium oxide layer 205 with a dopant. The doping layer 204 may be spaced apart from the directly-contacted interface I2 to be embedded in the hafnium oxide layer 205.

When the hafnium oxide layer 205 includes tetragonal hafnium oxide, the doping layer 204 may include tetragonal hafnium oxide doped with a dopant. In an embodiment, the dopant of the doping layer 204 may include aluminum (Al) or beryllium (Be). For example, the doping layer 204 may include aluminum-doped tetragonal hafnium oxide or beryllium-doped tetragonal hafnium oxide.

The hafnium oxide layer 205 may be crystallized into the tetragonal crystal structure by the seed layer 206 and the thermal source layer 103.

The doping layer 204 may have a higher bandgap than the seed layer 206 and the hafnium oxide layer 205.

In this manner, not only the doping layer 204 may further promote the crystallization of the hafnium oxide layer 205, but also the high bandgap of the doping layer 204 may suppress a leakage current of the capacitor 115.

The leakage blocking layer 107 may be formed between the hafnium oxide layer 205 and the thermal source layer 103. In an embodiment, the leakage blocking layer 107 may include aluminum oxide or beryllium oxide.

In some embodiments, the leakage blocking layer 107 may be disposed within or embedded in the upper surface of the hafnium oxide layer 205. The leakage blocking layer 107 may include aluminum-doped hafnium oxide or beryllium-doped hafnium oxide.

Figure 7B:
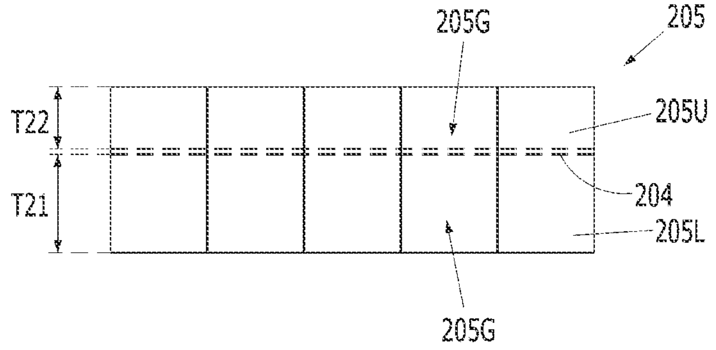

FIG. 7B is a detailed diagram of the hafnium oxide layer 205.

Referring to FIG. 7B, the doping layer 204 may be disposed within or embedded in the hafnium oxide layer 205. The hafnium oxide layer 205 in which the doping layer 204 is disposed or embedded may be defined as an undoped lower hafnium oxide layer 205L, the doping layer 204 and an undoped upper hafnium oxide layer 205U. Each of the undoped lower hafnium oxide layer 205L, the doping layer 204 and the undoped upper hafnium oxide layer 205U may have a tetragonal crystal structure. The undoped lower hafnium oxide layer 205L, the doping layer 204 and the undoped upper hafnium oxide layer 205U may include crystal grains 205G which are not separated but continuous. The doping layer 204 may not separate the crystal grains 205G of the undoped lower hafnium oxide layer 205L and the crystal grains 205G of the undoped upper hafnium oxide layer 205U. The undoped lower hafnium oxide layer 205L may have a larger thickness than the undoped upper hafnium oxide layer 205U (T21>T22), and the doping layer 204 may have a substantially smaller thickness than the undoped upper hafnium oxide layer 205U and the undoped lower hafnium oxide layer 205L. The doping layer 204 may be located between the undoped lower hafnium oxide layer 205L and the undoped upper hafnium oxide layer 205U, and have an ultra thin thickness not to separate the crystal grains 205G of the undoped lower hafnium oxide layer 205L and the crystal grains 205G of the undoped upper hafnium oxide layer 205U. In some embodiments, the undoped lower hafnium oxide layer 205L and the undoped upper hafnium oxide layer 205U may have the same thickness. In some embodiments, the undoped lower hafnium oxide layer 205L may have a smaller thickness than the undoped upper hafnium oxide layer 205U.

In some embodiments, the doping layer 204 may include an aluminum oxide layer having an ultra-small and discontinuous thickness. The ultra-small and discontinuous thickness may indicate a thickness that does not separate the crystal grains 205G of the undoped lower hafnium oxide layer 205L and the crystal grains 205G of the undoped upper hafnium oxide layer 205U.

Each of the undoped lower hafnium oxide layer 205L and the undoped upper hafnium oxide layer 205U may be undoped tetragonal hafnium oxide, and the doping layer 204 may be doped tetragonal hafnium oxide. The doping layer 204 may include aluminum or beryllium as a dopant.

As described above, although the doping layer 204 includes the dopant, the doping layer 204 may not be an oxide layer of the dopant. For example, the doping layer 204 may be aluminum-doped tetragonal hafnium oxide rather than an aluminum oxide ($Al_2O_3$) layer. In addition, the doping layer 204 may be beryllium-doped tetragonal hafnium oxide rather than a beryllium oxide layer.

The undoped lower hafnium oxide layer 205L, the doping layer 204 and the undoped upper hafnium oxide layer 205U may be referred to as a first hafnium oxide layer, an aluminum-doped hafnium oxide layer and a second hafnium oxide layer, respectively. The hafnium oxide 205 in which the doping layer 204 is disposed or embedded may include an "H-AH-H stack" in which the first hafnium oxide layer, the aluminum-doped hafnium oxide layer and the second hafnium oxide layer are sequentially stacked.

Figure 8A:
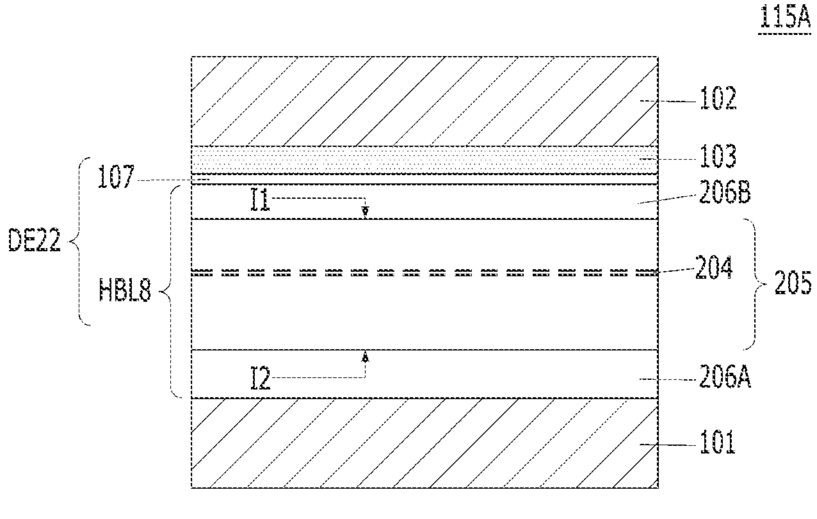

Referring to FIG. 8A, a capacitor 115A may include a first electrode 101, a dielectric layer stack DE22, a second electrode 102, and a thermal source layer 103 disposed between the dielectric layer stack DE22 and the second electrode 102. Descriptions of the first electrode 101, a leakage blocking layer 107, the thermal source layer 103 and the second electrode 102 may be provided with reference to the above-described embodiments.

The dielectric layer stack DE22 may include a hafnium oxide-based dielectric layer HBL8 and the leakage blocking layer 107. The hafnium oxide-based dielectric layer HBL8 may include a first seed layer 206A, a hafnium oxide layer 205, a doping layer 204 and a second seed layer 206B. The doping layer 204 may be disposed within or embedded in the hafnium oxide layer 205.

The first seed layer 206A and the second seed layer 206B may be directly contacted with the hafnium oxide layer 205, and thus effectively crystallize the hafnium oxide layer 205 into a tetragonal crystal structure.

A directly-contacted interface I2 may be located in the stack between the first seed layer 206A and the hafnium oxide layer 205. A directly-contacted interface I1 may be located in the stack between the hafnium oxide layer 205 and the second seed layer 206B.

The dielectric layer stack DE22 may include a multi-layered structure in which the hafnium oxide layer 205 and the first and second seed layers 206A and 206B are directly contacted with each other. The dielectric layer stack DE22 may include one or more directly-contacted interfaces.

The dielectric layer stack DE22 may have a multi-layered structure including the directly-contacted interface I1 and I2 at which the hafnium oxide layer 205 and the first and second seed layers 206A and 206B are directly contacted with each other, respectively. When the first seed layer 206A includes tetragonal zirconium oxide, the stack of the first seed layer 206A and the hafnium oxide layer 205 may be referred to as a "Z-H stack", and the stack of the hafnium oxide layer 205 and the second seed layer 206B may be referred to as a "H-Z stack". The directly-contacted interface I2 may be located in the Z-H stack, and the directly-contacted interface I1 may be located in the H-Z stack. Each of the directly-contacted interfaces I1 and I2 may be a directly-contacted interface between the tetragonal crystal structures.

The hafnium oxide layer 205 may have a pure tetragonal crystal structure.

The dielectric layer DE22 may further include the doping layer 204. The doping layer 204 may increasingly promote the crystallization of the hafnium oxide layer 205, and increasingly suppress a leakage current of the dielectric layer stack DE22. The doping layer 204 may be ultra thin and may be embedded in the hafnium oxide layer 205. The doping layer 204 may not separate crystal grains of the hafnium oxide layer 205. In other words, the doping layer 204 may not separate the tetragonal crystal structure of the hafnium oxide layer 205. The doping layer 204 may be formed by doping the hafnium oxide layer 205 with a dopant.

When the hafnium oxide layer 205 includes tetragonal hafnium oxide, the doping layer 204 may include tetragonal hafnium oxide doped with a dopant. In an embodiment, the dopant of the doping layer 204 may include aluminum (Al) or beryllium (Be). For example, the doping layer 204 may include aluminum-doped tetragonal hafnium oxide or beryllium-doped tetragonal hafnium oxide.

The hafnium oxide layer 205 may be crystallized into the tetragonal crystal structure by the first and second seed layers 206A and 206B and the thermal source layer 103.

The doping layer 204 may have a higher bandgap than the first and second seed layers 206A and 206B and the hafnium oxide layer 205.

In this manner, not only the doping layer 204 may increasingly promote the crystallization of the hafnium oxide layer 205, but also the high bandgap of the doping layer 204 may suppress a leakage current of the capacitor 115A.

The leakage blocking layer 107 may be formed between the second seed layer 206B and the thermal source layer 103. In an embodiment, the leakage blocking layer 107 may include aluminum oxide or beryllium oxide.

In some embodiments, the leakage blocking layer 107 may be disposed within or embedded in the upper surface of the second seed layer 206B. In an embodiment, the leakage blocking layer 107 may be made or include aluminum-doped zirconium oxide or beryllium-doped zirconium oxide.

Figure 8B:
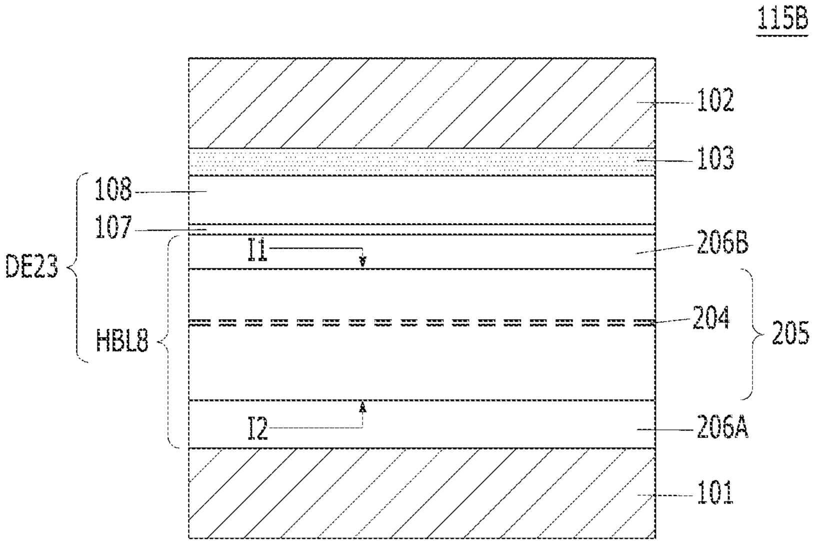

Referring to FIG. 8B, a capacitor 115B may be similar to the capacitor 115A of FIG. 8A. Hereinafter, detailed descriptions of the duplicate components may be omitted.

The capacitor 115B may include a first electrode 101, a dielectric layer stack DE23, a second electrode 102, and a thermal source layer 103 disposed between the dielectric layer stack DE23 and the second electrode 102. The dielectric layer stack DE23 may include a hafnium oxide-based dielectric layer HBL8 and a leakage blocking layer 107 formed on the hafnium oxide-based dielectric layer. The dielectric layer stack DE23 may further include an interface control layer 108 disposed between the leakage blocking layer 107 and the thermal source layer 103.

Figure 8C:
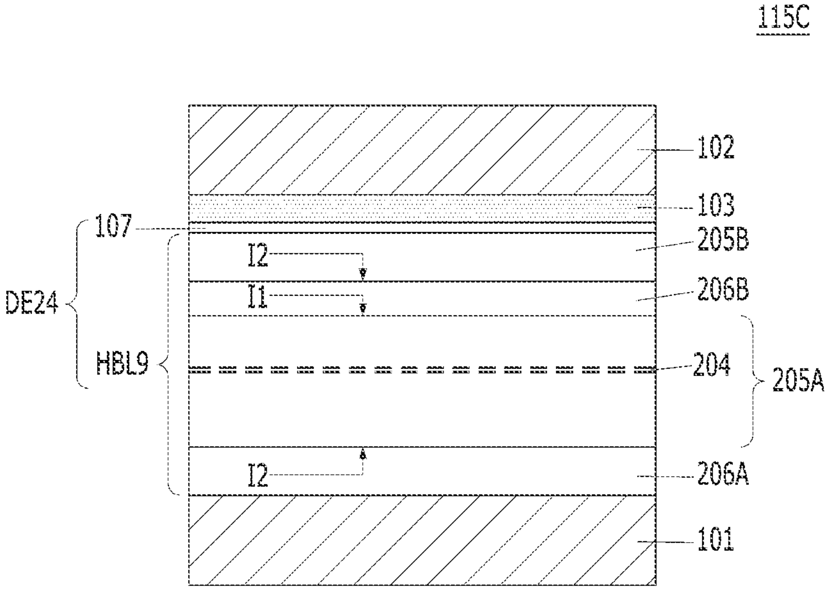

Referring to FIG. 8C, a capacitor 115C may be similar to the capacitor 115A of FIG. 8A. Hereinafter, detailed descriptions of the duplicate components may be omitted.

The capacitor 115C may include a first electrode 101, a dielectric layer stack DE24, a second electrode, and a thermal source layer 103 disposed between the dielectric layer stack and the second electrode 102. The dielectric layer stack DE24 may include a hafnium oxide-based dielectric layer HBL9 and a leakage blocking layer 107 formed on the hafnium oxide-based dielectric layer.

The hafnium oxide-based dielectric layer HBL9 may include a first seed layer 206A, a first hafnium oxide layer 205A, a doping layer 204, a second seed layer 206B and a second hafnium oxide layer 205B. The second hafnium oxide layer 205B may be located between the second seed layer 206B and the leakage blocking layer 107. A directly-contacted interface I2 may be located in the stack between the first seed layer 206A and the first hafnium oxide layer 205A. A directly-contacted interface I1 may be located in the stack between the first hafnium oxide layer 205A and the second seed layer 206B. A directly-contacted interface I2 may be located in the stack between the second seed layer 206B and the second hafnium oxide layer 205B.

The first hafnium oxide layer 205A and the second hafnium oxide layer 205B may be formed of the same material. The first hafnium oxide layer 205A and the second hafnium oxide layer 205B may have tetragonal crystal structures. The first hafnium oxide layer 205A and the second hafnium oxide layer 205B may include tetragonal hafnium oxide. The first hafnium oxide layer 205A may include tetragonal hafnium oxide in which the doping layer 204 is disposed or embedded, and the second hafnium oxide layer 205B may include undoped tetragonal hafnium oxide. The doping layer 204 is not present in the undoped tetragonal hafnium oxide.

As described above, the doping layer 204 may be disposed within or embedded in the first hafnium oxide layer 205A, but not be formed in the second hafnium oxide layer 205B. The capacitance of the dielectric layer stack DE24 may be greatly increased by the second hafnium oxide layer 205B.

Figure 8D:
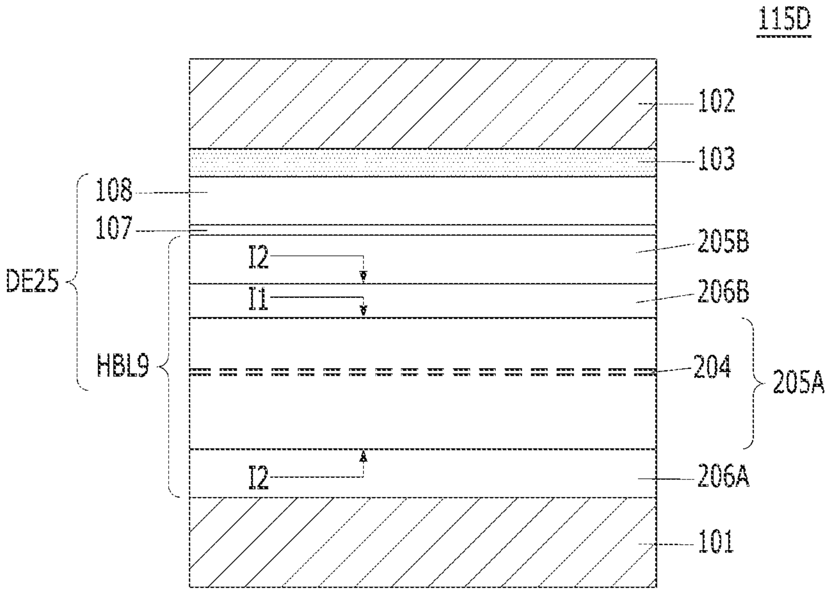

Referring to FIG. 8D, a capacitor 115D may be similar to the capacitor 115C of FIG. 8C except for interface control layer 108. Hereinafter, detailed descriptions of the duplicate components may be omitted.

The capacitor 115D may include a first electrode 101, a dielectric layer stack DE25, a second electrode 102, and a thermal source layer 103 disposed between the dielectric layer stack DE25 and the second electrode 102. The dielectric layer stack DE25 may include a hafnium oxide-based dielectric layer HBL9 and a leakage blocking layer 107 formed on the hafnium oxide-based dielectric layer HBL9.

The hafnium oxide-based dielectric layer HBL9 may include a first seed layer 206A, a first hafnium oxide layer 205A having a doping layer 204 embedded therein, a second seed layer 206B and a second hafnium oxide layer 205B. The dielectric layer stack DE25 may further include the interface control layer 108 disposed between the leakage blocking layer 107 and the thermal source layer 103.

Figure 9A:
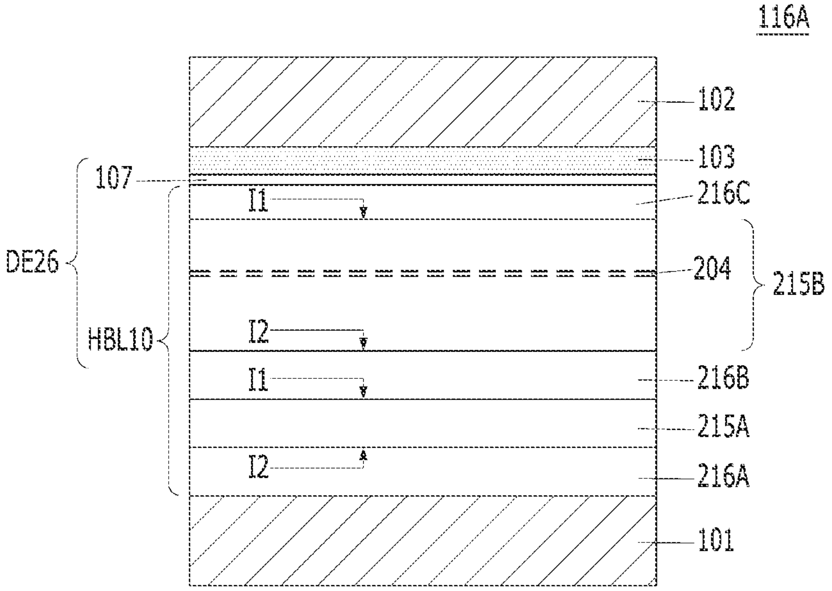

Referring to FIG. 9A, a capacitor 116A may include a first electrode 101, a dielectric layer stack DE26, a second electrode 102, and a thermal source layer 103 disposed between the dielectric layer stack DE26 and the second electrode 102.

The dielectric layer stack DE26 may include a hafnium oxide-based dielectric layer HBL10 and a leakage blocking layer 107 formed on the hafnium oxide-based dielectric layer HBL10.

The hafnium oxide-based dielectric layer HBL10 may include a stack of a first seed layer 216A, a first hafnium oxide layer 215A, a second seed layer 216B, a second hafnium oxide layer 215B having a doping layer 204 embedded therein and a third seed layer 216C.

The first hafnium oxide layer 215A may include undoped tetragonal hafnium oxide. The first hafnium oxide layer 215A may have a smaller thickness than the second hafnium oxide layer 215B.

The first seed layer 216A and the first hafnium oxide layer 215A may be directly contacted with each other. The first seed layer 216A may be directly contacted with the first electrode 101, and the first hafnium oxide layer 215A. The second hafnium oxide layer 215B may be directly contacted with the second seed layer 216B and the third seed layer 216C. The second hafnium oxide layer 215A may be directly contacted with the second seed layer 216B. A directly-contacted interface I2 may be located in the stack between the first seed layer 216A and the first hafnium oxide layer 215A. A directly-contacted interface I1 may be located in the stack between the first hafnium oxide layer 215A and the second seed layer 216B. A directly-contacted interface I2 may be located in the stack between the second seed layer 216B and the second hafnium oxide layer 215B. A directly-contacted interface I1 may be located in the stack between the second hafnium oxide layer 215B and the third seed layer 216C.

Figure 9B:
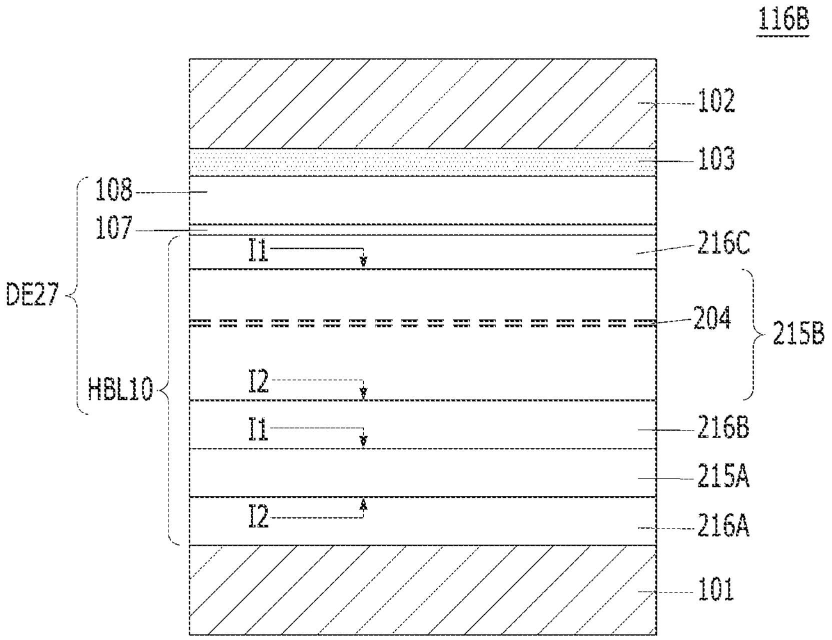

Referring to FIG. 9B, a capacitor 116B may be similar to the capacitor 116A of FIG. 9A except for the additional interface control layer 108. Hereinafter, detailed descriptions of the duplicate components may be omitted.

The capacitor 116B may include a first electrode 101, a dielectric layer stack DE27, a second electrode, and a thermal source layer 103 disposed between the dielectric layer stack DE27 and the second electrode 102. The dielectric layer stack DE27 may include a hafnium oxide-based dielectric layer HBL10 and a leakage blocking layer 107 formed on the hafnium oxide-based dielectric layer HBL10. The hafnium oxide-based dielectric layer HBL10 may include a stack of a first seed layer 216A, a first hafnium oxide layer 215A, a second seed layer 216B, a second hafnium oxide layer 215B, a doping layer 204 and a third seed layer 216C. The dielectric layer stack DE27 may further include an interface control layer 108 disposed between the leakage blocking layer 107 and the thermal source layer 103.

Figure 9C:
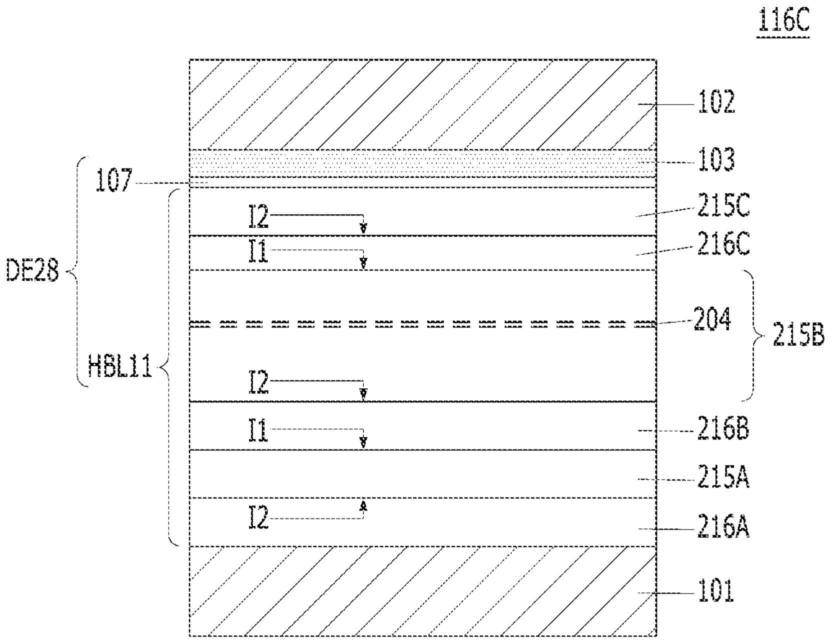

Referring to FIG. 9C, a capacitor 116C may be similar to the capacitor 116A of FIG. 9A except for the additional third hafnium oxide layer 215C. Hereinafter, detailed descriptions of the duplicate components may be omitted.

The capacitor 116C may include a first electrode 101, a dielectric layer stack DE28, a second electrode 102, and a thermal source layer 103 disposed between the dielectric layer stack DE28 and the second electrode 102. The dielectric layer stack DE28 may include a hafnium oxide-based dielectric layer HBL11 and a leakage blocking layer 107 formed on the hafnium oxide-based dielectric layer HBL11. The hafnium oxide-based dielectric layer HBL11 may include a stack of a first seed layer 216A, a first hafnium oxide layer 215A, a second seed layer 216B, a second hafnium oxide layer 215B having a doping layer 204 embedded therein, a third seed layer 216C and a third hafnium oxide layer 215C. The third hafnium oxide layer 215C may be located between the third seed layer 216C and the leakage blocking layer 107.

A directly-contacted interface I2 may be located in the stack between the first seed layer 216A and the first hafnium oxide layer 215A. A directly-contacted interface I1 may be located in the stack between the first hafnium oxide layer 215A and the second seed layer 216B. A directly-contacted interface I2 may be located in the stack between the second seed layer 216B and the second hafnium oxide layer 215B. A directly-contacted interface I1 may be located in the stack between the second hafnium oxide layer 215B and the third seed layer 216C. A directly-contacted interface I2 may be located in the stack between the third seed layer 216C and the third hafnium oxide layer 215C.

The first hafnium oxide layer 215A, the second hafnium oxide layer 215B and the third hafnium oxide layer 215C may be formed of the same material. The first hafnium oxide layer 215A, the second hafnium oxide layer 215B and the third hafnium oxide layer 215C may have tetragonal crystal structures. The first hafnium oxide layer 215A, the second hafnium oxide layer 215B and the third hafnium oxide layer 215C may include tetragonal hafnium oxide. The first and third hafnium oxide layers 215A and 215C may include undoped tetragonal hafnium oxide. The doping layer 204 is not present in the undoped tetragonal hafnium oxide.

As described above, the doping layer 204 may be disposed within or embedded in the second hafnium oxide layer 215B, but not be formed in the first hafnium oxide layer 215A and the third hafnium oxide layer 215C. The capacitance of the dielectric layer stack DE28 may be greatly increased by the third hafnium oxide layer 215C.

Figure 9D:
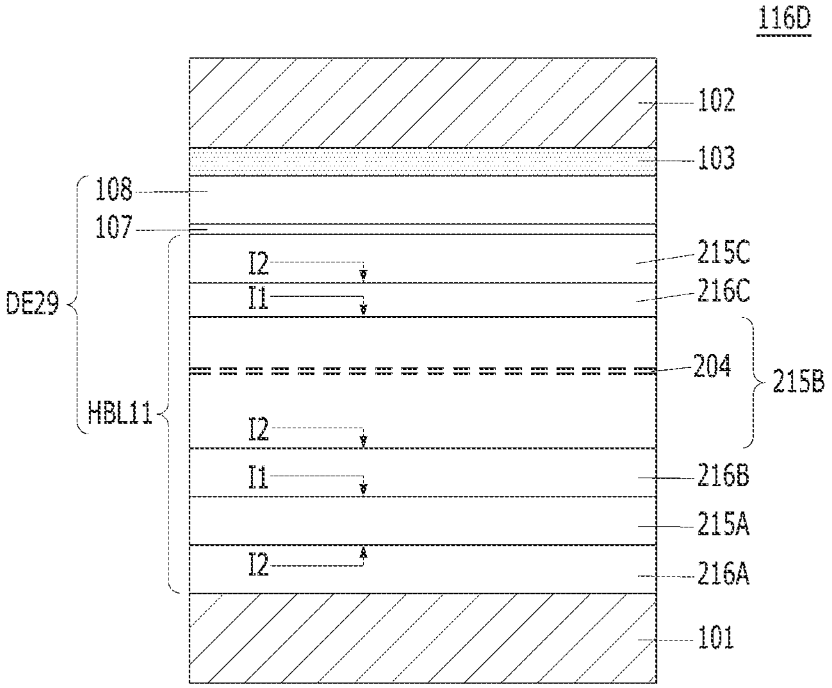

Referring to FIG. 9D, a capacitor 116D may be similar to the capacitor 116C of FIG. 9C except for the additional interface control layer 108. Hereinafter, detailed descriptions of the duplicate components may be omitted.

The capacitor 116D may include a first electrode 101, a dielectric layer stack DE29, a second electrode 102, and a thermal source layer 103 disposed between the dielectric layer stack DE29 and the second electrode 102. The dielectric layer stack DE29 may include a hafnium oxide-based dielectric layer HBL11 and a leakage blocking layer 107 formed on the hafnium oxide-based dielectric layer. The hafnium oxide-based dielectric layer HBL11 may include a stack of a first seed layer 216A, a first hafnium oxide layer 215A, a second seed layer 216B, a second hafnium oxide layer 215B having a doping layer 204 embedded therein, a third seed layer 216C and a third hafnium oxide layer 215C. The third hafnium oxide layer 215C may be located between the third seed layer 216C and the leakage blocking layer 107.

The dielectric layer stack DE29 may further include an interface control layer 108 disposed between the leakage blocking layer 107 and the thermal source layer 103.

Figure 10A:
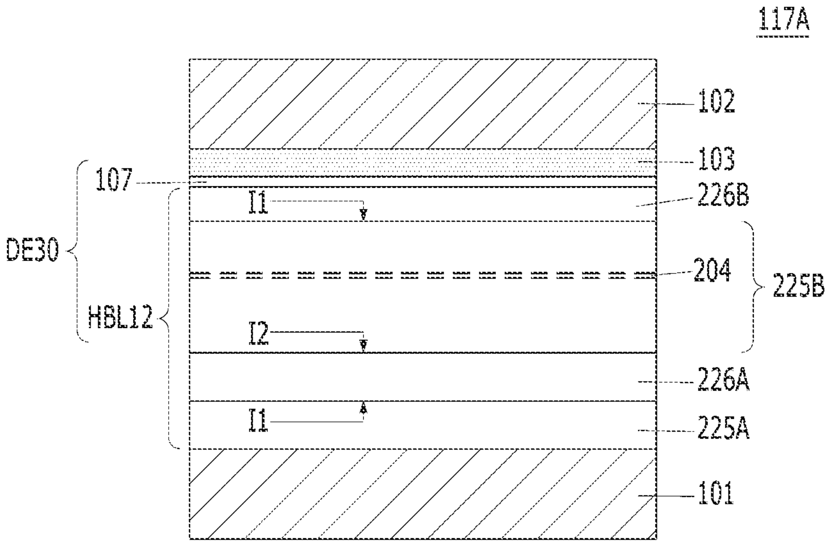

Referring to FIG. 10A, a capacitor 117A may include a first electrode 101, a dielectric layer stack DE30, a second electrode 102, and a thermal source layer 103 disposed between the dielectric layer stack DE30 and the second electrode 102. The dielectric layer stack DE30 may include a hafnium oxide-based dielectric layer HBL12 and a leakage blocking layer 107 formed on the hafnium oxide-based dielectric layer HBL12. The hafnium oxide-based dielectric layer HBL12 may include a first hafnium oxide layer 225A, a first seed layer 226A, a second hafnium oxide layer 225B and a second seed layer 226B. The first hafnium oxide layer 225A may be located between the first electrode 101 and the first seed layer 226A.

A directly-contacted interface I1 may be located in the stack between the first hafnium oxide layer 225A and the first seed layer 226A. A directly-contacted interface I2 may be located in the stack between the first seed layer 226A and the second hafnium oxide layer 225B. A directly-contacted interface I1 may be located in the stack between the second hafnium oxide layer 225B and the second seed layer 226B.

The first hafnium oxide layer 225A and the second hafnium oxide layer 225B may be formed of the same material. The first hafnium oxide layer 225A and the second hafnium oxide layer 225B may have tetragonal crystal structures. The first hafnium oxide layer 225A and the second hafnium oxide layer 225B may include tetragonal hafnium oxide. The first hafnium oxide layer 225A may include undoped tetragonal hafnium oxide. The doping layer 204 is not present in the undoped tetragonal hafnium oxide.

The doping layer 204 may be disposed within or embedded in the second hafnium oxide layer 225B, but may not be formed in the first hafnium oxide layer 225A. The second hafnium oxide layer 225B may have a larger thickness than the first hafnium oxide layer 225A.

Figure 10B:
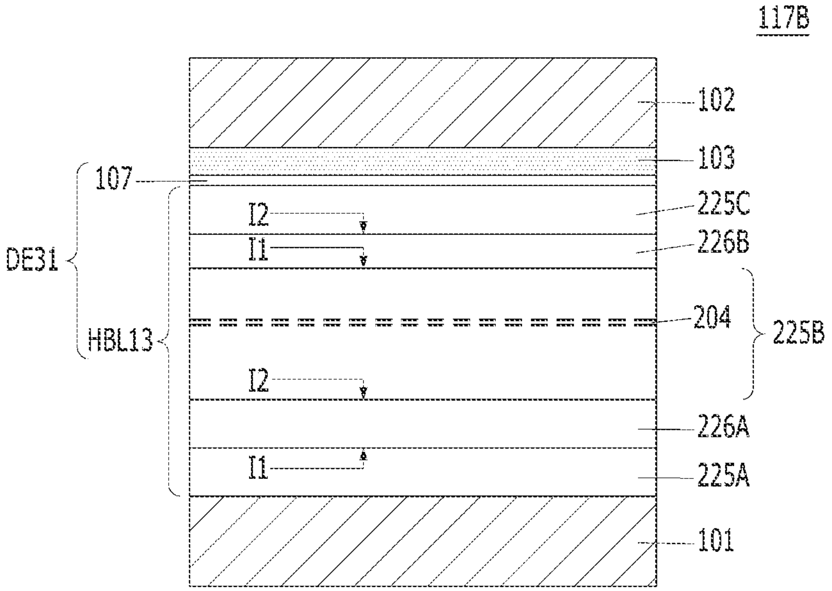

Referring to FIG. 10B, a capacitor 117B may be similar to the capacitor 117A of FIG. 10A except for the third hafnium oxide layer 225C. Hereinafter, detailed descriptions of the duplicate components may be omitted.

The capacitor 117B may include a first electrode 101, a dielectric layer stack DE31, a second electrode, and a thermal source layer 103 disposed between the dielectric layer stack DE31 and the second electrode 102. The dielectric layer stack DE31 may include a hafnium oxide-based dielectric layer HBL13 and a leakage blocking layer 107 formed on the hafnium oxide-based dielectric layer. The hafnium oxide-based dielectric layer HBL13 may include a first hafnium oxide layer 225A, a first seed layer 226A, a second hafnium oxide layer 225B, a second seed layer 226B and a third hafnium oxide layer 225C. The third hafnium oxide layer 225C may be located between the second seed layer 226B and the leakage blocking layer 107.

A directly-contacted interface I1 may be located in the stack between the first hafnium oxide layer 225A and the first seed layer 226A. A directly-contacted interface I2 may be located in the stack between the first seed layer 226A and the second hafnium oxide layer 225B. A directly-contacted interface I1 may be located in the stack between the second hafnium oxide layer 225B and the second seed layer 226B. A directly-contacted interface I2 may be located in the stack between the second seed layer 226B and the third hafnium oxide layer 225C.

The first hafnium oxide layer 225A, the second hafnium oxide layer 225B and the third hafnium oxide layer 225C may be formed of the same material. The first hafnium oxide layer 225A, the second hafnium oxide layer 225B and the third hafnium oxide layer 225C may have tetragonal crystal structures. The first hafnium oxide layer 225A, the second hafnium oxide layer 225B and the third hafnium oxide layer 225C may include tetragonal hafnium oxide. The first and third hafnium oxide layers 225A and 225C may include undoped tetragonal hafnium oxide. The doping layer 204 is not present in the undoped tetragonal hafnium oxide.

The doping layer 204 may be disposed within or embedded in the second hafnium oxide layer 225B, but may not be formed in the first and third hafnium oxide layers 225A and 225C.

In some embodiments, the structures of FIGS. 10A and 10B, may further include an interface control layer (not illustrated) between the leakage blocking layer 107 and the thermal source layer 103.

Figure 11A:
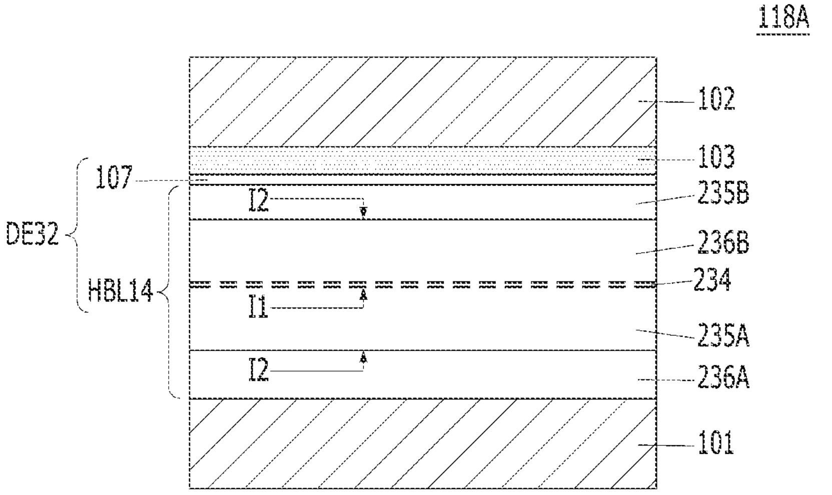

Referring to FIG. 11A, a capacitor 118A may include a first electrode 101, a dielectric layer stack DE32, a second electrode 102, and a thermal source layer 103 disposed between the dielectric layer stack DE32 and the second electrode 102.

The dielectric layer stack DE32 may include a hafnium oxide-based dielectric layer HBL14 and a leakage blocking layer 107 formed on the hafnium oxide-based dielectric layer HBL14. The hafnium oxide-based dielectric layer HBL14 may include a first seed layer 236A, a first hafnium oxide layer 235A, a doping layer 234, a second seed layer 236B and a second hafnium oxide layer 235B. When the first seed layer 236A and the second seed layer 236B include tetragonal zirconium oxide, the first seed layer 236A and the first hafnium oxide layer 235A may be a first Z-H stack, and the second seed layer 236B and the second hafnium oxide layer 235B may be a second Z-H stack. Accordingly, the hafnium oxide-based dielectric layer HBL14 may include the first Z-H stack, the second Z-H stack and the doping layer 234 between the first Z-H stack and the second Z-H stack.

A directly-contacted interface I2 may be located in the stack between the first seed layer 236A and the first hafnium oxide layer 235A. A directly-contacted interface I2 may be located in the stack between the second seed layer 236B and the second hafnium oxide layer 235B. A directly-contacted interface I1 may be located in the stack between the first hafnium oxide layer 235A and the second seed layer 236B.

The doping layer 234 may be located between the first hafnium oxide layer 235A and the second seed layer 236B. In other words, the doping layer 234 may not separate crystal grains of the first hafnium oxide layer 235A and crystal grains of the second seed layer 236B. The first hafnium oxide layer 235A and the second seed layer 236B may have the same thickness, and the doping layer 234 may have a substantially smaller thickness than the first hafnium oxide layer 235A and the second seed layer 236B.

The doping layer 234 may be disposed within or embedded in the second seed layer 236B. In other words, the doping layer 234 may be disposed within or embedded in the lowermost surface of the second seed layer 236B that is contacted with the first hafnium oxide layer 235A. The doping layer 234 may be contacted with the directly-contacted interface I1 to be embedded in the second seed layer 236B. The doping layer 234 may be aluminum-doped tetragonal zirconium oxide or beryllium-doped tetragonal zirconium oxide.

In some embodiments, the doping layer 234 may be disposed within or embedded in the uppermost surface of the first hafnium oxide layer 235A. Accordingly, the doping layer 234 may be aluminum-doped tetragonal hafnium oxide or beryllium-doped tetragonal hafnium oxide. The doping layer 234 may be contacted with the directly-contacted interface I1 to be embedded in the first hafnium oxide layer 235A.

Figure 11B:
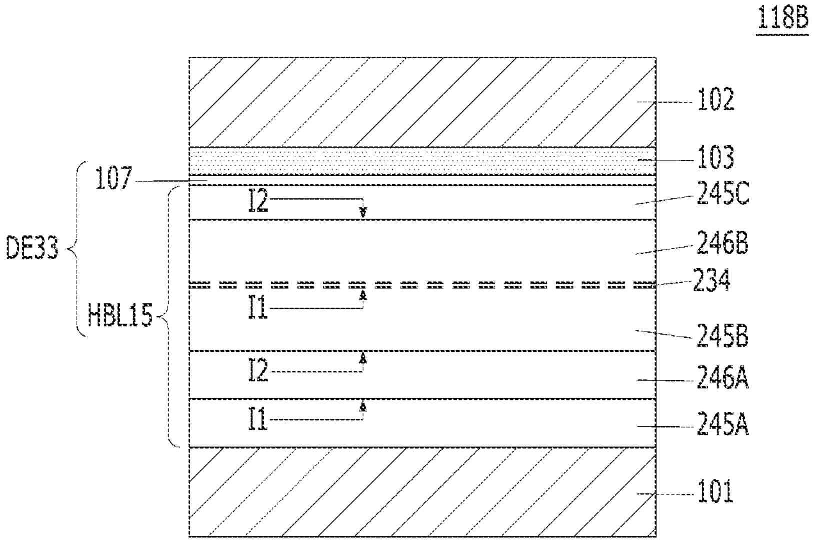

Referring to FIG. 11B, a capacitor 118B may include a first electrode 101, a dielectric layer stack DE33, a second electrode, and a thermal source layer 103 disposed between the dielectric layer stack DE33 and the second electrode 102.

The dielectric layer stack DE33 may include a hafnium oxide-based dielectric layer HBL15 and a leakage blocking layer 107 formed on the hafnium oxide-based dielectric layer HBL15. The hafnium oxide-based dielectric layer HBL15 may include a first hafnium oxide layer 245A, a first seed layer 246A, a second hafnium oxide layer 245B, a doping layer 234, a second seed layer 246B and a third hafnium oxide layer 245C. When the first seed layer 246A and the second seed layer 246B include tetragonal zirconium oxide, the first seed layer 246A and the second hafnium oxide layer 245B may be a first Z-H stack, and the second seed layer 246B and the third hafnium oxide layer 245C may be a second Z-H stack. Accordingly, the hafnium oxide-based dielectric layer HBL15 may include the first hafnium oxide layer 245A, the first Z-H stack, the second Z-H stack and the doping layer 234 between the first Z-H stack and the second Z-H stack.

A directly-contacted interface I1 may be located in the stack between the first hafnium oxide layer 245A and the first seed layer 246A. A directly-contacted interface I2 may be located in the stack between the first seed layer 246A and the second hafnium oxide layer 245B. A directly-contacted interface I2 may be located in the stack between the second seed layer 246B and the third hafnium oxide layer 245C. A directly-contacted interface I1 may be located in the stack between the second hafnium oxide layer 245B and the second seed layer 246B.

The first hafnium oxide layer 245A may be located between the first electrode 101 and the first seed layer 246A.

The doping layer 234 may be located between the second hafnium oxide layer 245B and the second seed layer 246B. In other words, the doping layer 234 may not separate crystal grains of the second hafnium oxide layer 245B and crystal grains of the second seed layer 246B.

The doping layer 234 may be disposed within or embedded in the second seed layer 246B. In other words, the doping layer 234 may be disposed within or embedded in the lowermost surface of the second seed layer 246B that is contacted with the second hafnium oxide layer 245A. Accordingly, the doping layer 234 may be aluminum-doped tetragonal zirconium oxide or beryllium-doped tetragonal zirconium oxide.

In some embodiments, the doping layer 234 may be disposed within or embedded in the uppermost surface of the second hafnium oxide layer 245B. Accordingly, the doping layer 234 may be aluminum-doped tetragonal hafnium oxide or beryllium-doped tetragonal hafnium oxide.

Figure 11C:
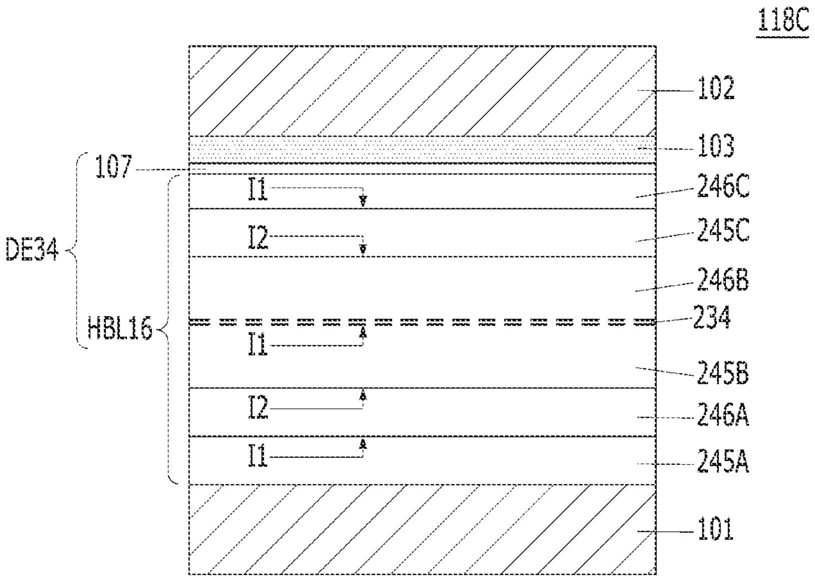

Referring to FIG. 11C, a capacitor 118C may include a first electrode 101, a dielectric layer stack DE34, a second electrode 102, and a thermal source layer 103 disposed between the dielectric layer stack DE34 and the second electrode 102.

The dielectric layer stack DE34 may include a hafnium oxide-based dielectric layer HBL16 and a leakage blocking layer 107 formed on the hafnium oxide-based dielectric layer HBL16. The hafnium oxide-based dielectric layer HBL16 may include a first hafnium oxide layer 245A, a first seed layer 246A, a second hafnium oxide layer 245B, a doping layer 234, a second seed layer 246B, a third hafnium oxide layer 245C and a third seed layer 246C. When the first to third seed layers 246A, 246B and 246C include tetragonal zirconium oxide, the first seed layer 246A and the second hafnium oxide layer 245B may be a first Z-H stack, and the second seed layer 246B and the third hafnium oxide layer 245C may be a second Z-H stack. Accordingly, the hafnium oxide-based dielectric layer HBL16 may include a stack of the first hafnium oxide layer 245A, the first Z-H stack, the doping layer 234, the second Z-H stack and the third seed layer 246C.

A directly-contacted interface I1 may be located in the stack between the first hafnium oxide layer 245A and the first seed layer 246A. A directly-contacted interface I2 may be located in the stack between the first seed layer 246A and the second hafnium oxide layer 245B. A directly-contacted interface I2 may be located in the stack between the second seed layer 246B and the third hafnium oxide layer 245C. A directly-contacted interface I1 may be located in the stack between the third hafnium oxide layer 245C and the third seed layer 246C. A directly-contacted interface I1 may be located in the stack between the second hafnium oxide layer 245B and the second seed layer 246B.

The third seed layer 246C may be located between the third hafnium oxide layer 245C and the leakage blocking layer 107.

The doping layer 234 may be located between the second hafnium oxide layer 245B and the second seed layer 2468. In other words, the doping layer 234 may not separate crystal grains of the second hafnium oxide layer 245B and crystal grains of the second seed layer 246B.

The doping layer 234 may be disposed within or embedded in the second seed layer 246B. In other words, the doping layer 234 may be disposed within or embedded in the lowermost surface of the second seed layer 246B that is contacted with the second hafnium oxide layer 245A. Accordingly, the doping layer 234 may be aluminum-doped tetragonal zirconium oxide or beryllium-doped tetragonal zirconium oxide.

In some embodiments, the doping layer 234 may be disposed within or embedded in the uppermost surface of the second hafnium oxide layer 245B. Accordingly, the doping layer 234 may be aluminum-doped tetragonal hafnium oxide or beryllium-doped tetragonal hafnium oxide.

In some embodiments, the structures of FIGS. 11A to 11D may further include an interface control layer (not illustrated) formed between the leakage blocking layer 107 and the thermal source layer 103.

Figure 12A:
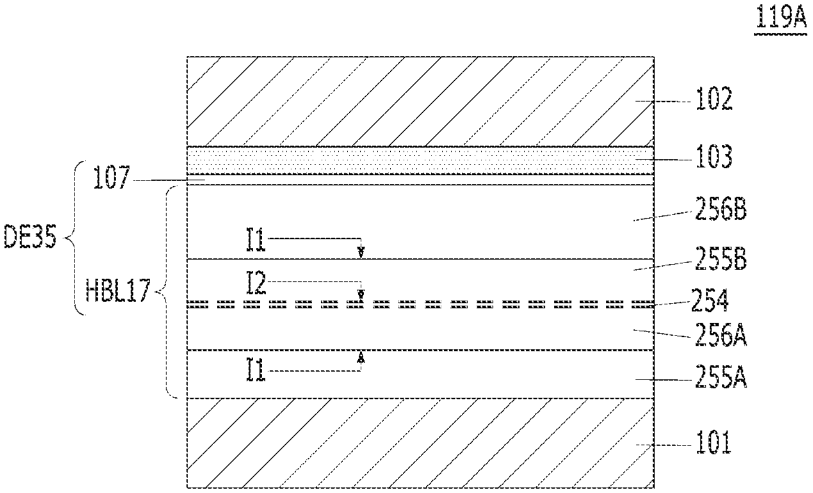

Referring to FIG. 12A, a capacitor 119A may include a first electrode 101, a dielectric layer stack DE35, a second electrode 102, and a thermal source layer 103 disposed between the dielectric layer stack DE35 and the second electrode 102.

The dielectric layer stack DE35 may include a hafnium oxide-based dielectric layer HBL17 and a leakage blocking layer 107 formed on the hafnium oxide-based dielectric layer HBL17. The hafnium oxide-based dielectric layer HBL17 may include a first hafnium oxide layer 255A, a first seed layer 256A, a doping layer 254, a second hafnium oxide layer 255B and a second seed layer 256B. When the first and second seed layers 256A and 256B include tetragonal zirconium oxide, the first hafnium oxide layer 255A and the first seed layer 256A may be a first H-Z stack, and the second hafnium oxide layer 255B and the second seed layer 256B may be a second H-Z stack. Accordingly, the hafnium oxide-based dielectric layer HBL17 may include the first H-Z stack, the second H-Z stack and the doping layer 254 between the first H-Z stack and the second H-Z stack.

A directly-contacted interface I1 may be located in the stack between the first hafnium oxide layer 255A and the first seed layer 256A. A directly-contacted interface I1 may be located in the stack between the second hafnium oxide layer 255B and the second seed layer 256B. A directly-contacted interface I2 may be located in the stack between the first seed layer 256A and the second hafnium oxide layer 255B.

The doping layer 254 may be located between the first seed layer 256A and the second hafnium oxide layer 255B. In other words, the doping layer 254 may not separate crystal grains of the first seed layer 256A and crystal grains of the second hafnium oxide layer 255B. The first seed layer 256A and the second hafnium oxide layer 255B may have the same thickness, and the doping layer 254 may have a substantially smaller thickness than the first seed layer 256A and the second hafnium oxide layer 255B.

The doping layer 254 may be disposed within or embedded in the first seed layer 256A. In other words, the doping layer 254 may be disposed within or embedded in the uppermost surface of the first seed layer 256A that is contacted with the second hafnium oxide layer 255B. Accordingly, the doping layer 254 may be aluminum-doped tetragonal zirconium oxide or beryllium-doped tetragonal zirconium oxide.

In some embodiments, the doping layer 254 may be disposed within or embedded in the lowermost surface of the second hafnium oxide layer 255B. Accordingly, the doping layer 254 may be aluminum-doped tetragonal hafnium oxide or beryllium-doped tetragonal hafnium oxide.

Figure 12B:
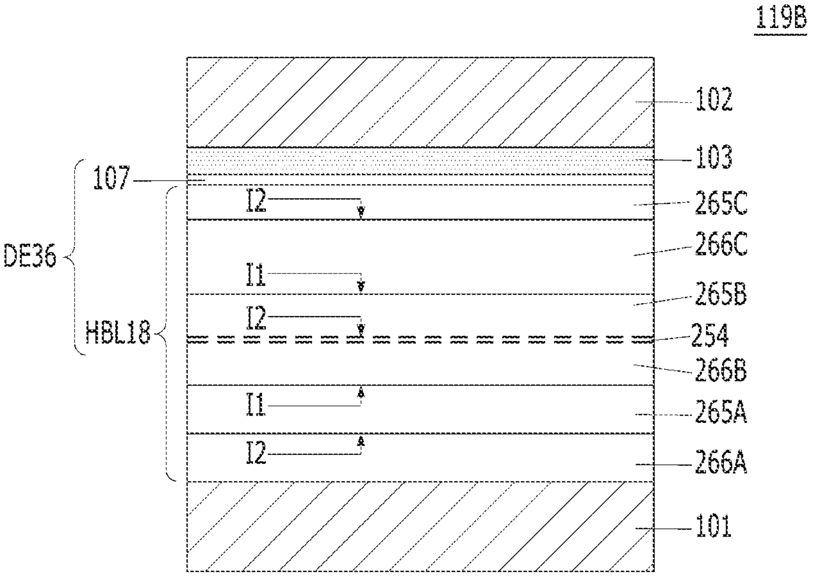

Referring to FIG. 12B, a capacitor 119B may include a first electrode 101, a dielectric layer stack DE36, a second electrode 102, and a thermal source layer 103 disposed between the dielectric layer stack DE36 and the second electrode 102.

The dielectric layer stack DE36 may include a hafnium oxide-based dielectric layer HBL18 and a leakage blocking layer 107 formed on the hafnium oxide-based dielectric layer HBL18. The hafnium oxide-based dielectric layer HBL18 may include a first seed layer 266A, a first hafnium oxide layer 265A, a second seed layer 266B, a doping layer 254, a second hafnium oxide layer 265B, a second seed layer 266C and a third hafnium oxide layer 265C. When the first seed layer 266A, the second seed layer 266B and the third seed layer 266C include tetragonal zirconium oxide, the first hafnium oxide layer 265A and the second seed layer 266B may be a first H-Z stack, and the second hafnium oxide layer 265B and the third seed layer 266C may be a second H-Z stack. Accordingly, the hafnium oxide-based dielectric layer HBL18 may include the first seed layer 266A, the first H-Z stack, the doping layer 254, the second H-Z stack and the third hafnium oxide layer 265C.

A directly-contacted interface I2 may be located in the stack between the first seed layer 266A and the first hafnium oxide layer 265A. A directly-contacted interface I1 may be located in the stack between the first hafnium oxide layer 265A and the second seed layer 266B. A directly-contacted interface I1 may be located in the stack between the second hafnium oxide layer 265B and the third seed layer 266C. A directly-contacted interface I2 may be located in the stack between the second seed layer 266C and the third hafnium oxide layer 265C. A directly-contacted interface I2 may be located in the stack between the second seed layer 266B and the second hafnium oxide layer 265B.

The doping layer 254 may be located between the first seed layer 256A and the second hafnium oxide layer 255B. In other words, the doping layer 254 may not separate crystal grains of the first seed layer 256A and crystal grains of the second hafnium oxide layer 255B.

The doping layer 254 may be disposed within or embedded in the second seed layer 266B. In other words, the doping layer 254 may be disposed within or embedded in the top surface of the second seed layer 266B that is contacted with the second hafnium oxide layer 265B. Accordingly, the doping layer 254 may be aluminum-doped tetragonal zirconium oxide or beryllium-doped tetragonal zirconium oxide.

In some embodiments, the doping layer 254 may be disposed within or embedded in the bottom surface of the second hafnium oxide layer 265B. Accordingly, the doping layer 254 may be aluminum-doped tetragonal hafnium oxide or beryllium-doped tetragonal hafnium oxide.

In some embodiments, the structures of FIGS. 12A and 12B may further include an interface control layer (not illustrated) formed between the leakage blocking layer 107 and the thermal source layer 103.

Figure 13A:
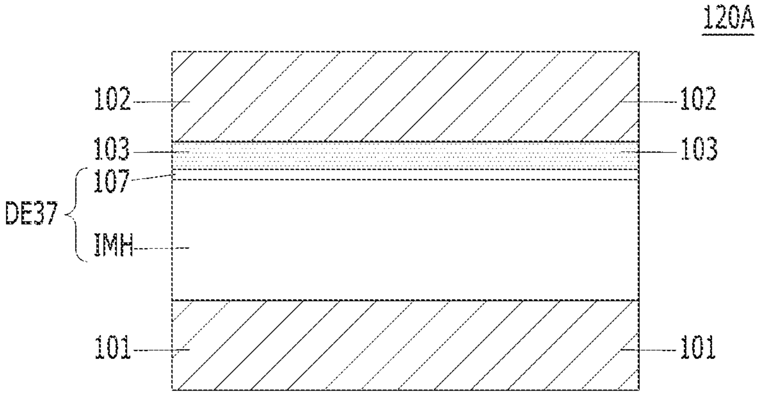

Referring to FIG. 13A, a capacitor 120A may include a first electrode 101, a dielectric layer stack DE37, a second electrode 102, and a thermal source layer 103 disposed between the dielectric layer stack DE37 and the second electrode 102.

The dielectric layer stack DE37 may include an intermixed material IMH and a leakage blocking layer 107 formed on the intermixed material IMH. The intermixed material IMH may be a compound in which a tetragonal hafnium oxide layer and a seed layer are intermixed, as a hafnium oxide-based dielectric layer. For example, the intermixed material IMH may include hafnium zirconium oxide ($Hf_xZr_{1-x}O$, x=0.1 to 0.9) in which tetragonal hafnium oxide and tetragonal zirconium oxide are intermixed. The intermixed material IMH may have a pure tetragonal crystal structure.

In an embodiment, the dielectric layer stack DE37 of FIG. 13A may further include an interface control layer (not illustrated) formed between the leakage blocking layer 107 and the thermal source layer 103. The interface control layer may correspond to the interface control layer 108 shown in the above-described embodiments.

Figure 13B:
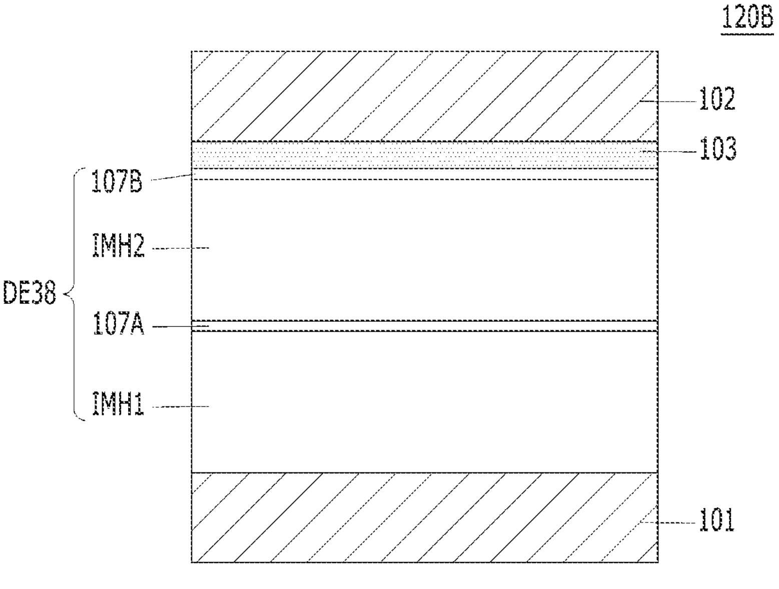

Referring to FIG. 13B, a capacitor 120B may include a first electrode 101, a dielectric layer stack DE38, a second electrode 102, and a thermal source layer 103 disposed between the dielectric layer stack DE38 and the second electrode 102.

The dielectric layer stack DE38 may include a first intermixed material IMH1 and a second intermixed material IMH2. Each of the first and second intermixed materials IMH1 and IMH2 may be a compound in which a tetragonal hafnium oxide layer and a seed layer are intermixed. For example, each of the first and second intermixed materials IMH1 and IMH2 may include hafnium zirconium oxide ($Hf_xZr_{1-x}O$, x=0.1 to 0.9) in which a tetragonal hafnium oxide layer and tetragonal zirconium oxide are intermixed. The first and second intermixed materials IMH1 and IMH2 may have pure tetragonal crystal structures.

The dielectric layer stack DE38 may further include a first leakage blocking layer 107A between the first intermixed material IMH1 and the second intermixed material IMH2. The dielectric layer stack DE38 may further include a second leakage blocking layer 107B between the second intermixed material IMH2 and the thermal source layer 103. The first and second leakage blocking layers 107A and 107B may be formed of the same material. The first and second leakage blocking layers 107A and 107B may have substantially smaller thicknesses than the first and second intermixed materials IMH1 and IMH2. Each of the first and second leakage blocking layers 107A and 107B may include an aluminum-containing material or a beryllium-containing material.

In an embodiment, the dielectric layer stack DE38 of FIG. 13B may further include an interface control layer (not illustrated) between the second leakage blocking layer 107B and the thermal source layer 103. The interface control layer may correspond to the interface control layer 108 in the above-described embodiments.

Figure 14A:
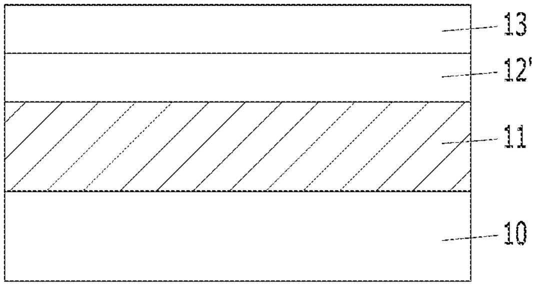
FIGS. 14A and 14B are cross-sectional views illustrating a method for forming a capacitor.
Figure 14B:
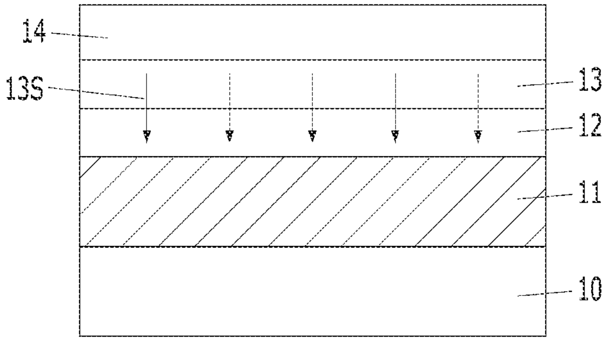

FIGS. 14A and 14B are cross-sectional views illustrating an example of a method for forming a capacitor.

Referring to FIG. 14A, a first electrode 11 may be formed on a substrate 10, and an initial hafnium oxide layer 12' may be formed on the first electrode 11. The initial hafnium oxide layer 12' may be deposited by a first atomic layer deposition (ALD) process. For example, the deposition process may be performed on the initial hafnium oxide layer 12' after the substrate 10 having the first electrode 11 formed thereon is loaded into an atomic layer deposition chamber.

The initial hafnium oxide layer 12' may include an amorphous structure, a mono-clinic crystal structure or a mixed crystal structure in which the amorphous structure and the mono-clinic crystal structure are mixed evenly or unevenly.

As described above, the initial hafnium oxide layer 12' may be formed to have a non-tetragonal crystal structure.

Subsequently, a seed layer 13 may be formed on the initial hafnium oxide layer 12'. The seed layer 13 may include zirconium oxide. The seed layer 13 may be formed by a second ALD process. The seed layer 13 may have a larger thickness than the initial hafnium oxide layer 12'. As described in the above embodiments, a doping layer may be embedded in the seed layer 13 or not.

After the seed layer 13 is formed, the initial hafnium oxide layer 12' may maintain the initial crystal structure without phase transition. Depending on a deposition temperature of the seed layer 13, the initial hafnium oxide layer 12' may not be crystallized into a tetragonal crystal structure.

As illustrated in FIG. 14B, a thermal source layer 14 may be formed on the seed layer 13. The thermal source layer 14 may be formed at a temperature at which the initial hafnium oxide layer 12' can be crystallized into the tetragonal crystal structure. The thermal source layer 14 may carry a thermal energy adequate to provide the phase transition of the initial hafnium oxide layer 12'. The thermal source layer 14 may be formed by a third ALD process at a low temperature of approximately 500° C. or lower. For example, when the thermal source layer 14 is deposited, a low temperature thermal energy may be provided to the substrate 10, and the initial hafnium oxide layer 12' may be crystallized into the tetragonal crystal structure because of the presence of the seed layer 13 and the low temperature thermal energy provided to the substrate 10. The seed layer 13 may also be crystallized into the tetragonal crystal structure by the low temperature thermal energy provided to the substrate 10.

Although not illustrated, a second electrode may be formed on the thermal source layer 14 after the thermal source layer 14 is formed.

Figure 15A:
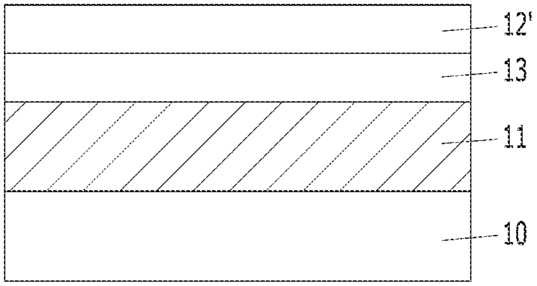
FIGS. 15A and 15B are cross-sectional views illustrating another method for forming a capacitor.
Figure 15B:
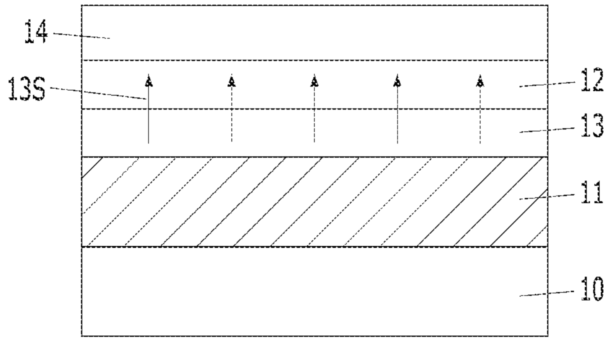

FIGS. 15A and 15B are cross-sectional views illustrating another example of a method for forming a capacitor.

Referring to FIG. 15A, a first electrode 11 may be formed on a substrate 10, a seed layer 13 may be formed on the first electrode 11, and the seed layer 13 may be deposited by a first atomic layer deposition (ALD). For example, after the substrate 10 having the first electrode 11 formed thereon is loaded into an atomic layer deposition chamber, a deposition process may be performed on the seed layer 13. The seed layer 13 may be made of or include tetragonal zirconium oxide.

An initial hafnium oxide layer 12' may be formed on the seed layer 13. The initial hafnium oxide layer 12' may be deposited by a second ALD process. The initial hafnium oxide layer 12' may include an amorphous structure, a mono-clinic crystal structure or a mixed crystal structure in which the amorphous structure and the mono-clinic crystal structure are evenly or unevenly mixed.

As described above, the initial hafnium oxide layer 12' may be formed to have a non-tetragonal crystal structure.

Although the initial hafnium oxide layer 12' is deposited on the seed layer 13, the initial hafnium oxide layer 12' may maintain the initial crystal structure without phase transition. The seed layer 13 may have a larger thickness than the initial hafnium oxide layer 12'. As described in the above embodiments, a doping layer may be disposed within or embedded in the seed layer 13 or not.

As illustrated in FIG. 15B, a thermal source layer 14 may be formed on the initial hafnium oxide layer 12'. The thermal source layer 14 may be formed at a temperature at which the initial hafnium oxide layer 12' can be crystallized into the tetragonal crystal structure. The thermal source layer 14 may carry a thermal energy to the initial hafnium oxide layer 12' to cause the phase transition of the initial hafnium oxide layer 12'. The thermal source layer 14 may be formed by a second ALD process at a low temperature of approximately 500° C. or lower. For example, a low temperature thermal energy may be provided to the substrate 10 when the thermal source layer 14 is deposited, and the initial hafnium oxide layer 12' may be crystallized into the tetragonal crystal structure because of the presence of the seed layer 13 and the low temperature thermal energy provided to the substrate 10. The seed layer 13 may also be crystallized into the tetragonal crystal structure by the low temperature thermal energy provided to the substrate 10.

Although not illustrated, a second electrode may be formed on the thermal source layer 14 after the thermal source layer 14 is formed.

As illustrated in FIGS. 14A to 15B, when the thermal source layer 14 is formed, the initial hafnium oxide layer 12' may be crystallized into a tetragonal hafnium oxide layer 12 while the crystallization of the initial hafnium oxide layer 12' is promoted (refer to reference numeral "13S") by the seed layer 13.

The crystallization degree of the hafnium oxide layer 12 may depend on the thickness of the thermal source layer 14. The thermal source layer 14 may have a thickness, for example, ranging from 20 Å to 60 Å.

As described above, when the thermal source layer 14 is deposited, the initial hafnium oxide layer 12' may be sufficiently crystallized into the tetragonal crystal structure by the seed layer 13.

A stack of the seed layer 13 and the initial hafnium oxide layer 12' may be obtained by various methods. For example, a single seed layer 13 may be formed between two initial hafnium oxide layers 12'. A single initial hafnium oxide layer 12' may be formed between two seed layers 13. A plurality of seed layers 13 and a plurality of initial hafnium oxide layers 12' may be alternately stacked.

Figure 16A:
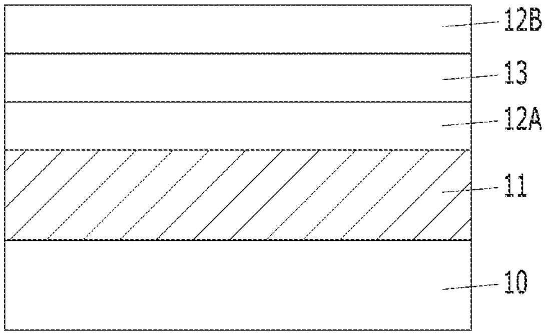
FIGS. 16A and 16B are cross-sectional views illustrating another method for forming a capacitor.
Figure 16B:
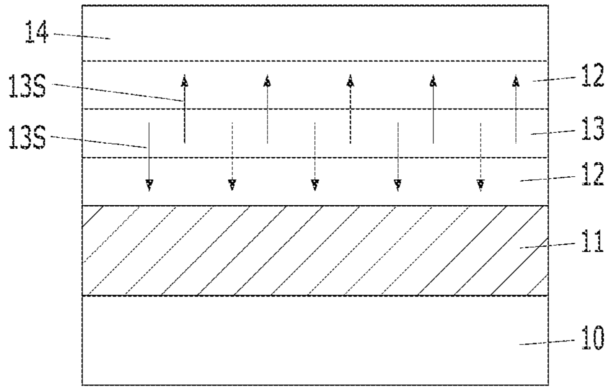

FIGS. 16A and 16B are cross-sectional views illustrating yet another example of a method for forming a capacitor.

Referring to 16A, a first electrode 11 may be formed on a substrate 10, and a first initial hafnium oxide layer 12A, a seed layer 13 and a second initial hafnium oxide layer 12B may be sequentially formed on the first electrode 11. The first initial hafnium oxide layer 12A, the seed layer 13 and the second initial hafnium oxide layer 12B may be deposited by atomic layer deposition (ALD). For example, after the substrate 10 having the first electrode 11 formed thereon is loaded into an atomic layer deposition chamber, the atomic layer deposition of the first initial hafnium oxide layer 12A, the seed layer 13 and the second initial hafnium oxide layer 12B may be performed sequentially. The seed layer 13 may have a larger thickness than the first and second initial hafnium oxide layers 12A and 12B. As described in the above embodiments, a doping layer may be embedded in the seed layer 13 or not.

The first and second initial hafnium oxide layers 12A and 12B may include an amorphous structure, a mono-clinic crystal structure or a mixed crystal structure in which the amorphous structure and the mono-clinic crystal structure are evenly or unevenly mixed.

As described above, the first and second initial hafnium oxide layers 12A and 12B may be formed to have non-tetragonal crystal structures. The seed layer 13 may have a tetragonal crystal structure.

As illustrated in FIG. 16B, a thermal source layer 14 may be formed on the second initial hafnium oxide layer 12B. The thermal source layer 14 may be formed at a temperature at which the first and second initial hafnium oxide layers 12A and 12B can be crystallized into the tetragonal crystal structure. The thermal source layer 14 may carry a thermal energy adequate to cause phase transition of the first and second initial hafnium oxide layers 12A and 12B. The thermal source layer 14 may be formed by a low temperature ALD of approximately 500° C. or lower. Thus, a low temperature thermal energy may be provided to the substrate 10 when the thermal source layer 14 is deposited, and the first and second initial hafnium oxide layers 12A and 12B may be crystallized into the tetragonal crystal structures by the low temperature thermal energy provided to the substrate 10 and the seed layer 13. The seed layer 13 may also be crystallized into the tetragonal crystal structure by the low temperature thermal energy provided to the substrate 10.

Although not illustrated, a second electrode may be formed on the thermal source layer 14 after the thermal source layer 14 is formed.

As illustrated in FIGS. 16A and 16B, when the thermal source layer 14 is formed, the first and second initial hafnium oxide layers 12A and 12B may be crystallized into tetragonal hafnium oxide layers 12 while the crystallization of the first and second initial hafnium oxide layers 12A and 12B is promoted (refer to reference numeral "13S") by the seed layer 13.

In FIGS. 14A to 16B, the thermal source layer 14 may have high tensile stress. For example, the thermal source layer 14 may have a tensile stress of 0.5 GPa to 2.0 GPa. The high tensile stress may promote the crystallization of the tetragonal hafnium oxide layers 12.

Figure 17A:
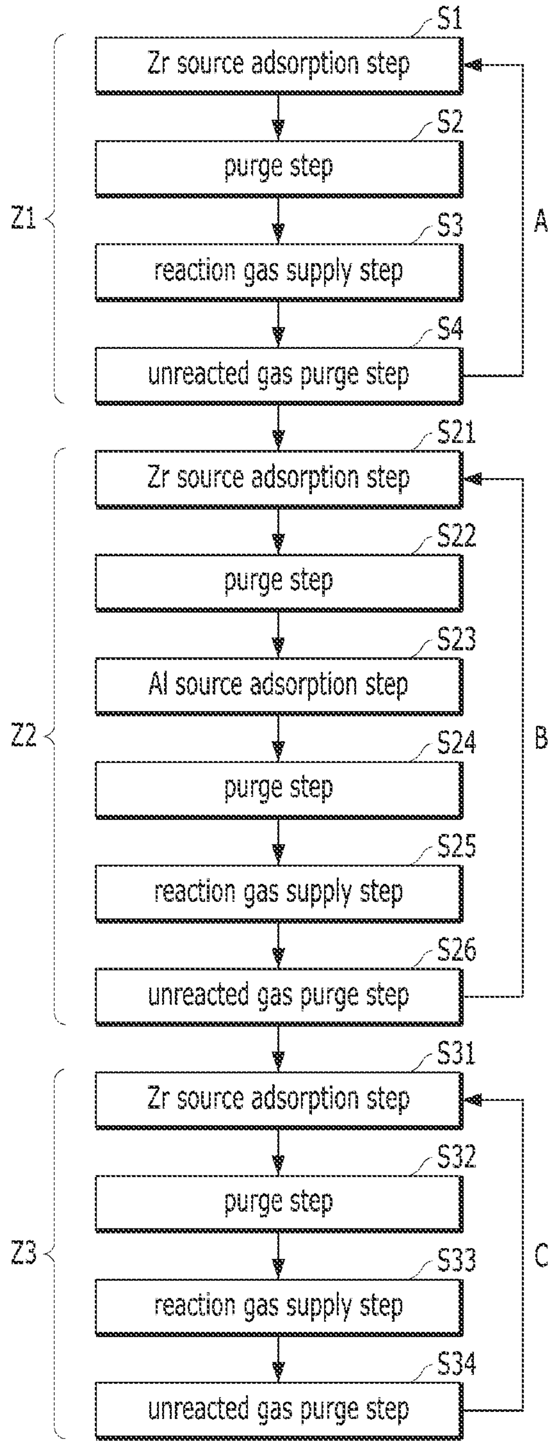
FIGS. 17A and 17B are flowcharts illustrating methods for forming a seed layer shown in FIGS. 14A to 16B.
Figure 17B:
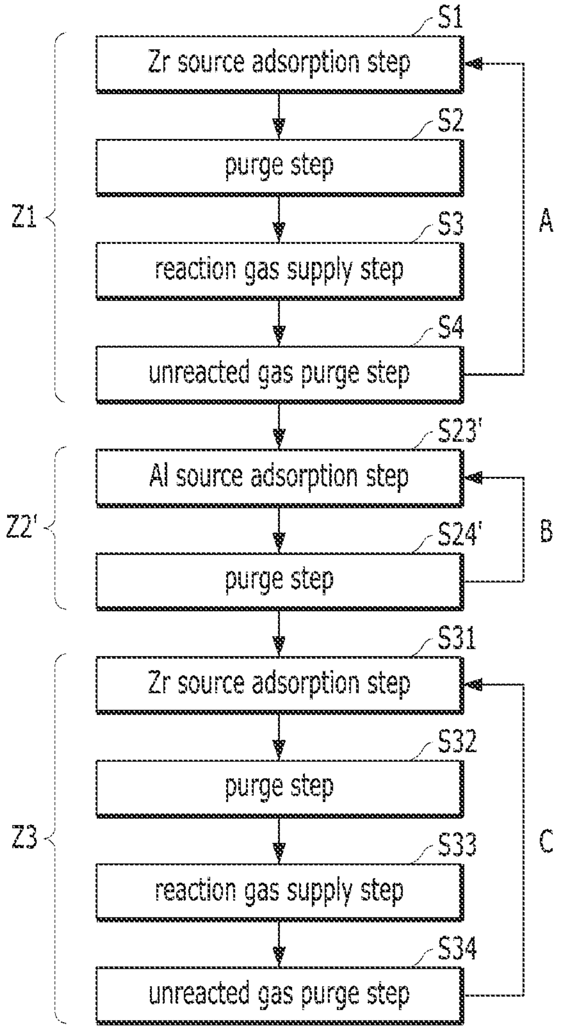

FIGS. 17A and 17B are flowcharts illustrating the examples of the method for forming the seed layer 13 in FIGS. 14A to 16B. The seed layer 13 may be a zirconium oxide layer, and the zirconium oxide layer may be formed by atomic layer deposition (ALD). The seed layer 13 may correspond to the seed layer 106 of FIG. 2B. In other words, a doping layer may be disposed within or embedded in the seed layer 13. The seed layer 13 may include a "Z-AZ-Z stack" in which a first zirconium oxide layer, an aluminum-doped zirconium oxide layer and a second zirconium oxide layer are sequentially stacked. The Z-AZ-Z stack differs from a Z-A-Z stack in which a first zirconium oxide layer, an aluminum oxide layer and a second zirconium oxide layer are sequentially stacked. In the Z-AZ-Z stack, crystal grains of the first zirconium oxide layer and crystal grains of the second zirconium oxide layer are not separated by the aluminum-doped zirconium oxide layer. In the Z-A-Z stack, however, crystal grains of the first zirconium oxide layer and crystal grains of the second zirconium oxide layer are separated by the aluminum oxide layer.

A method for performing atomic layer deposition in the Z-AZ-Z stack may be described with reference to FIG. 17A.

The atomic layer deposition in the Z-AZ-Z stack may be performed by repeating a plurality of cycles at 250° C. to 380° C. The plurality of cycles may include a first cycle Z1 for depositing the first zirconium oxide layer, a second cycle Z2 for depositing the aluminum-doped zirconium oxide layer, and a third cycle Z3 for depositing the second zirconium oxide layer. The first zirconium oxide layer may be deposited by repeating the first cycle Z1 "A" times, the aluminum-doped zirconium oxide layer may be deposited by repeating the second cycle Z2 "B" times, and the second zirconium oxide layer may be deposited by repeating the third cycle Z3 "C" times. Herein, A, B and C may be different natural numbers, and B may be smaller than A and C. For example, B may range from 1 to 10, and A and C may be greater than 10. At this time, A and C may be set to the same value, in order to deposit the first and second zirconium oxide layers to the same thickness. In some embodiments, C may be set to a higher value than A, in order to deposit the second zirconium oxide layer to a larger thickness than the first zirconium oxide layer.

The first cycle Z1, the second cycle Z2 and the third cycle Z3 may be performed at 250° C. to 380° C., whereby the seed layer 103 having the tetragonal crystal structure may be easily deposited.

The first cycle Z1 may include a Zr source adsorption step S1, a purge step S2, a reaction gas supply step S3 and an unreacted gas purge step S4. The first cycle Z1 may be repeated "A" times. The undoped first zirconium oxide layer may be deposited by the first cycle Z1.

The second cycle Z2 may include a Zr source adsorption step S21, a purge step S22, an Al source adsorption step S23, a purge step S24, a reaction gas supply step S25 and an unreacted gas purge step S26. The second cycle Z2 may be repeated "B" times. The aluminum-doped zirconium oxide layer may be deposited by the second cycle Z2.

The third cycle Z3 may include a Zr source adsorption step S31, a purge step S32, a reaction gas supply step S33 and an unreacted gas purge step S34. The third cycle Z3 may be repeated "C" times. The undoped second zirconium oxide layer may be deposited by the third cycle Z3.

In the first to third cycles Z1 to Z3, the Zr source may include Tetrakis EthylMethylAmino Zirconium (TEMAZ) and Tetrakis DiMethylAmino Zirconium (TDMAZ), the Al source may include Tri Methyl Aluminum (TMA), and the reaction gas may include an oxidizer. The oxidizer may include $O_3$, $O_2$, $H_2O$, $H_2O_2$ and $O_2$ plasma or combinations thereof. When ozone ($O_3$) is used as the oxidizer, the ozone may be supplied at an optimized concentration and flow rate. For example, ozone may be used at a concentration of range of 50 $g/m^3$ to 310 $g/m^3$, and a flow rate range from 100 sccm to 5000 sccm. The purge step may be set to a sufficiently large range of 1 second to 100 seconds.

Through the first to third cycles Z1 to Z3, it is possible to obtain a structure in which aluminum (Al) is doped in the zirconium oxide layer.

Referring to FIG. 17B as another embodiment, a second cycle Z2' may include only an Al source adsorption step S23' and a purge step S24'. For example, after the first zirconium oxide layer is deposited by the first cycle Z1, the Al source adsorption step S23' and the purge step S24' may be repeated a predetermined number of times to deposit aluminum on the surface of the first zirconium oxide layer, and then the third cycle Z3 may be performed to deposit the second zirconium oxide layer. Even when the aluminum is adsorbed in this manner, the crystal grains of the first zirconium oxide layer and the crystal grains of the second zirconium oxide layer may not be separated.

The first cycle Z1 or the third cycle Z3 may be used for depositing a seed layer in which a doping layer is not embedded.

Figure 18A:
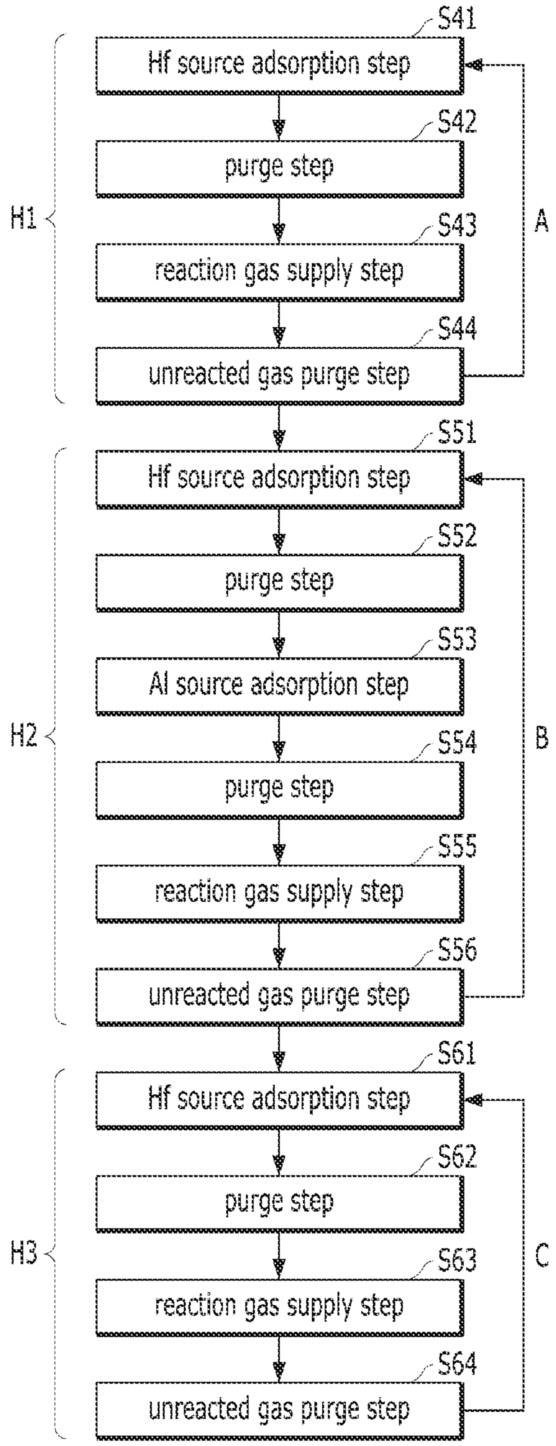
FIG. 18A is a flowchart illustrating a method for forming an initial hafnium oxide layer shown in FIGS. 14A to 16B.

FIG. 18A is a flowchart illustrating an example of a method for forming the initial hafnium oxide layer 12' shown in FIGS. 14A to 16B.

Referring to FIG. 18A, the initial hafnium oxide layer 12' may be a hafnium oxide layer having a doping layer embedded therein. The initial hafnium oxide layer 12' may be formed by atomic layer deposition (ALD). The initial hafnium oxide layer 12' may include an "H-AH-H stack" in which a first hafnium oxide layer, the doping layer and a second hafnium oxide layer are sequentially stacked. The H-AH-H stack differs from an H-A-H stack in which a first hafnium oxide layer, an aluminum oxide layer and a second hafnium oxide layer are sequentially stacked. In the H-AH-H stack, crystal grains of the first hafnium oxide layer and crystal grains of the second hafnium oxide layer are not separated by the aluminum-doped hafnium oxide layer. In the H-A-H stack, however, crystal grains of the first hafnium oxide layer and crystal grains of the second hafnium oxide layer are separated by the aluminum oxide layer.

A method for performing atomic layer deposition in the H-AH-H stack as a hafnium oxide layer having the doping layer embedded therein may be described with reference to FIG. 18A.

The atomic layer deposition in the H-AH-H stack may be performed by repeating a plurality of cycles at 250° C. to 380° C. The plurality of cycles may include a first cycle H1 for depositing the first hafnium oxide layer, a second cycle H2 for depositing the aluminum-doped hafnium oxide layer and a third cycle H3 for depositing the second hafnium oxide layer. The first hafnium oxide layer may be deposited by repeating the first cycle H1 "A" times, the aluminum-doped hafnium oxide layer may be deposited by repeating the second cycle H2 "B" times, and the second hafnium oxide layer may be deposited by repeating the third cycle H3 "C" times. Herein, A, B and C may be different natural numbers, and B may be smaller than A and C. For example, B may range from 1 to 10, and A and C may be greater than 10. At this time, A and C may be set to the same value, in order to deposit the first and second hafnium oxide layers to the same thickness. In some embodiments, A may be set to a higher value than C, in order to deposit the first hafnium oxide layer to a larger thickness than the second hafnium oxide layer.

The first cycle H1, the second cycle H2 and the third cycle H3 may be performed at 250° C. to 380° C., whereby the hafnium oxide layer 106 may be easily deposited.

The first cycle H1 may include an Hf source adsorption step S41, a purge step S42, a reaction gas supply step S43 and an unreacted gas purge step S44. The first cycle H1 may be repeated "A" times. The undoped first hafnium oxide layer may be deposited by the first cycle H1.

The second cycle H2 may include an Hf source adsorption step S51, a purge step S52, an Al source adsorption step S53, a purge step S54, a reaction gas supply step S55 and an unreacted gas purge step S56. The second cycle H2 may be repeated "B" times. The aluminum-doped hafnium oxide layer may be deposited by the second cycle H2.

The third cycle H3 may include an Hf source adsorption step S61, a purge step S62, a reaction gas supply step S63 and an unreacted gas purge step S64. The third cycle H3 may be repeated "C" times. The undoped second hafnium oxide layer may be deposited by the third cycle H3.

In the first to third cycles H1 to H3, the Hf source may include Tetrakis EthylMethylAmino Hafnium (TEMAH), Tetrakis DiEthylAmino Hafnium (TEDEAH) and Tetrakis DiMethylAmino Hafnium (TDMAH), the Al source may include Tri Methyl Aluminum (TMA), and the reaction gas may include an oxidizer. The oxidizer may include $O_3$, $O_2$, $H_2O$, $H_2O_2$ and $O_2$ plasma or combinations thereof. When ozone ($O_3$) is used as the oxidizer, the ozone may be supplied at an optimized concentration and flow rate. For example, the ozone may be used in a concentration range of 50 g/m$^3$ to 310 g/m$^3$, and a flow rate range from 100 sccm to 5000 sccm. The purge step may be set to a sufficiently large range of 1 second to 100 seconds.

Through the first to third cycles H1 to H3, it is possible to obtain a structure in which aluminum (Al) is doped in the hafnium oxide layer.

The first cycle H1 or the third cycle H3 may be used for depositing an initial hafnium oxide layer in which the doping layer is not embedded.

In some embodiments, the second cycle H2 may include only the Al source adsorption step S53 and the purge step S54 only. For example, after the first hafnium oxide layer is deposited by the first cycle H1, only the Al source adsorption step S53 and the purge step S54 may be repeated a predetermined number of times to adsorb aluminum on the surface of the first hafnium oxide layer, and then the third cycle H3 may be performed to deposit the second hafnium oxide layer. Even when the aluminum is adsorbed in this manner, the crystal grains of the first hafnium oxide layer and the crystal grains of the second hafnium oxide layer may not be separated.

Figure 18B:
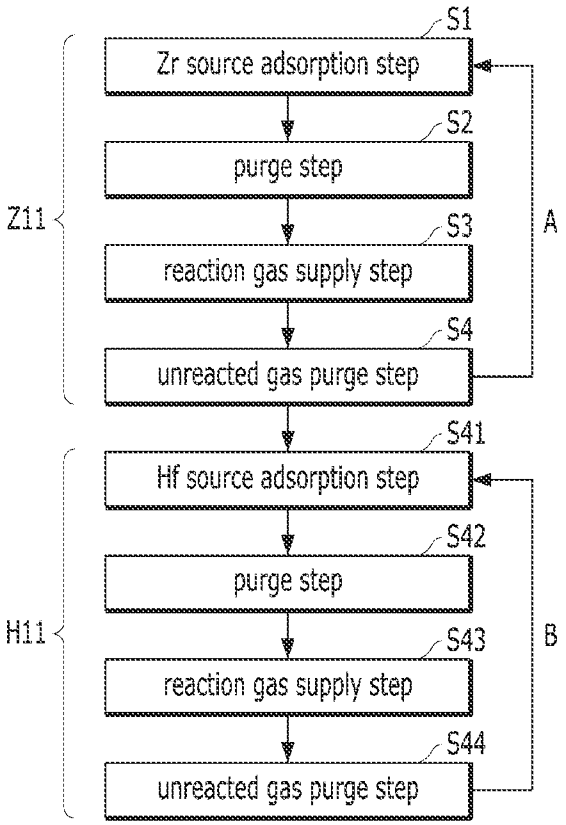
FIG. 18B is a flowchart illustrating a method for forming a stack of a seed layer and an initial hafnium oxide layer shown in FIGS. 14A to 16B.

FIG. 18B is a flowchart illustrating an example of a method for forming the stack of the seed layer and the initial hafnium oxide layer shown in FIGS. 14A to 16B. FIG. 18B illustrates the atomic layer deposition in a Z-H stack as the stack of the seed layer and the initial hafnium oxide layer.

The atomic layer deposition in the Z-H stack may be performed by repeating a plurality of cycles at 250° C. to 380° C. The plurality of cycles may include a first cycle Z11 for depositing a zirconium oxide layer as the seed layer 13 and a second cycle H11 for depositing the initial hafnium oxide layer 12'. The zirconium oxide layer may be deposited by repeating the first cycle Z11 "A" times, and the initial hafnium oxide layer 12' may be deposited by repeating the second cycle H11 "B" times.

The first cycle Z11 may include a Zr source adsorption step S1, a purge step S2, a reaction gas supply step S3 and an unreacted gas purge step S4. The first cycle Z11 may be repeated "A" times. The undoped zirconium oxide layer may be deposited by the first cycle Z11. In some embodiments, after the first cycle Z11 is performed, the second cycle Z2 of FIG. 17A or the second cycle Z2' of FIG. 17B may be performed. Consequently, the aluminum-doped zirconium oxide layer may be deposited.

The second cycle H11 may include an Hf source adsorption step S41, a purge step S42, a reaction gas supply step S43 and an unreacted gas purge step S44. The second cycle H11 may be repeated "B" times. The undoped hafnium oxide layer may be deposited by the second cycle H11.

In some embodiments, after the first cycle Z11 is performed, the second cycle Z2 of FIG. 17A or the second cycle Z2' of FIG. 17B may be performed to deposit the aluminum-doped zirconium oxide layer.

In some embodiments, before the second cycle H11 is performed, the second cycle H2 of FIG. 18A may be performed. Accordingly, the aluminum-doped hafnium oxide layer may be deposited.

The cycles illustrated in FIGS. 17A to 18B may be combined to form the dielectric layer stacks according to the embodiments described above. For example, the hafnium oxide-based dielectric layer HBL2 shown in FIG. 4A, i.e. the stack of the first hafnium oxide layer 105A, the seed layer 106 and the second hafnium oxide layer 105B may be formed. The initial hafnium oxide layer of the first hafnium oxide layer 105A and the second hafnium oxide layer 105B may be deposited by performing the first cycle H1 of FIG. 18A, and the seed layer 106 may be deposited by performing the first to third cycles Z1 to Z3 of FIG. 17A.

Figure 19A:
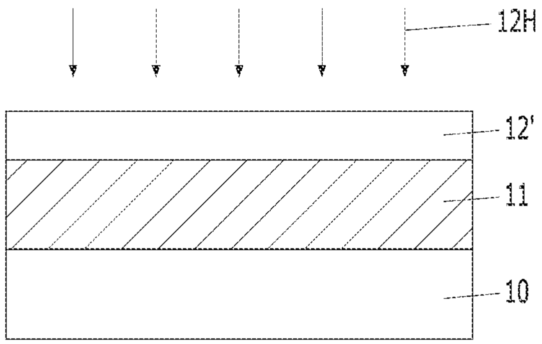
FIGS. 19A and 19B are cross-sectional views illustrating a method for crystalizing an initial hafnium oxide layer in accordance with modified examples.
Figure 19B:
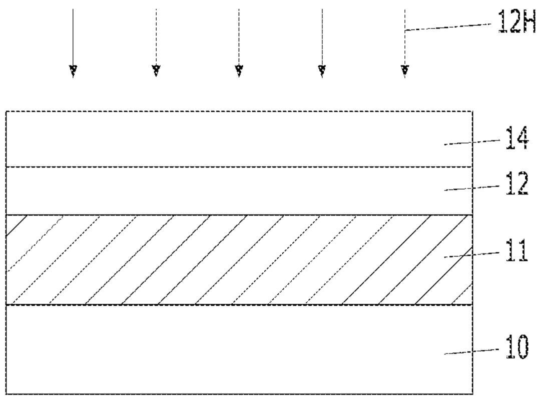

FIGS. 19A and 19B are cross-sectional views illustrating a method for crystalizing an initial hafnium oxide layer in accordance with comparative examples. The initial hafnium oxide layer 12' according to the comparative examples may be deposited by atomic layer deposition (ALD), and may be a single hafnium oxide ($HfO_2$) layer without the seed layer 13.

Referring to FIG. 19A, a comparative example 1 in which the seed layer 13 and the thermal source layer 14 are not provided additionally requires a high temperature annealing process 12H at a temperature of 900° C. or higher to crystallize the initial hafnium oxide layer 12' into tetragonal hafnium oxide. Even though the high temperature annealing process 12H is performed, the initial hafnium oxide layer 12' is difficult to crystallize into pure tetragonal hafnium oxide. In other words, after the high temperature annealing process 12H is performed, the initial hafnium oxide layer 12' may be crystallized into a mixed structure in which a tetragonal crystal structure and a mono-clinic crystal structure are mixed, rather than a pure tetragonal crystal structure. Even though the high temperature annealing process 12H is performed, the initial hafnium oxide layer 12' may be stabilized to the mono-clinic crystal structure having a lower dielectric constant than the tetragonal crystal structure. In addition, quenching at high speed and for a short time (approximately 1 ms or less) is required after the high temperature annealing process 12H.

Referring to FIG. 19B, in the case of a comparative example 2 in which the seed layer 13 is not provided, it is difficult to sufficiently crystallize the initial hafnium oxide layer 12' into the tetragonal hafnium oxide through the deposition of the thermal source layer 14. Accordingly, the comparative example 2 additionally requires a high temperature annealing process 12H at a high temperature of 900° C. or higher to crystallize the initial hafnium oxide layer 12' into tetragonal hafnium oxide after the deposition of the thermal source layer 14. In the comparative example 2, the initial hafnium oxide layer 12' may be crystallized into hafnium oxide having a pure tetragonal crystal structure by the thermal source layer 14 and the high temperature annealing process 12H, unlike the comparative example 1. In comparative example 2, however, the characteristics of the capacitor and the peripheral structure may be deteriorated by the high temperature annealing process 12H.

As described above, it is difficult to form pure tetragonal hafnium oxide using the single hafnium oxide.

According to the embodiments, the seed layer 13 and the thermal source layer 14 are applied, and the seed layer 13 and the initial hafnium oxide layer 12' are formed to be directly contacted with each other. Accordingly, the initial hafnium oxide layer 12' may be sufficiently crystallized into the hafnium oxide layer 12 during the deposition of the thermal source layer 14.

According to the embodiments, the hafnium oxide layer 12 having a pure tetragonal crystal structure may be formed at a low temperature without performing a separate high temperature annealing process. The hafnium oxide layer 12 having the pure tetragonal crystal structure may have a high dielectric constant of approximately 60 or higher.

The dielectric constant of the hafnium oxide layer 12 having the pure tetragonal crystal structure may be higher than that (approximately 40) of the tetragonal zirconium oxide. Consequently, the capacitance of the capacitor may be increased.

In addition, since the hafnium oxide layer 12 is formed at a low temperature, the characteristics of the capacitor and the peripheral structure may be prevented from deteriorating.

Figure 20A:
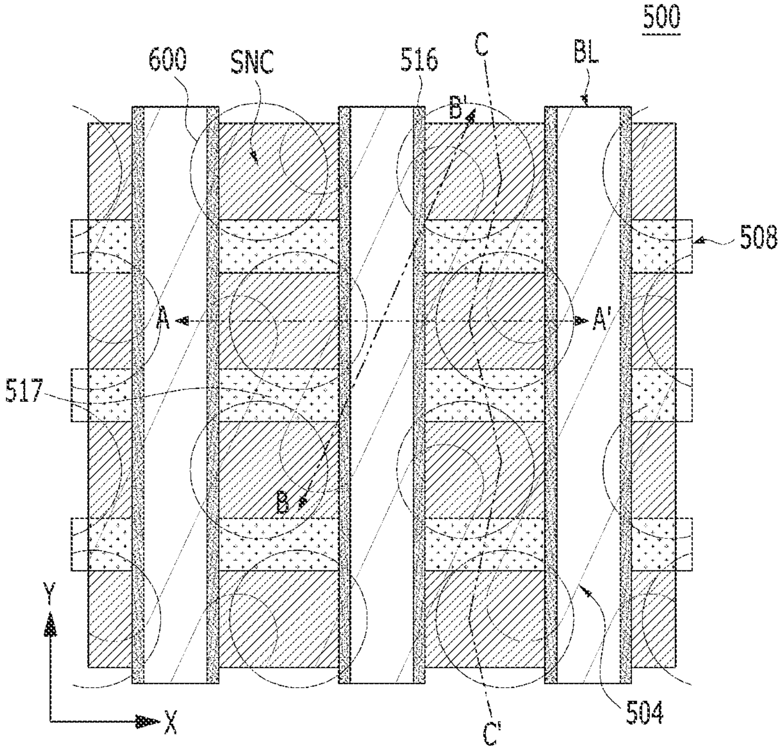
FIGS. 20A to 20C are diagrams illustrating a memory cell.
Figure 20B:
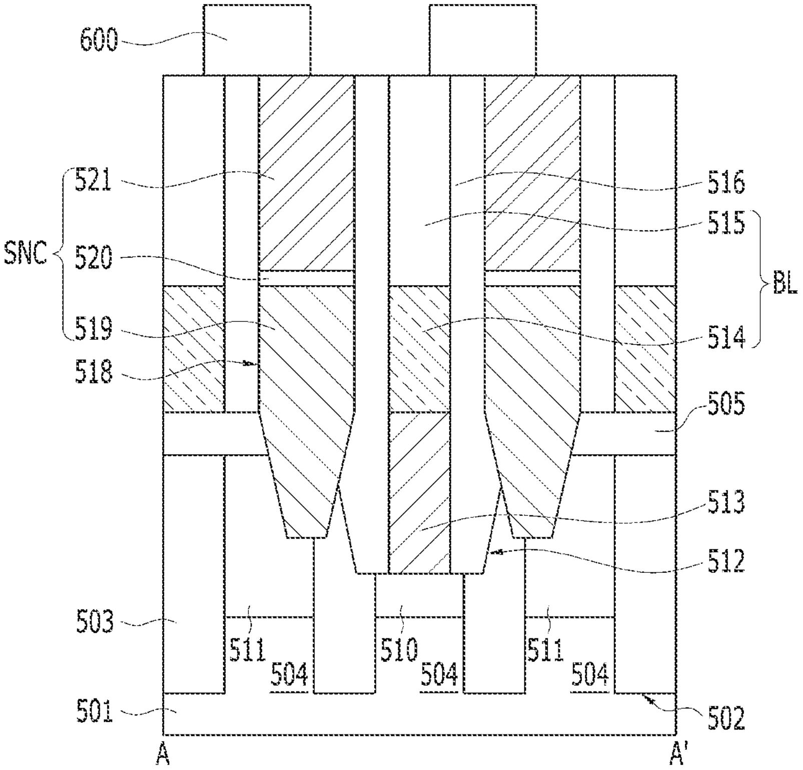
Figure 20C:
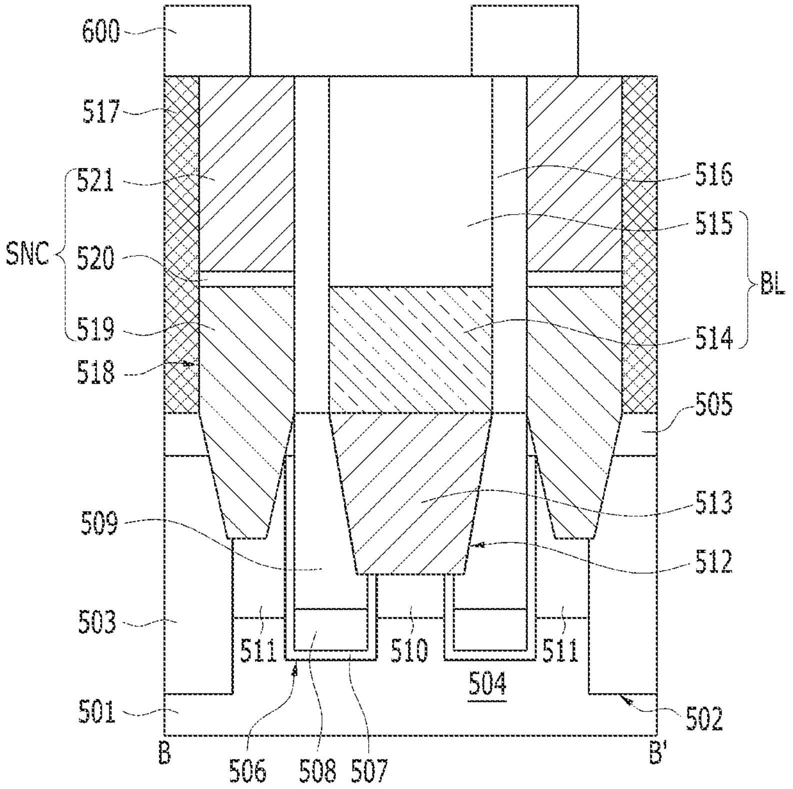

FIGS. 20A to 20C are diagrams illustrating a memory cell 500. FIG. 20B is a cross-sectional view taken along an A-A' line of FIG. 20A. FIG. 20C is a cross-sectional view taken along a B-B' line of FIG. 20A.

The memory cell 500 may include a cell transistor including a buried word line 508, a bit line 514 and a capacitor 600. The capacitor 600 may include a dielectric layer stack, and the dielectric layer stack may include any one of the dielectric layer stacks described in the above embodiments.

The memory cell 500 is described below in detail.

An isolation layer 503 may be formed on a substrate 501 and may define a plurality of active regions 504. The substrate 501 may be made of any material that is suitable for semiconductor processing. The substrate 501 may include a semiconductor substrate. The substrate 501 may be formed of a silicon-containing material. The substrate 501 may include silicon, monocrystalline silicon, polysilicon, amorphous silicon, silicon germanium, monocrystalline silicon germanium, polycrystalline silicon germanium, carbon-doped silicon, any combinations thereof or multi-layers thereof. The substrate 501 may include another semiconductor material, such as germanium. The substrate 501 may include an III/V-group semiconductor substrate, for example, a chemical compound semiconductor substrate such as a gallium arsenide (GaAs). The substrate 501 may include a Silicon-On-Insulator (SOI) substrate. The isolation layer 503 may be formed in an isolation trench 502 through a Shallow Trench Isolation (STI) process.

A word line trench 506 may be formed in the substrate 501. The word line trench 506 may also be referred to as a gate trench. A gate dielectric layer 507 may be formed on the surface of the word line trench 506. The buried word line 508 which fills a portion of the word line trench 506 may be formed on the gate dielectric layer 507. The buried word line 508 may also be referred to as a buried gate electrode. A word line capping layer 509 may be formed on the buried word line 508. The top surface of the buried word line 508 may be lower than the top surface of the substrate 501. The buried word line 508 may be a low-resistivity metal material. The buried word line 508 may be formed by sequentially stacking titanium nitride and tungsten. In some embodiments, the buried word line 508 may be formed of titanium nitride (TiN) only.

A first impurity region 510 and a second impurity region 511 may be formed in the substrate 501. The first and second impurity regions 510 and 511 may be spaced apart from each other by the word line trench 506. The first and second impurity regions 510 and 511 may also be referred to as first and second source/drain regions, respectively. The first and second impurity regions 510 and 511 may include an N-type impurity such as arsenic (As) and phosphorus (P). Consequently, the buried word line 508 and the first and second impurity regions 510 and 511 may become a cell transistor. The cell transistor may improve a short-channel effect due to the presence of the buried word line 508.

A bit line contact plug 513 may be formed on the substrate 501. The bit line contact plug 513 may be coupled to the first impurity region 510. The bit line contact plug 513 may be positioned inside a bit line contact hole 512. The bit line contact hole 512 may be formed in a hard mask layer 505. The hard mask layer 505 may be formed on the substrate 501. The bit line contact hole 512 may expose the first impurity region 510. The bottom surface of the bit line contact plug 513 may be lower than the top surface of the substrate 501. The bit line contact plug 513 may be formed of polysilicon or a metal material. A portion of the bit line contact plug 513 may have a smaller line width than the diameter of the bit line contact hole 512. The bit line 514 may be formed on the bit line contact plug 513. A bit line hard mask 515 may be formed on the bit line 514. The stacked structure of the bit line 514 and the bit line hard mask 515 may also be referred to as a bit line structure BL. The bit line 514 may have a linear shape that is extended in a direction crossing the buried word line 508. A portion of the bit line 514 may be coupled to the bit line contact plug 513. The bit line 514 may include a metal material. The bit line hard mask 515 may include a dielectric material.

A bit line spacer 516 may be formed on the sidewall of the bit line structure BL. The bottom portion of the bit line spacer 516 may be extended to be formed on both sidewalls of the bit line contact plug 513. The bit line spacer 516 may include silicon oxide, silicon nitride or a combination thereof. In some embodiments, the bit line spacer 516 may include an air gap. For example, the bit line spacer 516 may have a nitride-air gap-nitride (NAN) structure in which the air gap is located between silicon nitrides.

A storage node contact plug SNC may be formed between the neighboring bit line structures BL. The storage node contact plug SNC may be formed in a storage node contact hole 518. The storage node contact plug SNC may be coupled to the second impurity region 511. The storage node contact plug SNC may include a bottom plug 519 and a top plug 521. The storage node contact plug SNC may further include an ohmic contact layer 520 between the bottom plug 519 and the top plug 521. In an embodiment, the ohmic contact layer 520 may include metal silicide. In an embodiment, the top plug 521 may include a metal material, and the bottom plug 519 may include a silicon-containing material.

From a perspective view in parallel with the bit line structure BL, a plug isolation layer 517 may be formed between the neighboring storage node contact plugs SNC. The plug isolation layer 517 may be formed between the neighboring bit line structures BL, and may provide the storage node contact hole 518 along with the hard mask layer 505.

FIGS. 21A to 21F are diagrams illustrating application examples of the capacitor 600 shown in FIGS. 20A to 20C.

Figure 21A:
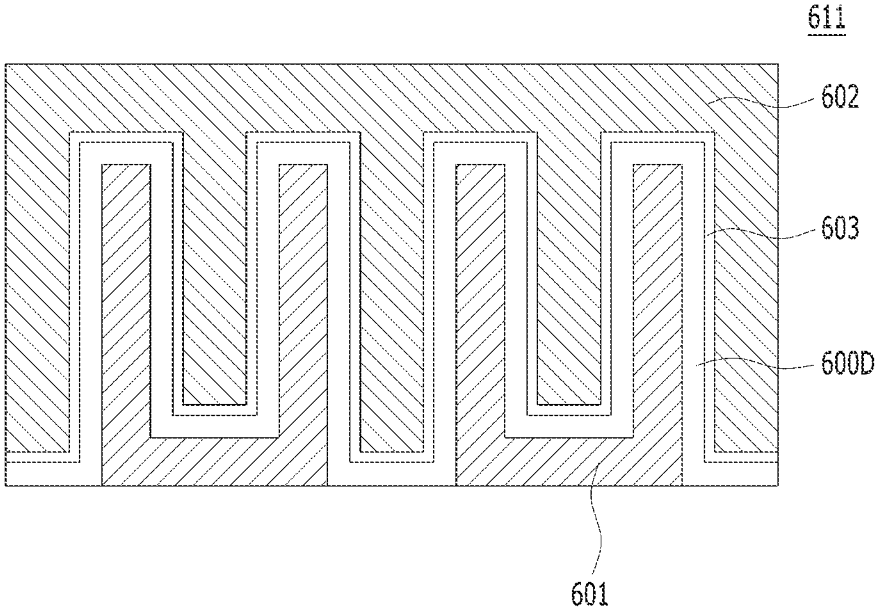
FIGS. 21A to 21F are diagrams illustrating application examples of a capacitor of a memory cell.

Referring to FIG. 21A, a capacitor 611 may include a bottom electrode 601, a dielectric layer 600D, a thermal source layer 603, and a top electrode 602. The bottom electrode 601 may be formed in a cylinder shape. The dielectric layer 600D may be formed on the bottom electrode 601, and the thermal source layer 603 may be formed on the dielectric layer 600D. The top electrode 602 may be formed on the thermal source layer 603. The dielectric layer 600D may correspond to any one of the dielectric layer stacks in the above-described embodiments. Accordingly, the dielectric layer 600D may include a hafnium oxide-based dielectric layer and a leakage blocking layer.

Hereinafter, detailed descriptions of components and structures of capacitors 612 to 616 that are the same as or similar to those of the capacitor 611 shown in FIG. 21A are omitted.

Figure 21B:
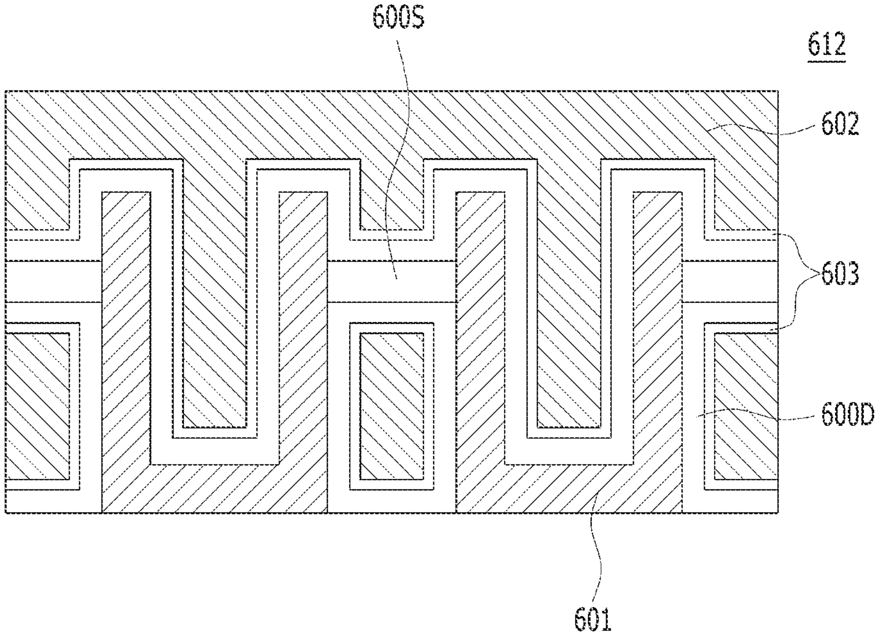

Referring to FIG. 21B, a capacitor 612 may include a cylinder-shaped bottom electrode 601, a dielectric layer 600D and a top electrode 602. The capacitor 612 may further include a supporter 600S. The supporter 600S is a structure supporting an outer wall of the bottom electrode 601. The supporter 600S may include silicon nitride.

Figure 21C:
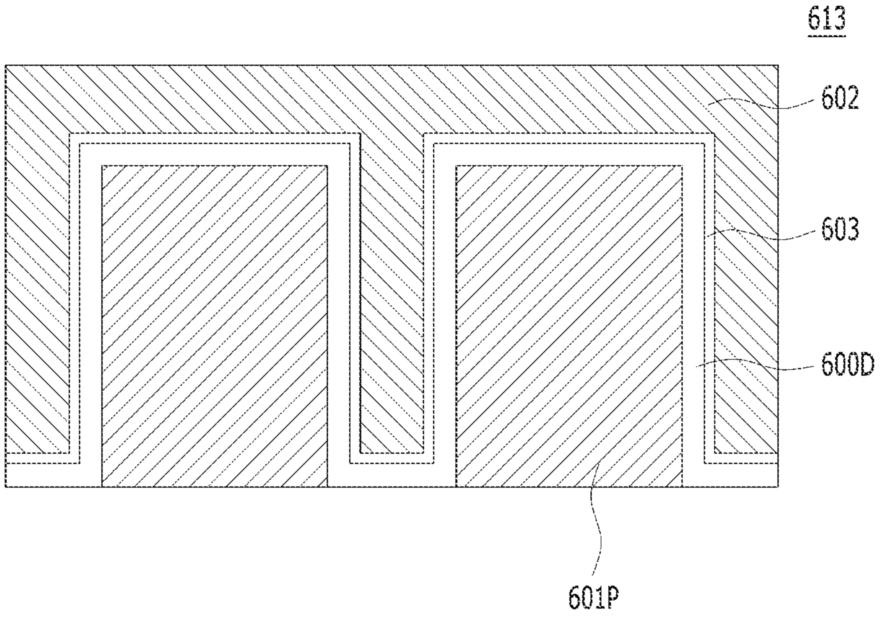
Figure 21D:
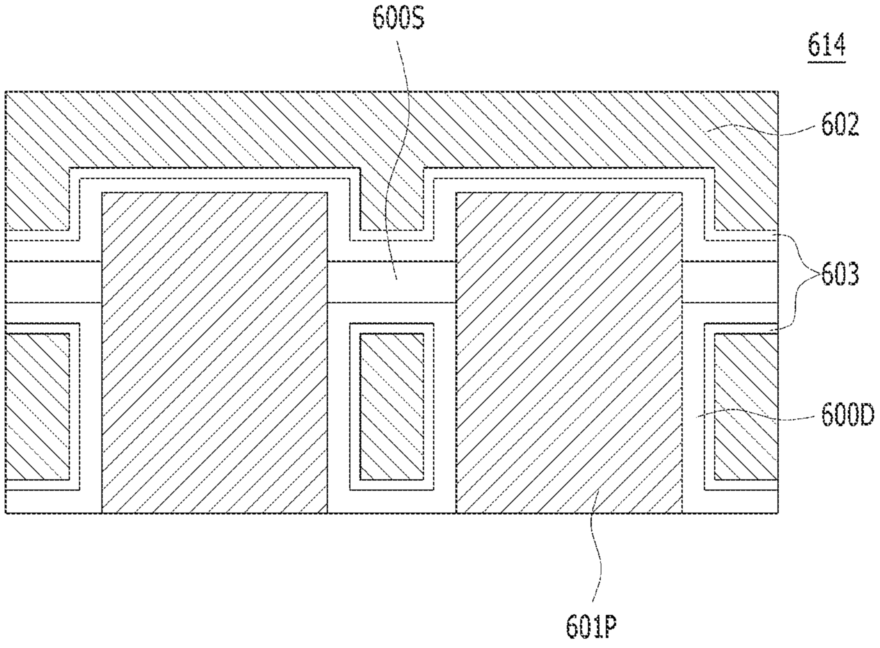

Referring to FIGS. 21C and 21D, each of capacitors 613 and 614 may include a pillar-shaped bottom electrode 601P, a dielectric layer 600D, a thermal source layer 603 and a top electrode 602. The capacitor 614 shown in FIG. 21D may further include a supporter 600S.

Figure 21E:
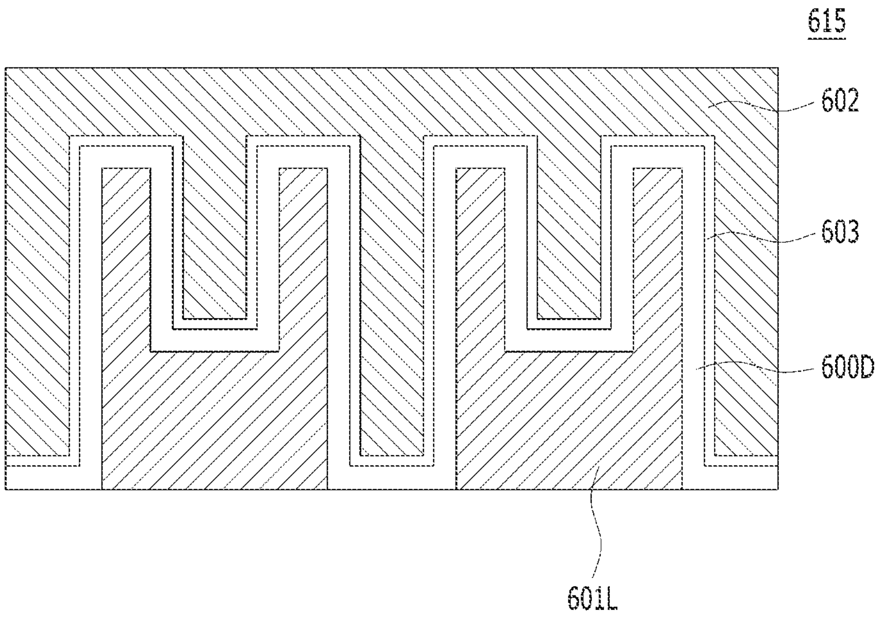
Figure 21F:
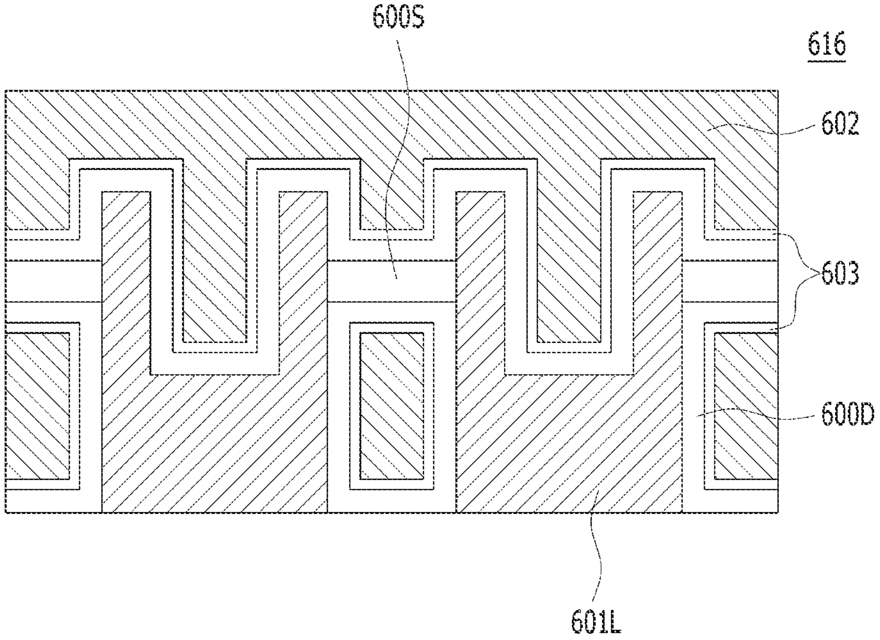

Referring to FIGS. 21E and 21F, each of capacitors 615 and 616 may include a pylinder-shaped bottom electrode 601L, a dielectric layer 600D, a thermal source layer 603 and a top electrode 602. The capacitor 616 shown in FIG. 21F may further include a supporter 600S. The bottom electrode 601L may have a hybrid structure in which a pillar shape and a cylinder shape are merged. The hybrid structure of the pillar shape and the cylinder shape may be referred to as the pylinder shape.

As described above, the dielectric layer 600D may be formed to include the hafnium oxide-based dielectric layer and the leakage blocking layer, and the thermal source layer 603 may be formed on the dielectric layer 600D, which makes it possible to obtain the dielectric layer 600D having a high dielectric constant and a low leakage current. Accordingly, it is possible to fabricate a high-integrated dynamic random access memory (DRAM) whose refresh characteristics and reliability are improved.

According to the embodiments, a dielectric layer stack may be applied to peripheral circuits of the DRAM. For example, the DRAM may include a memory cell region including a memory cell (reference numeral "500" of FIG. 20A) and a peripheral circuit region including a peripheral transistor, and at least one of the peripheral transistor and the capacitor 600 of the memory cell 500 may include any one of the dielectric layer stacks in the above-described embodiments. For example, a hafnium oxide-based dielectric layer and a leakage blocking layer may be included, wherein the hafnium oxide-based dielectric layer may include a tetragonal hafnium oxide layer, a tetragonal seed layer and a doping layer.

According to the embodiments, the dielectric layer stack may be applied to a Metal-Insulator-Metal (MIM) capacitor. For example, the MIM capacitor may include a first metal electrode, a second metal electrode, and a hafnium oxide-based dielectric layer and a leakage blocking layer formed between the first metal electrode and the second metal electrode, wherein the hafnium oxide-based dielectric layer may include a tetragonal hafnium oxide layer, a tetragonal seed layer and a doping layer.

According to the embodiments, the dielectric layer stack may be applied to an embedded DRAM. For example, the embedded DRAM may include a logic circuit and a capacitor, and the capacitor of the embedded DRAM may include a hafnium oxide-based dielectric layer and a leakage blocking layer, wherein the hafnium oxide-based dielectric layer may include a tetragonal hafnium oxide layer, a tetragonal seed layer and a doping layer.

According to the embodiments, the dielectric layer stack may be applied to a three dimensional (3D) NAND. For example, the 3D NAND may include a pillar-shaped channel layer, a word line surrounding the pillar-shaped channel layer, and a hafnium oxide-based dielectric layer and a leakage blocking layer between the pillar-shaped channel layer and the word line, wherein the hafnium oxide-based dielectric layer may include a tetragonal hafnium oxide layer, a tetragonal seed layer and a doping layer.

The semiconductor device in accordance with the above-described embodiments uses a seed layer and a thermal source layer which allow formation of tetragonal hafnium oxide at a low temperature.

The semiconductor device in accordance with the above-described embodiments includes tetragonal hafnium oxide having a high dielectric constant and a low leakage current. The semiconductor device in accordance with the above-described embodiments includes a capacitor with increased capacitance.

While the present invention has been described with respect to specific embodiments, it should be noted that the embodiments are not limiting the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
a first electrode;
a second electrode;
a tetragonal seed layer disposed between the first electrode and the second electrode;
a first tetragonal hafnium oxide layer disposed between the first electrode and the tetragonal seed layer; and
a second tetragonal hafnium oxide layer disposed between the second electrode and the tetragonal seed layer,
wherein the tetragonal seed layer includes:
a lower tetragonal seed layer;
an upper tetragonal seed layer; and
a tetragonal doping layer disposed between the lower tetragonal seed layer and the upper tetragonal seed layer,
wherein the tetragonal doping layer has a thickness not to separate crystal grains of the lower tetragonal seed layer and crystal grains of the upper tetragonal seed layer.

2. The semiconductor device of claim 1, wherein the tetragonal doping layer includes doped-tetragonal zirconium oxide that is doped with a dopant, and the lower seed layer and the upper seed layer include undoped-tetragonal zirconium oxide that is not doped with a dopant, and
wherein the dopant includes aluminum or beryllium.

3. The semiconductor device of claim 1, further comprising:
a leakage blocking layer disposed between the second tetragonal hafnium oxide layer and the second electrode.

4. The semiconductor device of claim 3, wherein the leakage blocking layer includes an aluminum-containing material or a beryllium-containing material.

5. The semiconductor device of claim 1, further comprising:
a thermal source layer disposed between the second tetragonal hafnium oxide layer and the second electrode.

6. The semiconductor device of claim 5, wherein the thermal source layer includes a conductive material.

7. The semiconductor device of claim 1, further comprising:
an interface control layer disposed between the second tetragonal hafnium oxide layer and the second electrode.

8. The semiconductor device of claim 7, wherein the interface control layer includes a material having higher electronegativity than the first and second tetragonal hafnium oxide layer.

9. The semiconductor device of claim 7, wherein the interface control layer includes titanium oxide, tantalum oxide, niobium oxide, aluminum oxide, silicon oxide, tin oxide, germanium oxide, molybdenum dioxide, molybdenum trioxide, iridium oxide, ruthenium oxide, nickel oxide or combinations thereof.

10. A semiconductor device, comprising:
a first electrode;
a second electrode;
a tetragonal seed layer disposed between the first electrode and the second electrode;
a first tetragonal hafnium oxide layer disposed between the first electrode and the tetragonal seed layer; and
a second tetragonal hafnium oxide layer disposed between the second electrode and the tetragonal seed layer,
a leakage blocking layer disposed between the second tetragonal hafnium oxide layer and the second electrode; a thermal source layer disposed between the leakage blocking layer and the second electrode; and an interface control layer disposed between the leakage blocking layer and the thermal source layer.

11. The semiconductor device of claim 1, wherein the first and second tetragonal hafnium oxide layer are doped with a crystallization promoting dopant.

12. The semiconductor device of claim 11, wherein the crystallization promoting dopant includes strontium (Sr), lanthanum (La), gadolinium (Gd), aluminum (Al), silicon (Si), yttrium (Y), zirconium (Zr), niobium (Nb), bismuth (Bi), germanium (Ge), dysprosium (Dy), titanium (Ti), cerium (Ce), magnesium (Mg), nitrogen (N) or combinations thereof.

13. The semiconductor device of claim 1, further comprising:
a first zirconium oxide layer disposed between the first electrode and the first tetragonal hafnium oxide layer; and
a second zirconium oxide layer disposed between the second electrode and the second tetragonal hafnium oxide layer.

14. The semiconductor device of claim 13, wherein the first and second zirconium oxide layer includes a tetragonal zirconium oxide layer.

15. A capacitor, comprising:
a first electrode;
a second electrode;
a first tetragonal seed layer disposed between the first electrode and the second electrode;
a second tetragonal seed layer disposed between the first tetragonal seed layer and the second electrode;
a doping layer disposed between the first tetragonal seed layer and the second tetragonal seed layer;
a first tetragonal hafnium oxide layer disposed between the first electrode and the first tetragonal seed layer;
a second tetragonal hafnium oxide layer disposed between the second electrode and the second tetragonal seed layer;
a first tetragonal zirconium oxide layer disposed between the first electrode and the first tetragonal hafnium oxide layer; and
a second tetragonal zirconium oxide layer disposed between the second electrode and the second tetragonal hafnium oxide layer,
wherein the doping layer has a thickness not to separate crystal grains of the first tetragonal seed layer and crystal grains of the second tetragonal seed layer.

16. The capacitor of claim 15,
wherein the first and second tetragonal seed layer includes tetragonal zirconium oxide, and
wherein the doping layer includes aluminum doped-tetragonal zirconium oxide.

17. A capacitor, comprising:
a first electrode;
a second electrode;
a first tetragonal seed layer disposed between the first electrode and the second electrode;
a second tetragonal seed layer disposed between the first tetragonal seed layer and the second electrode;
a doping layer disposed between the first tetragonal seed layer and the second tetragonal seed layer;

a first tetragonal hafnium oxide layer disposed between the first electrode and the first tetragonal seed layer;

a second tetragonal hafnium oxide layer disposed between the second electrode and the second tetragonal seed layer;

a first tetragonal zirconium oxide layer disposed between the first electrode and the first tetragonal hafnium oxide layer;

a second tetragonal zirconium oxide layer disposed between the second electrode and the second tetragonal hafnium oxide layer;

a leakage blocking layer disposed between the second tetragonal zirconium oxide layer and the second electrode; and an interface control layer disposed between the leakage blocking layer and the second electrode.

18. The capacitor of claim 17, wherein the leakage blocking layer includes an aluminum oxide.

19. The capacitor of claim 17, wherein the interface control layer includes titanium oxide, tantalum oxide, niobium oxide, aluminum oxide, silicon oxide, tin oxide, germanium oxide, molybdenum dioxide, molybdenum trioxide, iridium oxide, ruthenium oxide, nickel oxide or combinations thereof.

* * * * *